(12) United States Patent
Tsao et al.

(10) Patent No.: US 12,051,639 B2
(45) Date of Patent: Jul. 30, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chih-Chiang Tsao, Taoyuan (TW); Chao-Wei Chiu, Hsinchu (TW); Jen-Jui Yu, Taipei (TW); Hsiu-Jen Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 287 days.

(21) Appl. No.: 17/684,416

(22) Filed: Mar. 2, 2022

(65) Prior Publication Data
US 2023/0282555 A1 Sep. 7, 2023

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 21/4867* (2013.01); *H01L 24/13* (2013.01); *H01L 24/14* (2013.01); *H01L 24/81* (2013.01); *H01L 25/0657* (2013.01); *H01L 25/105* (2013.01); *H01L 23/3675* (2013.01); *H01L 23/49822* (2013.01); *H01L 23/5383* (2013.01); *H01L 24/16* (2013.01); *H01L 24/29* (2013.01); *H01L 24/32* (2013.01); *H01L 24/33* (2013.01); *H01L 24/73* (2013.01); *H01L 24/92* (2013.01); *H01L 2224/13109* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01);
(Continued)

(58) Field of Classification Search
CPC .......... H01L 23/49816; H01L 21/4853; H01L 21/4867; H01L 25/0654
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Dale E Page
*Assistant Examiner* — Wilner Jean Baptiste
(74) *Attorney, Agent, or Firm* — JCIPRNET

(57) ABSTRACT

A package structure includes a first package, a second package, a conductive spacer, and a flux portion. The first package includes a semiconductor die. The second package is stacked to the first package. The conductive spacer is disposed between and electrically couples the first package and the second package. The flux portion is disposed between and electrically couples the first package and the conductive spacer, where the flux portion includes a first portion and a second portion separating from the first portion by a gap, and the first portion and the second portion are symmetric about an extending direction of the gap. The gap is overlapped with the conductive spacer.

20 Claims, 48 Drawing Sheets

(51) Int. Cl.
    *H01L 23/00*     (2006.01)
    *H01L 25/065*     (2023.01)
    *H01L 25/10*     (2006.01)
    *H01L 23/367*     (2006.01)
    *H01L 23/538*     (2006.01)

(52) U.S. Cl.
    CPC ........... *H01L 2224/13164* (2013.01); *H01L 2224/1357* (2013.01); *H01L 2224/13582* (2013.01); *H01L 2224/13611* (2013.01); *H01L 2224/13639* (2013.01); *H01L 2224/13655* (2013.01); *H01L 2224/13686* (2013.01); *H01L 2224/1403* (2013.01); *H01L 2224/14505* (2013.01); *H01L 2224/16227* (2013.01); *H01L 2224/2919* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2224/81815* (2013.01); *H01L 2224/92125* (2013.01); *H01L 2225/06517* (2013.01); *H01L 2225/1058* (2013.01); *H01L 2924/04941* (2013.01); *H01L 2924/04953* (2013.01); *H01L 2924/0665* (2013.01)

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2012/0252168 | A1* | 10/2012 | Nah ................. H01L 21/4853 257/E21.502 |
| 2020/0176387 | A1* | 6/2020 | Yu ................. H01L 21/6835 |

\* cited by examiner

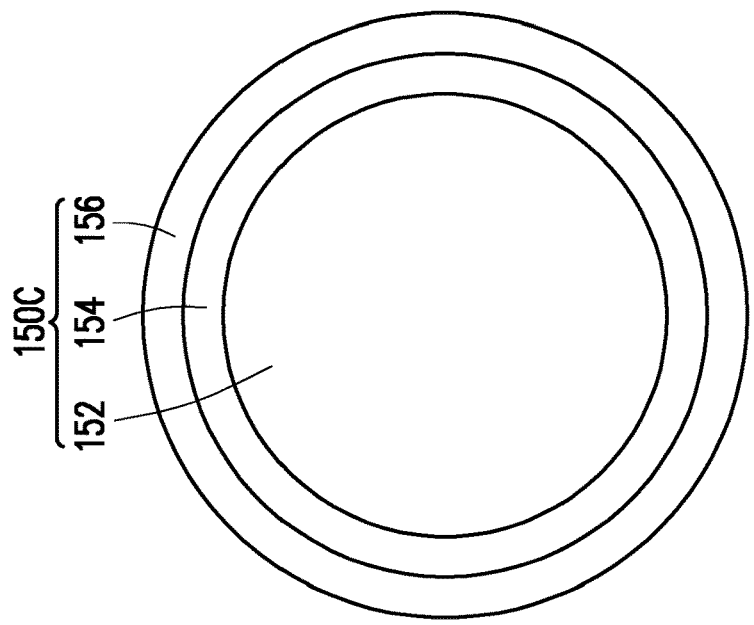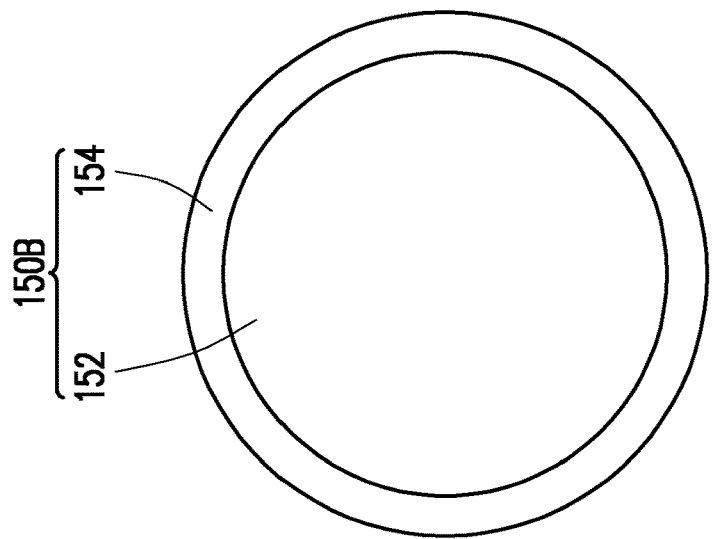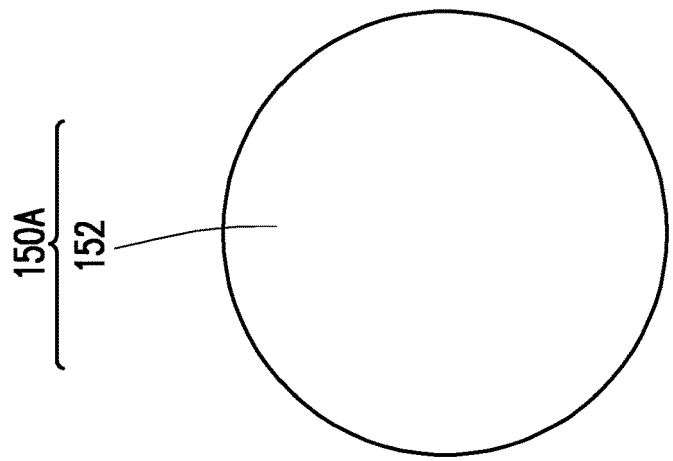

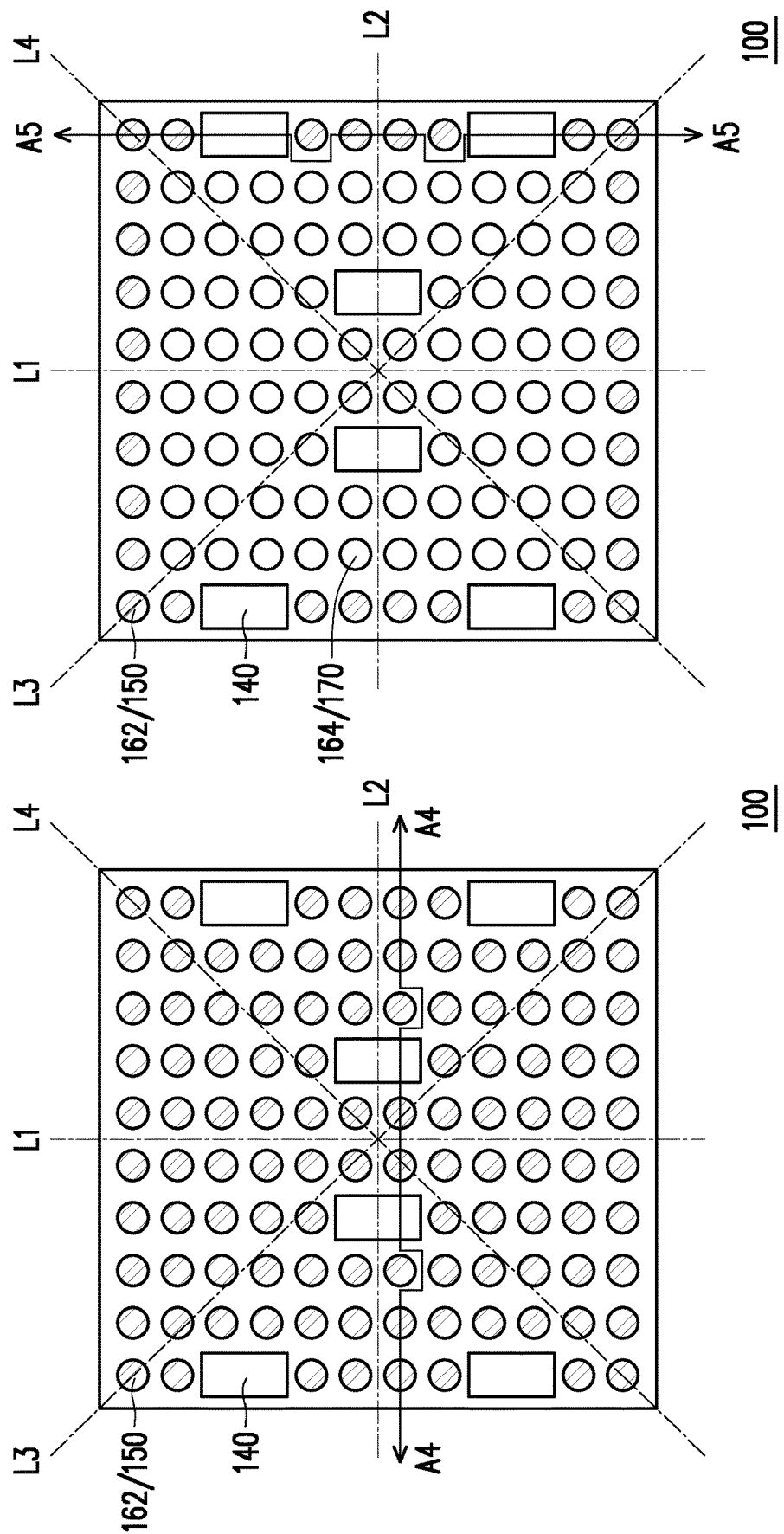

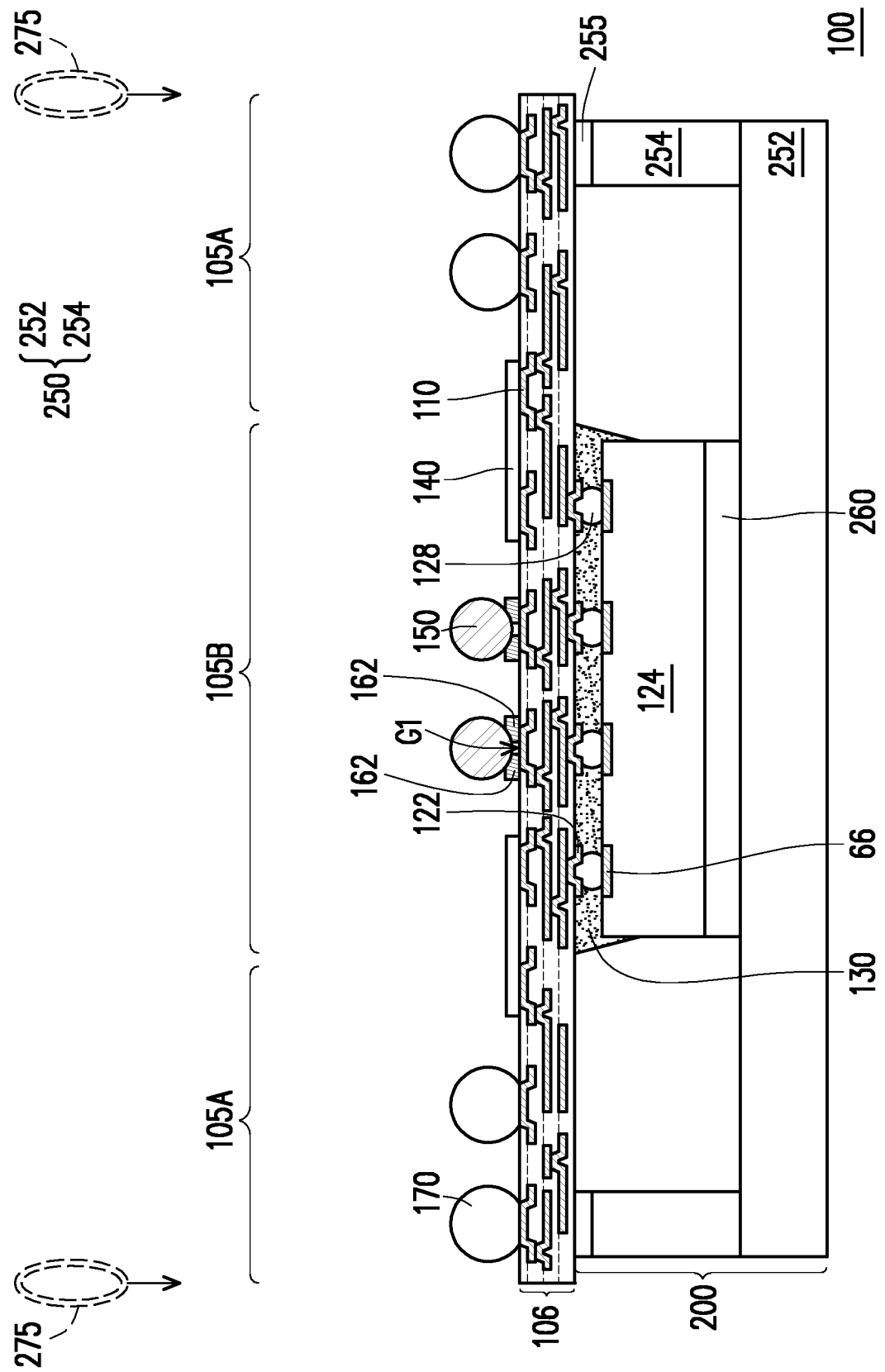

PACKAGE STRUCTURE AND MANUFACTURING METHOD THEREOF

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 21 illustrate various intermediate steps in a process of manufacturing an integrated fan-out package, in accordance with some embodiments.

DETAILED DESCRIPTION

Figure 1:
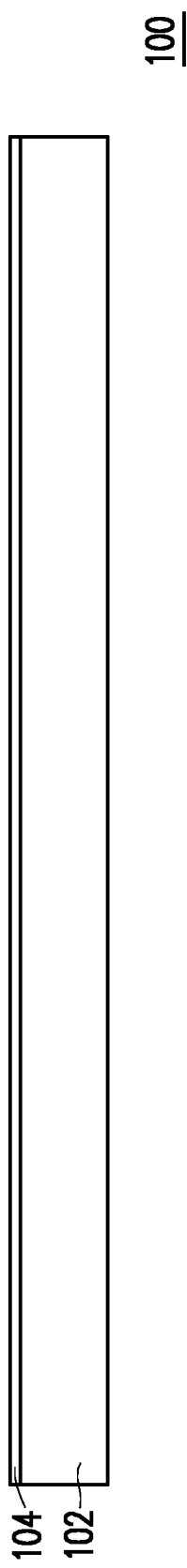

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments include an integrated fan-out (InFO) package including a semiconductor die and an integrated redistribution structure. Due to a mismatch in the coefficient of thermal expansion (CTE) of the various materials in the InFO package, warpage can cause bowing in the InFO package. Bowing can include both positive biased bowing (a "smile" shape) and negative biased bowing (a "cry" or "frown" shape). Due to the warpage, when the InFO package is attached to another device, such as a printed circuit board (PCB), some areas of the InFO package are closer to the PCB than other areas. For example, if the warpage results in a frown shape InFO package, when the InFO package is aligned to the PCB to attach to the PCB, the distance between the edges of the InFO package and the PCB is less than the distance between the middle of the InFO package and the PCB. When solder connectors are reflowed to attach the InFO package to the PCB, the warped edges may press too close to the PCB. As a result, solder bridging between connectors could occur where the smaller space between the InFO package and PCB squeezes the solder too near to an adjacent connector. A similar situation arises for a smile shape warpage, except that the center of the InFO package may be too close to the PCB, causing bridging between connectors at the center. Embodiments address this issue by utilizing one or more than one conductive spacer between the InFO package and the PCB which is capable of maintaining a minimum distance between the InFO package and the PCB during the reflow process. In accordance with some embodiments, the one or more than one conductive spacer simultaneously serves a spacer and an electrical connector between the InFO package and the PCB. In addition, a flux is applied to attach the one or more than one conductive spacer to the InFO package, where the flux includes a pre-determined pattern with a gap underneath the one or more than one conductive spacer for avoiding the tilting of the one or more than one conductive spacer during a reflowing process.

FIG. 1 through FIG. 21 illustrate various intermediate steps in a process of manufacturing an integrated fan-out package, in accordance with some embodiments. The formation of the integrated fan-out package 100 may be used in any of the embodiments relating to the conductive spacers discussed below. FIG. 1 through FIG. 12 illustrate schematic cross-sectional views of intermediate steps of a process for forming the integrated fan-out package 100 until the integrated fan-out package 100 is ready to receive conductive spacers and conductive connectors. In the disclosure, it should be appreciated that the illustration of components throughout all figures is schematic and is not in scale.

Referring to FIG. 1, in some embodiments, a carrier substrate 102 is provided for the integrated fan-out package 100, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled.

Figure 2:
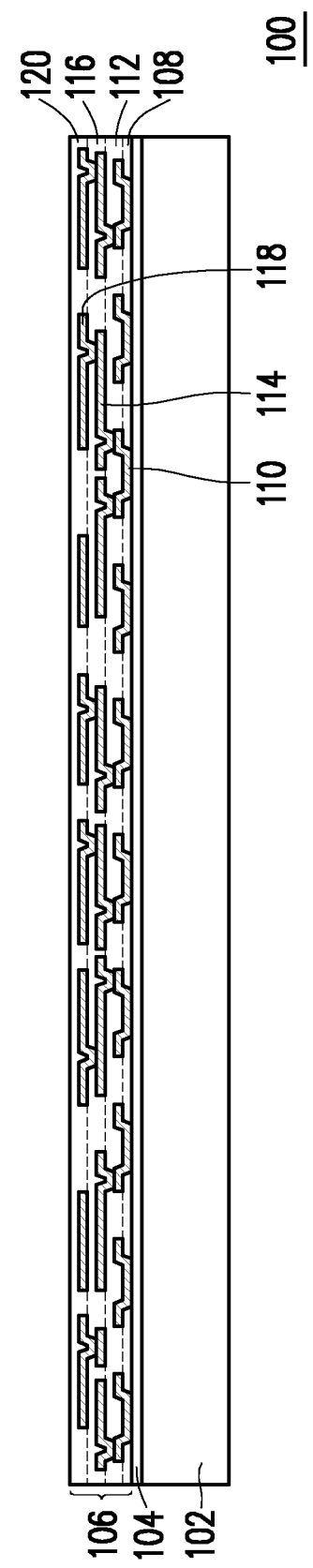

Referring to FIG. 2, in some embodiments, a redistribution structure 106 is formed on the release layer 104. The redistribution structure 106 includes dielectric layers 108, 112, 116, and 120; and metallization patterns 110, 114, and 118. The metallization patterns may also be referred to as redistribution layers or redistribution lines. The redistribution structure 106 is shown as an example. More or fewer dielectric layers and metallization patterns may be formed in the redistribution structure 106. If fewer dielectric layers and metallization patterns are to be formed, steps and process discussed below may be omitted. If more dielectric layers and metallization patterns are to be formed, steps and processes discussed below may be repeated. The redistribution structure 106 may be referred to as redistribution circuit structure or a first redistribution circuit structure, in the disclosure.

As an example to form the redistribution structure 106, the dielectric layer 108 is deposited on the release layer 104. In some embodiments, the dielectric layer 108 is formed of a photo-sensitive material such as polybenzoxazole (PBO), polyimide (PI), benzocyclobutene (BCB), or the like, which may be patterned using a lithography mask. The dielectric layer 108 may be formed by spin coating, lamination, chemical vaper deposition (CVD), the like, or a combination thereof. The dielectric layer 108 is then patterned. The patterning forms a plurality of openings exposing portions of the release layer 104. The patterning may be by an acceptable process, such as by exposing the dielectric layer 108 to light when the dielectric layer 108 is a photo-sensitive material or by etching using, for example, an anisotropic etch. If the dielectric layer 108 is a photo-sensitive material, the dielectric layer 108 can be developed after the exposure.

In the case, the metallization pattern 110 is then formed. The metallization pattern 110 includes a plurality of conductive lines on and extending along the major surface of the dielectric layer 108. The metallization pattern 110 further includes a plurality of conductive vias extending through the dielectric layer 108. To form the metallization pattern 110, a seed layer is formed over the dielectric layer 108 and in the openings extending through the dielectric layer 108, for example. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vaper deposition (PVD), or the like. In the case, a photo resist is then formed and patterned on the seed layer. The photo resist may be formed by spin coating or the like and may be exposed to light for patterning. The pattern of the photo resist corresponds to the metallization pattern 110. The patterning forms a plurality of openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 110. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

In the case, the dielectric layer 112 is deposited on the metallization pattern 110 and dielectric layer 108. The dielectric layer 112 may be formed in a manner similar to the dielectric layer 108, and may be formed of the same material as the dielectric layer 108.

The metallization pattern 114 is then formed, for example. The metallization pattern 114 includes a plurality of conductive lines on and extending along the major surface of the dielectric layer 112. The metallization pattern 114 further includes a plurality of conductive vias extending through the dielectric layer 112 to be physically and electrically connected to the metallization pattern 110. The metallization pattern 114 may be formed in a manner similar to the metallization pattern 110, and may be formed of the same material as the metallization pattern 110. The conductive vias of the metallization pattern 114 have smaller width (e.g., as measured along a lateral direction perpendicular to a stacking direction of the redistribution structure 106 and the carrier substrate 102) than the conductive vias of the metallization pattern 110. As such, when patterning the dielectric layer 112 for the metallization pattern 114, the width (e.g., as measured along the lateral direction) of the openings in the dielectric layer 112 are smaller than the width of the openings in the dielectric layer 108.

In the case, the dielectric layer 116 is deposited on the metallization pattern 114 and dielectric layer 112. The dielectric layer 116 may be formed in a manner similar to the dielectric layer 108, and may be formed of the same material as the dielectric layer 108.

The metallization pattern 118 is then formed, for example. The metallization pattern 118 includes a plurality of conductive lines on and extending along the major surface of the dielectric layer 116. The metallization pattern 118 further includes a plurality of conductive vias extending through the dielectric layer 116 to be physically and electrically connected to the metallization pattern 114. The metallization pattern 118 may be formed in a manner similar to the metallization pattern 110, and may be formed of the same material as the metallization pattern 110. The conductive vias of the metallization pattern 118 have smaller width (e.g., as measured along the lateral direction) than the conductive vias of the metallization pattern 110. As such, when patterning the dielectric layer 116 for the metallization pattern 114, the width (e.g., as measured along the lateral direction) of the openings in the dielectric layer 116 are smaller than the width of the openings in the dielectric layer 108.

In the case, the dielectric layer 120 is deposited on the metallization pattern 118 and dielectric layer 116. The dielectric layer 120 may be formed in a manner similar to the dielectric layer 108, and may be formed of the same material as the dielectric layer 108.

Figure 3:
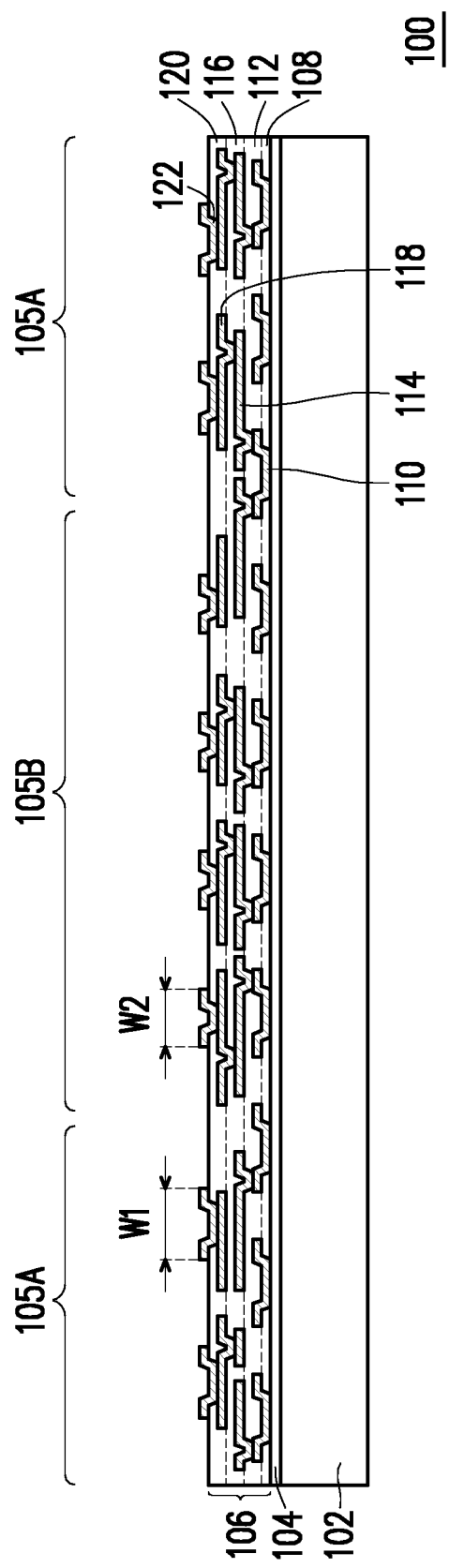

Referring to FIG. 3, in some embodiments, a plurality of under-ball metallurgy (UBM) patterns 122 are formed on and extend through the dielectric layer 120. As an example to form the UBM patterns 122, the dielectric layer 120 may be patterned to form a plurality of openings exposing portions of the metallization pattern 118. The patterning may be by an acceptable process, such as by exposing the dielectric layer 120 to light when the dielectric layer 120 is a photo-sensitive material or by etching using, for example, an anisotropic etch. If the dielectric layer 120 is a photo-sensitive material, the dielectric layer 120 can be developed after the exposure. In some embodiments, the openings for the UBM patterns 122 may be wider than the openings for the conductive via portions of the metallization patterns 110, 114, and 118, in the lateral direction. In some embodiments, the openings of the UBM patterns 122 may be narrower than or about the same width as the openings for the conductive via portions of the metallization patterns 110, 114, and 118, in the lateral direction. A seed layer is formed over the dielectric layer 120 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBM patterns 122. The patterning forms a plurality of openings through the photoresist to expose portions of the seed layer. A conductive material is formed in the openings of the photoresist and on the exposed portions of the seed layer. The conductive material may be formed by plating, such as electroplating or electroless plating, or the like. The conductive material may comprise a metal, like copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBM patterns 122. In embodiments where the UBM patterns 122 are formed differently (e.g., in shapes, in dimensions, in materials, the like, and/or combinations thereof), more photoresist and patterning steps may be utilized.

The UBM patterns 122 may not all have the same width. In some embodiments, a first subset of the UBM patterns 122 in a first region 105A of the redistribution structure 106 have a first width W1, and a second subset of the UBM patterns 122 in a second region 105B of the redistribution structure 106 have a second width W2. The first width W1 may be different from the second width W2, and in some embodiments the first width W1 is greater than the second width W2. The first width W1 may be between about 100 μm and about 300 μm, such as about 170 μm, though other values are contemplated and may be used. The second width W2 may be between about 25 μm and about 90 μm, such as about 48 μm, though other values are contemplated and may be used.

Figure 4:
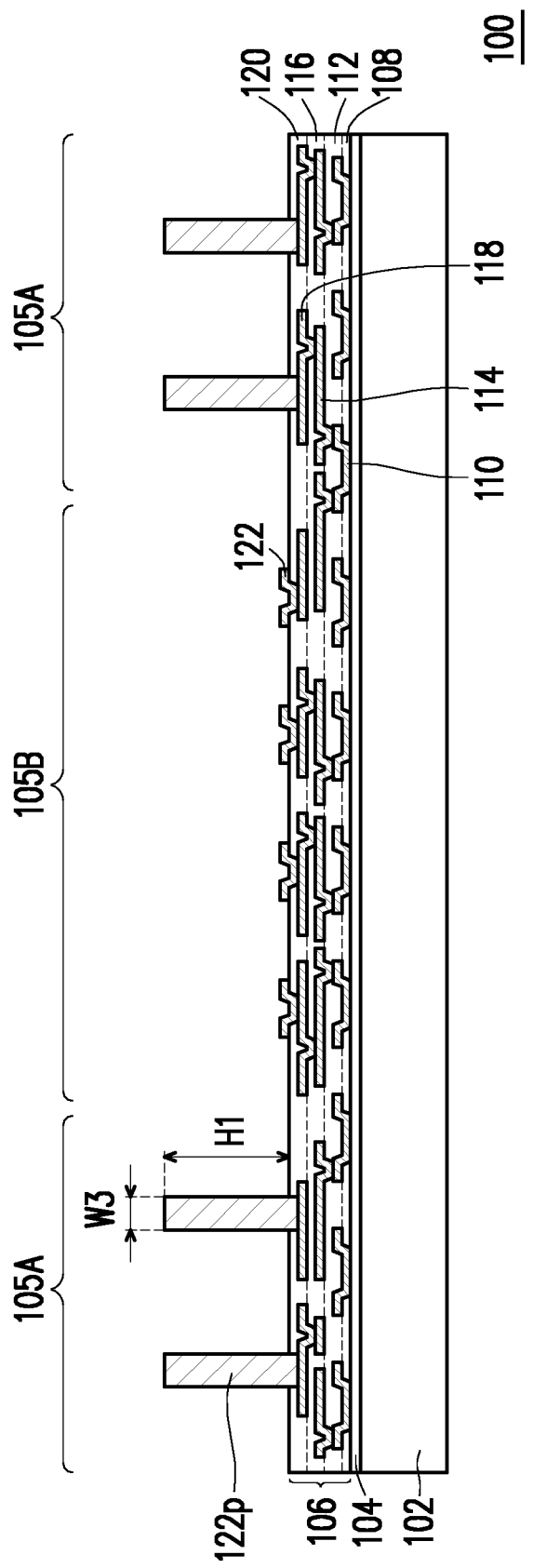

Referring to FIG. 4, some or all of the UBM patterns 122 of the first region 105A may instead be formed into a plurality of conductive pillars 122p, in accordance with some embodiments. Conductive pillars 122p may be formed by continuing plating the UBM patterns 122 of the first region 105A through the photoresist until conductive pillars 122p reach a desired height H1, such as between about 10 μm and about 250 μm, such as about 150 μm, though other values are contemplated and may be used. In some embodiments, the width W3 of the conductive pillars may correspond to the openings in the dielectric layer 120 which was patterned to expose portions of the metallization pattern 118. In some embodiments, the width W3 may be wider or narrower than the openings in the dielectric layer 120. Width W3 may be between about 50 μm and about 300 μm, such as about 150 μm, though other values are contemplated and may be used.

Figure 5:
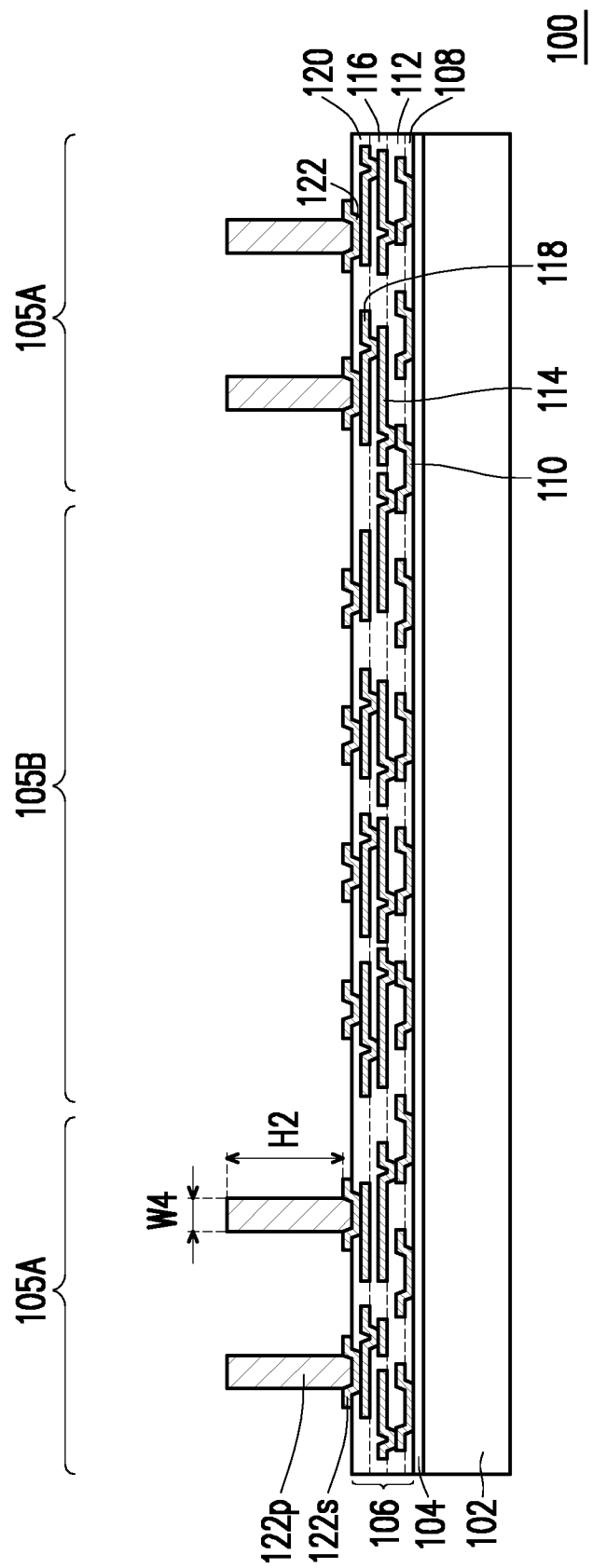

Referring to FIG. 5, in some embodiments, a plurality of conductive pillars 122p are respectively formed on some or all of the UBM patterns 122 of the first region 105A. After forming the UBM patterns 122, another photoresist may be formed by spin coating or the like and exposed to light for patterning. The pattern of the photoresist corresponds to the pattern for the conductive pillars 122p. The patterning forms a plurality of openings in the photoresist to expose the UBM patterns 122. The conductive material of conductive pillars 122p may be formed by plating, such as electroplating or electroless plating, or the like, until conductive pillars 122p reach a desired height H2, such as between about 10 μm and about 250 μm, such as about 150 μm, though other values are contemplated and may be used. The width W4 of the conductive pillars corresponds to the width of the openings of the pattern of the photoresist. Width W4 may be between about 50 μm and about 300 μm, such as about 150 μm, though other values are contemplated and may be used. The conductive material may comprise a metal, like copper, titanium, tungsten, aluminum, or the like. Then, the photoresist is removed. The photoresist may be removed by an acceptable ashing or stripping process, such as using an oxygen plasma or the like. The resulting structure may have a shoulder 122s of the UBM patterns 122 surrounding the base of the conductive pillars 122p.

Although the remaining figures illustrate the conductive pillars 122p which are configured as described with respect to FIG. 5, it should be understood that the conductive pillars 122p which are configured as described with respect to FIG. 4 (i.e., without UBM 122 (e.g., the shoulder 122s)) may be substituted as appropriate unless otherwise noted.

Figure 6:
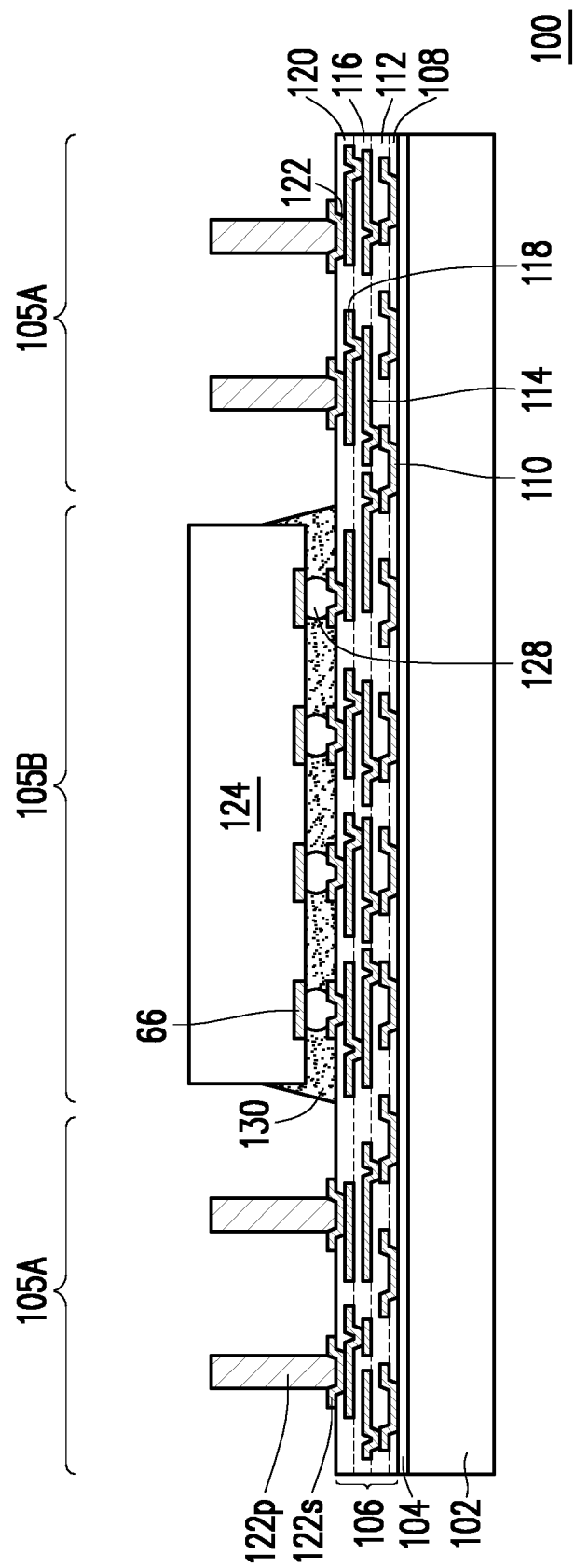

Referring to FIG. 6, in some embodiments, an integrated circuit die 124 is placed over the redistribution structure 106.

The integrated circuit die 124 may be aligned and placed using, e.g., a pick-and-place tool. The integrated circuit die 124 is placed on the redistribution structure 106 such that a plurality of conductive connectors 128 are aligned with the UBM patterns 122 in the second region 105B. After the integrated circuit die 124 is placed, the conductive connectors 128 are reflowed to form a plurality of joints between corresponding ones of the UBM patterns 122 and die connectors 66, physically and electrically connecting the integrated circuit die 124 to the redistribution structure 106.

Figure 7:
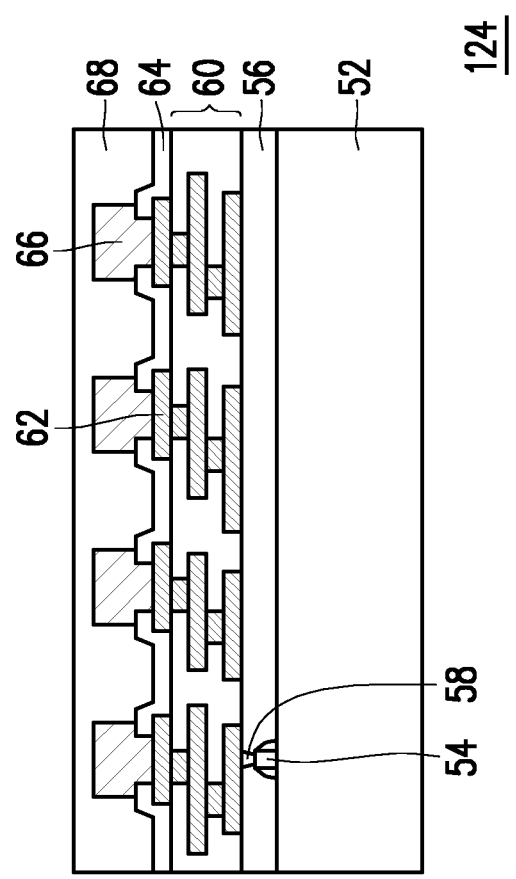

Referring for a moment to FIG. 7, FIG. 7 illustrates a schematic cross-sectional view of an integrated circuit die 124 in accordance with some embodiments. The integrated circuit die 124 will be packaged in subsequent processing to form an integrated circuit package. The integrated circuit die 124 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the integrated circuit die 124 is referred to as a semiconductor die.

The integrated circuit die 124 may be formed in a wafer, which may include different device regions that are singulated in subsequent steps to form a plurality of integrated circuit dies. The integrated circuit die 124 may be processed according to applicable manufacturing processes to form integrated circuits. For example, the integrated circuit die 124 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 7), sometimes called a front side, and an inactive surface (e.g., the surface facing downwards in FIG. 7), sometimes called a back side.

A plurality of devices 54 may be formed at the front surface of the semiconductor substrate 52, although only one device 54 is shown in FIG. 7 for simplicity and illustrative purposes. The devices 54 may be active devices (e.g., transistors, diodes, etc.), capacitors, resistors, etc. An inter-layer dielectric (ILD) 56 is over the front surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

A plurality of conductive plugs 58 extend through the inter-layer dielectric 56 to electrically and physically couple the devices 54, although only one conductive plug 58 is shown in FIG. 7 for simplicity and illustrative purposes. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the inter-layer dielectric 56 and the conductive plugs 58. The interconnect structure 60 interconnects the devices 54 to form an integrated circuit. The interconnect structure 60 may be formed by, for example, one or more metallization patterns in one or more dielectric layers on the inter-layer dielectric 56. The metallization patterns include a plurality of metal lines and a plurality of vias formed in one or more low-k dielectric layers. The metallization patterns of the interconnect structure 60 are electrically coupled to the devices 54 by the conductive plugs 58.

The integrated circuit die 124 further includes a plurality of pads 62, such as aluminum pads, to which external connections are made. The pads 62 are on the active side of the integrated circuit die 124, such as in and/or on the interconnect structure 60. One or more passivation films 64 are on the integrated circuit die 124, such as on portions of the interconnect structure 60 and pads 62. A plurality of openings extend through the passivation films 64 to the pads 62. A plurality of die connectors 66, such as conductive pillars (for example, formed of a metal such as copper), extend through the openings in the passivation films 64 and are physically and electrically coupled to respective ones of the pads 62. The die connectors 66 may be formed by plating, or the like. The die connectors 66 electrically couple the respective integrated circuits of the integrated circuit die 124.

Optionally, solder regions (e.g., solder balls or solder bumps) may be disposed on the pads 62. The solder balls may be used to perform chip probe (CP) testing on the integrated circuit die 124. CP testing may be performed on the integrated circuit die 124 to ascertain whether the integrated circuit die 124 is a known good die (KGD). Thus, only integrated circuit dies 124, which are KGDs, undergo subsequent processing are packaged, and rest of integrated dies, which fail the CP testing, are not packaged. After testing, the solder regions may be removed in subsequent processing steps.

A dielectric layer 68 may (or may not) be on the active side of the integrated circuit die 124, such as on the passivation films 64 and the die connectors 66. The dielectric layer 68 laterally encapsulates the die connectors 66, and the dielectric layer 68 is laterally coterminous with the integrated circuit die 124. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, PI, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, CVD, or the like. In some embodiments, the die connectors 66 are exposed through the dielectric layer 68 during formation of the integrated circuit die 124. In some embodiments, the die connectors 66 remain buried and are exposed during a subsequent process for packaging the integrated circuit die 124. Exposing the die connectors 66 may remove any solder regions that may be present on the die connectors 66.

In some embodiments, the integrated circuit die 124 is a stacked device that include multiple semiconductor substrates 52. For example, the integrated circuit die 124 may be a memory device such as a hybrid memory cube (HMC) module, a high bandwidth memory (HBM) module, or the like that includes multiple memory dies. In such embodiments, the integrated circuit die 124 includes multiple semiconductor substrates 52 interconnected by through-substrate vias (TSVs). Each of the semiconductor substrates 52 may (or may not) have one interconnect structure 60.

Referring back now to FIG. 6, because the active side of the integrated circuit die 124 faces toward the redistribution structure 106, in accordance with some embodiments, the redistribution structure 106 may also be referred to as a front-side redistribution structure. A plurality of conductive connectors 128 may be formed on the die connectors 66 (see FIG. 7) before the integrated circuit die being bonding to the redistribution structure 106. The conductive connectors 128 may be formed from a conductive material such as solder, copper, aluminum, gold, nickel, silver, palladium, tin, the like, or a combination thereof. In some embodiments, the conductive connectors 128 are solder connectors. The integrated circuit die 124 may be bonded to the redistribution structure 106 by a flip-chip bonding process. In alternative embodiments, the integrated circuit die 124 includes a plurality of integrated circuit dies 124 distributed over the redistribution structure 106. The integrated circuit dies 124 may be arranged in the form of a matrix (such as a N×N array or a N×M array, where N, M>0, N may or may not be equal to M) within the second region 105B of the redistribution structure 106.

An underfill 130 may be formed between the integrated circuit die 124 and redistribution structure 106, surrounding the conductive connectors 128. As such, the conductive connectors 128 may be protected from mechanical forces. The underfill 130 may be formed by a capillary flow process after the integrated circuit die 124 is attached, or may be formed by a suitable deposition method before the integrated circuit die 124 is attached.

Figure 8:
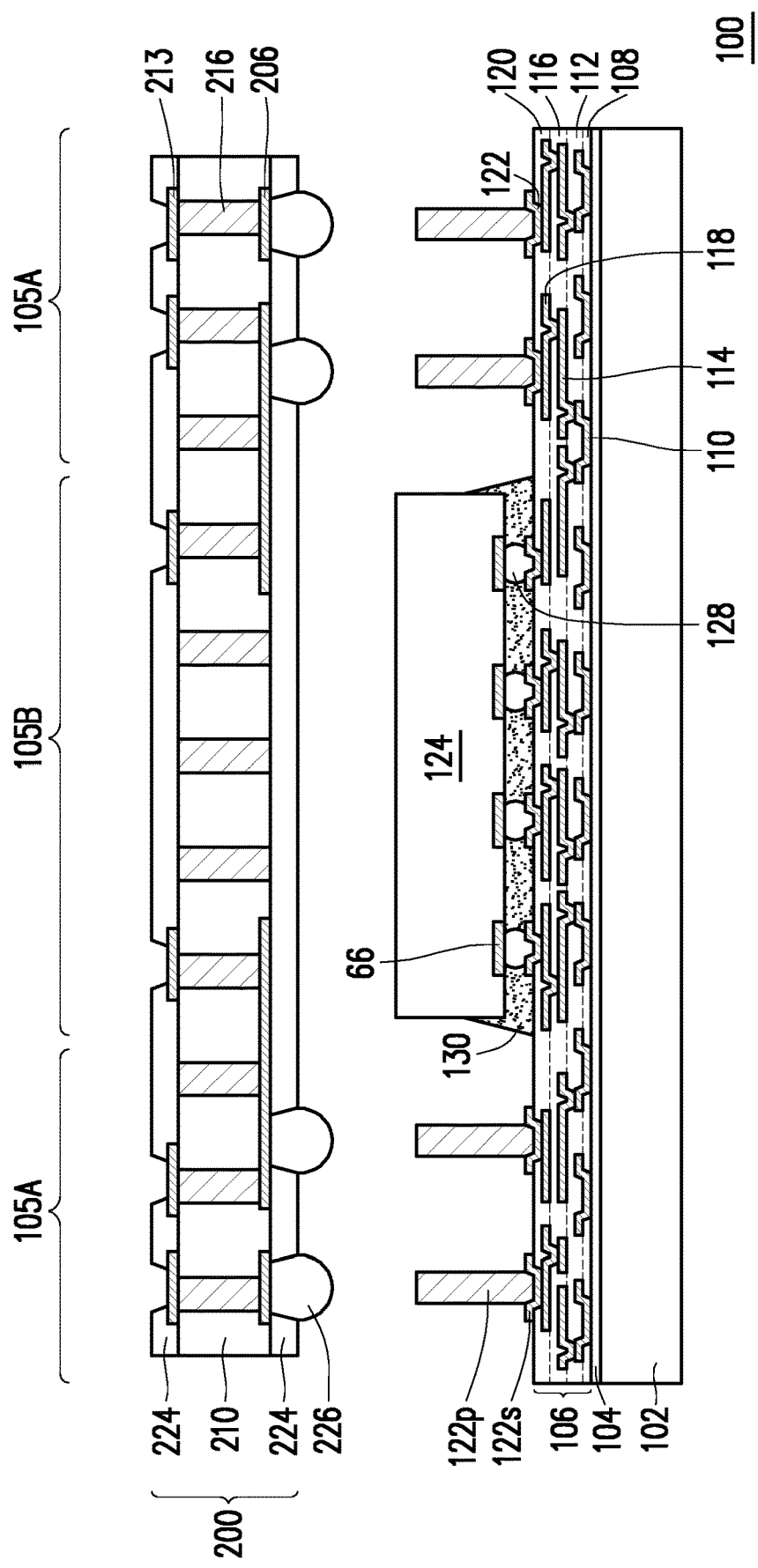

Referring to FIG. 8, a ring or lid 200 is aligned to the conductive pillars 122p to respectively couple a plurality of conductive connectors 226 to respective ones of the conductive pillars 122p, in accordance with some embodiments. The lid 200 may be referred to as a ring, in the disclosure. The lid 200 may be aligned and placed using, e.g., a pick-and-place tool. The lid 200 is placed on the redistribution structure 106 such that the conductive connectors 226 are aligned with the UBM patterns 122 and/or conductive pillars 122p in the first region 105A.

The lid 200 may be an interposer, heat spreader (see FIG. 11), redistribution structure, or combination thereof. As illustrated in FIG. 8, for example, the lid 200 includes an interposer with a redistribution structure.

Where the lid 200 is an interposer, the lid 200 may include one or more substrate cores, collectively referred to as the substrate core 210. The substrate core 210 may be formed from a pre-impregnated composite fiber ("prepreg"), an insulating film or build-up film, paper, glass fiber, non-woven glass fabric, silicon, or the like. In some embodiments, the substrate core 210 is formed from a prepreg including glass fiber and a resin. In some embodiments, the substrate core 210 may be a copper-clad epoxy-impregnated glass-cloth laminate, a copper-clad polyimide-impregnated glass-cloth laminate, or the like. A conductive layer 206 may be one or more layers of copper, titanium, nickel, aluminum, compositions thereof, or the like, and may be formed using any appropriate process, such as by metal foil lamination, CVD, PVD, and so forth. In some embodiments, the conductive layer 206 may be a foil which is thermally laminated to the substrate core 210. In some embodiments, the conductive layer 206 may be a redistribution structure similar to that described with respect to the redistribution structure 106. The conductive connectors 226 may be formed on the conductive layer 206. A solder resist 224 may be formed to surround and protect the sides of the conductive connectors 226. Conductive vias 216 may provide signals from the conductive layer 206 to the opposite side of the lid 200. Another conductive layer 213 (which may be similar to conductive layer 206) may be used to provide signals from the conductive vias 216 to another device to be mounted atop the lid 200. The conductive vias 216, the conductive layer 206, and the conductive layer 213 may be formed from a conductive material such as copper, titanium, tungsten, aluminum, or the like. Another solder resist 224 may be used atop the lid 200 and a plurality of openings may be formed therein to expose portions of the conductive layer 213.

Figure 9:
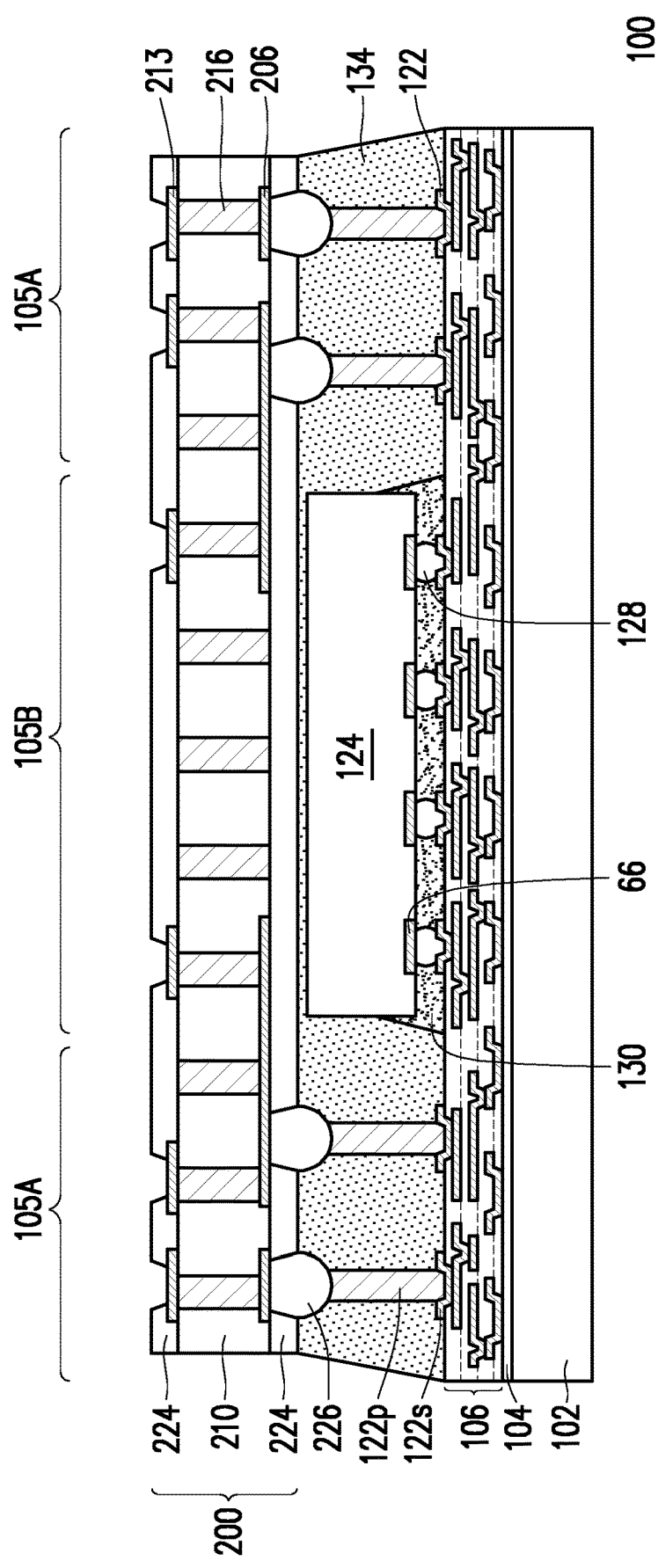

Referring to FIG. 9, in some embodiments, after the lid 200 is placed, the conductive connectors 226 are reflowed to form a plurality of joints between corresponding ones of the conductive pillars 122p and the conductive layer 206, physically and electrically connecting the lid 200 to the redistribution structure 106. An encapsulant 134 is formed on the various components. The encapsulant 134 may be a molding compound, epoxy, or the like, and may be applied by compression molding, transfer molding, or the like. The encapsulant 134 may be formed over the redistribution structure 106 such that the integrated circuit die 124 is buried or covered and the space between the lid 200 and the redistribution structure 106 is filled. The encapsulant 134 is then cured, in the case. In some embodiments, the encapsulant 134 is also formed between the redistribution structure 106 and the integrated circuit die 124, for example, in embodiments where the underfill 130 is omitted. In some embodiments, the encapsulant 134 is formed prior to placing the lid 200 to help support the conductive pillars 122p.

Figure 10:
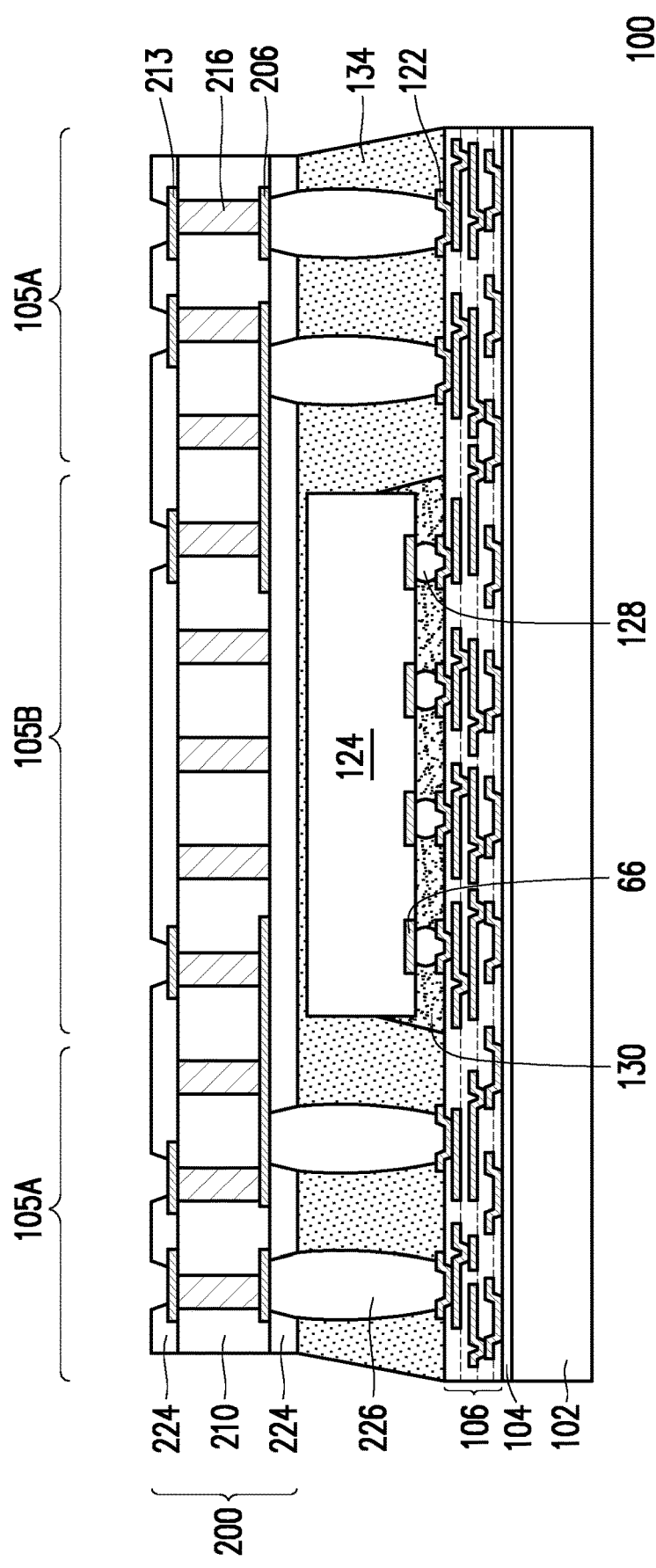

Referring to FIG. 10, an embodiment is illustrated which omits the conductive pillars 122p, in accordance with some embodiments. In such embodiments, the conductive connectors 226 may extend from the lid 200 to the UBM patterns 122 of the redistribution structure 106. In some embodiments, the encapsulant 134 is formed prior to placing the lid 200 and a plurality of holes formed therein for the conductive connectors 226. It should be understood that the embodiment omitting the conductive pillars 122p is not to scale and the conductive connectors 226 may be more spherical than as illustrated.

Figure 11:
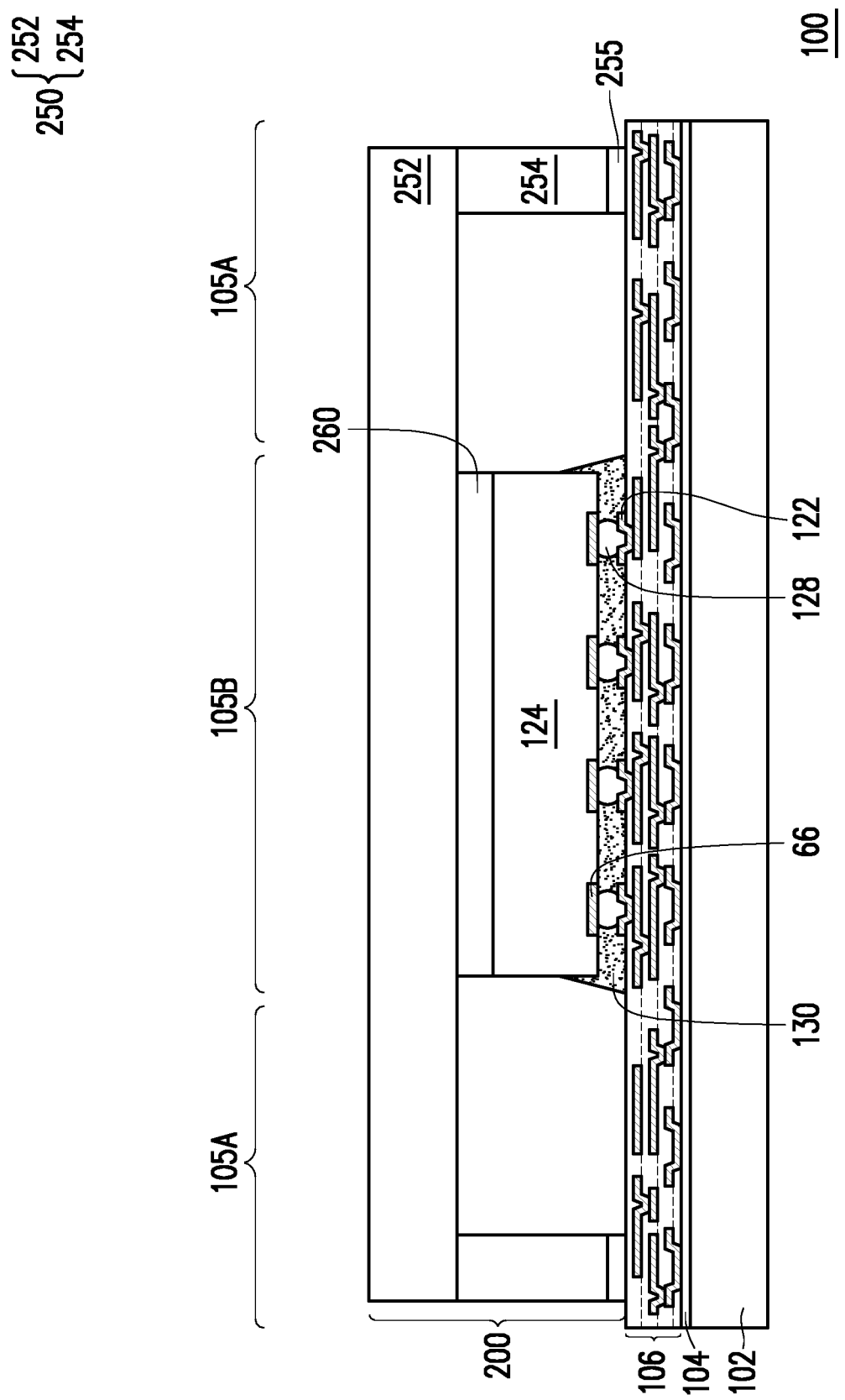

Referring to FIG. 11, an embodiment is illustrated which the lid 200 is a heat spreader 250, the conductive pillars 122p may be omitted as well as the UBM patterns 122. The heat spreader 250 may include an upper lid 252 and a supporting structure 254 and may be mounted to the redistribution structure 106 by a thermal adhesive 255. In addition, a thermal adhesive 260 may be used on the back surface of the integrated circuit die 124. The heat spreader 250 may be made of a metal or metal alloy, such as aluminum, copper, aluminum nitride, and so forth. The thermal adhesive 255 and 260 may be any suitable adhesive, epoxy, underfill, die attach film (DAF), thermal interface material, or the like. The thermal adhesive 255 and 260 may be applied to a back-side of the integrated circuit die 124 or may be applied to an area of the upper lid 252. For example, the upper lid 252 and the supporting structure 254 are respectively made of a material having high thermal conductivity between about 200 W/(m·K) to about 400 W/(m·K) or more. In the embodiments of which the heat spreader 250 has the high thermal conductivity to the integrated fan-out package, the heat dissipation of the integrated fan-out package is further enhanced. The supporting structure 254 may be referred to as a ring or a ring structure, in the disclosure.

The remaining intermediate steps will be illustrated where the lid 200 is a heat spreader 250 (FIG. 11), however, it should be understood that another lid-type (FIG. 9 or FIG. 10) may be used, such as discussed above.

Figure 12:
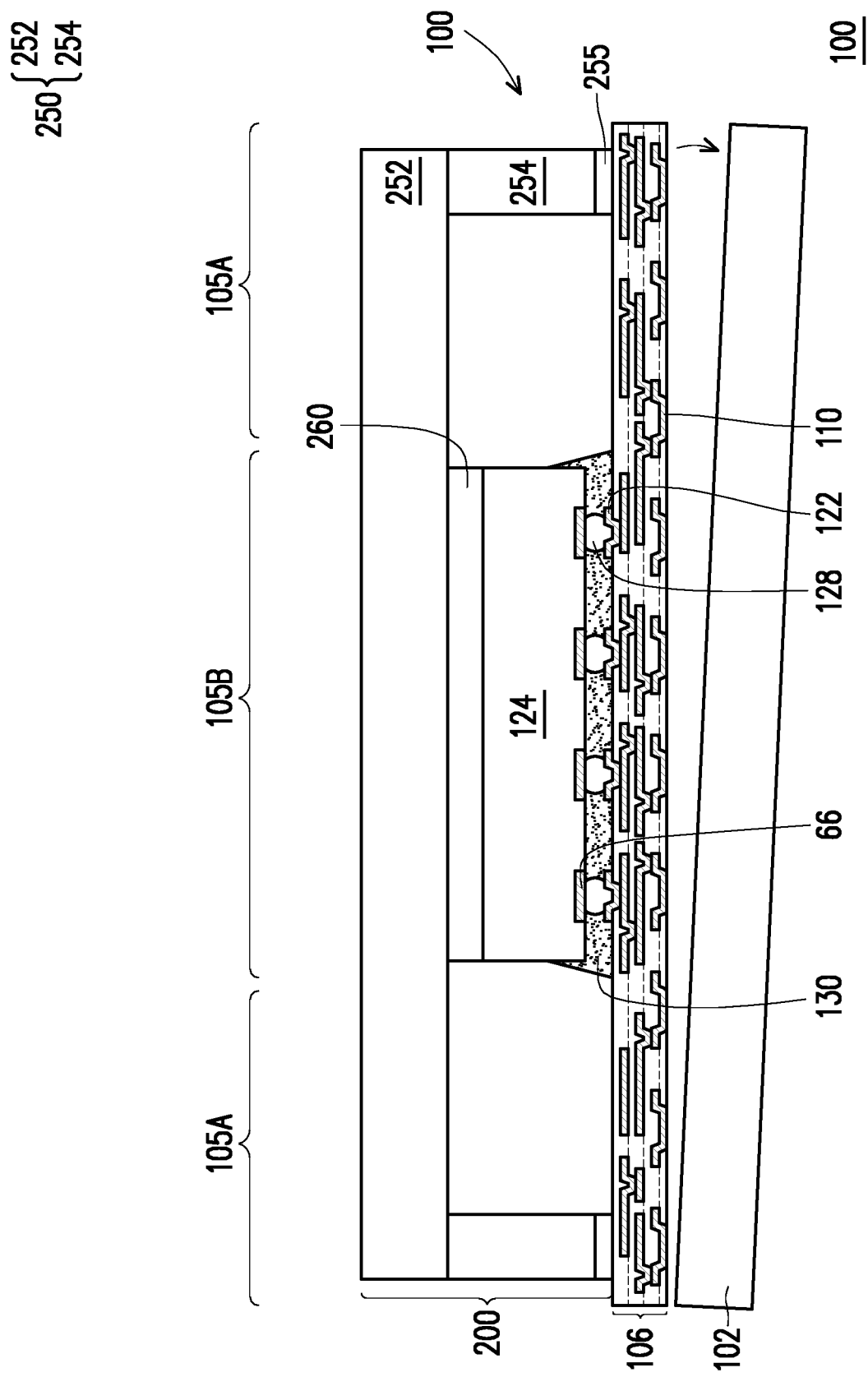

Referring to FIG. 12, in some embodiments, the carrier substrate 102 is removed. The carrier substrate 102 may be detached (or "de-bonded") from the redistribution structure 106. In some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape. The de-bonding exposes the metallization patterns 110 of the redistribution structure 106.

Figure 13:
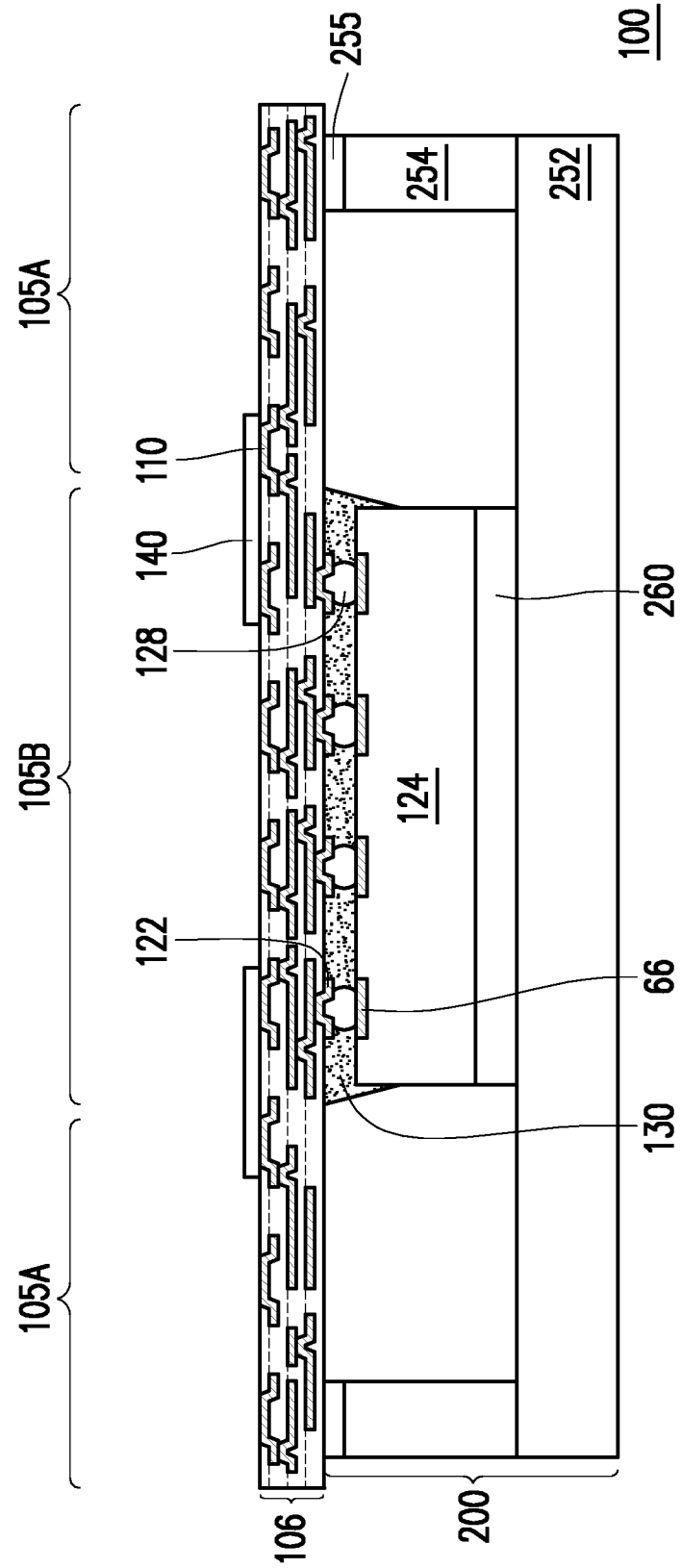

FIG. 13 through FIG. 31B illustrate various configurations for using conductive spacers, in accordance with some embodiments. Referring to FIG. 13, in some embodiments, optional devices 140, such as surface mount devices (SMDs), such as capacitors, resistors, regulators, power controllers, and so forth may be mounted to the surface of the redistribution structure 106 and electrically coupled to one or more of the metallization patterns 110. The optional devices 140 may be placed by a pick and place process. In some embodiments, a passivation layer (not shown) may be used over the metallization patterns 110 and patterned to accessibly reveal the exposed portions of the metallization patterns 110 in the first region 105A and/or the second region 105B prior to placing the optional devices 140. In some embodiments, UBM patterns (not shown) may be formed on the passivation layer and over the exposed portions of the metallization patterns 110. In such embodiments, the UBM patterns may be formed using processes and materials similar to the UBM patterns 122. In some embodiments, a flux (not shown) may be deposited on the metallization patterns 110 or on the UBM patterns, such as over where the optional devices 140 are attached. In some embodiments, a reflow may be performed to physically and electrically couple the optional devices 140 to the metallization patterns 110. The flux may include a flux with high viscosity, which may be applied through, for example, dipping, brushing, syringe dispensing, printing, or spraying. The flux may be pre-solder pastes. Alternatively, the flux may be pre-solder blocks/pads. In some embodiments, a material of the flux may include a lead-free solder material (such as Sn—Ag base or Sn—Ag—Cu base materials) with or without additional impurity (such as Ni, Bi, Sb, Au, or the like). Alternatively, the material of the flux may include a lead-based solder material with or without additional impurity (such as Ni, Bi, Sb, Au, or the like).

Figure 14:
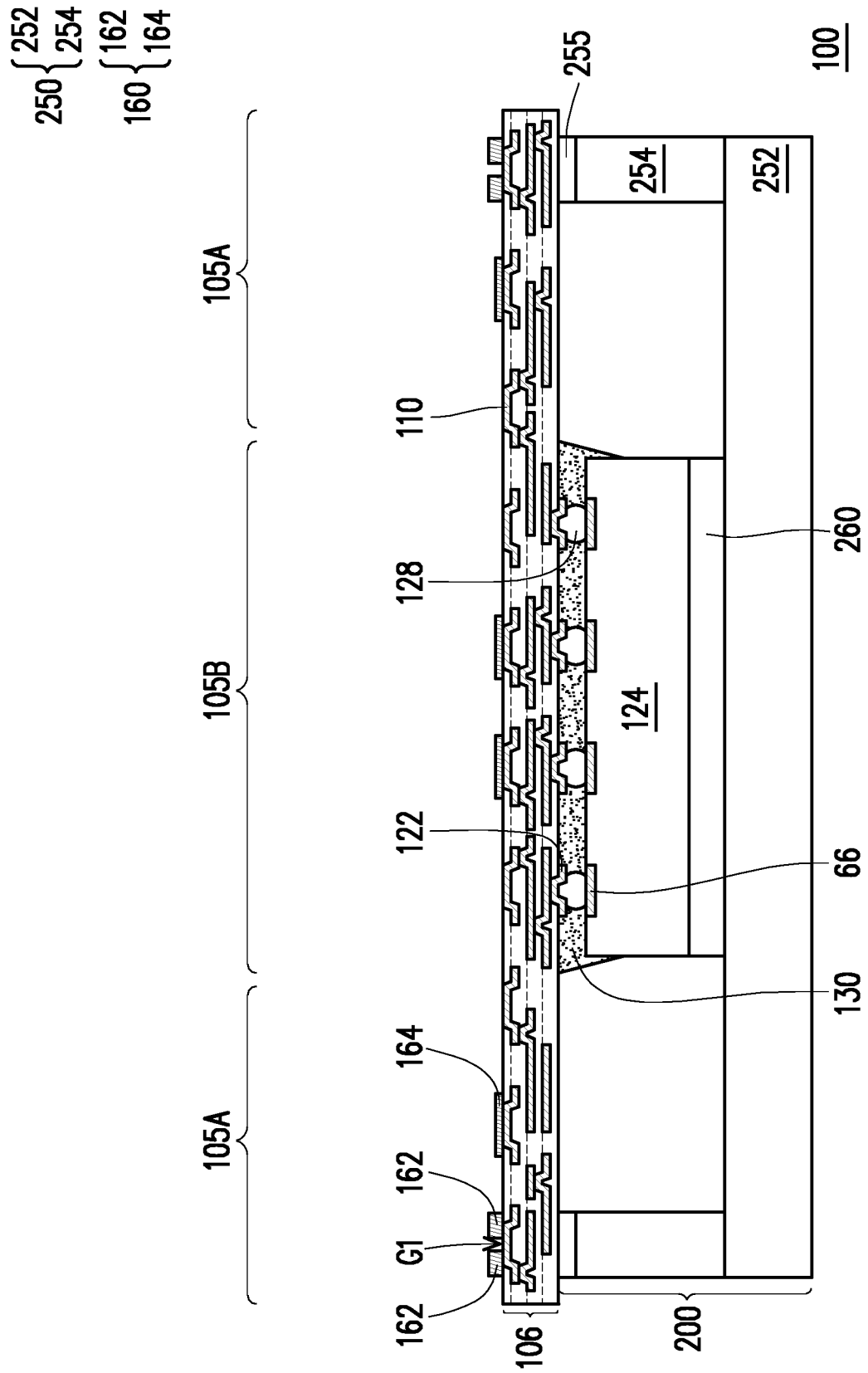
Figure 17B:
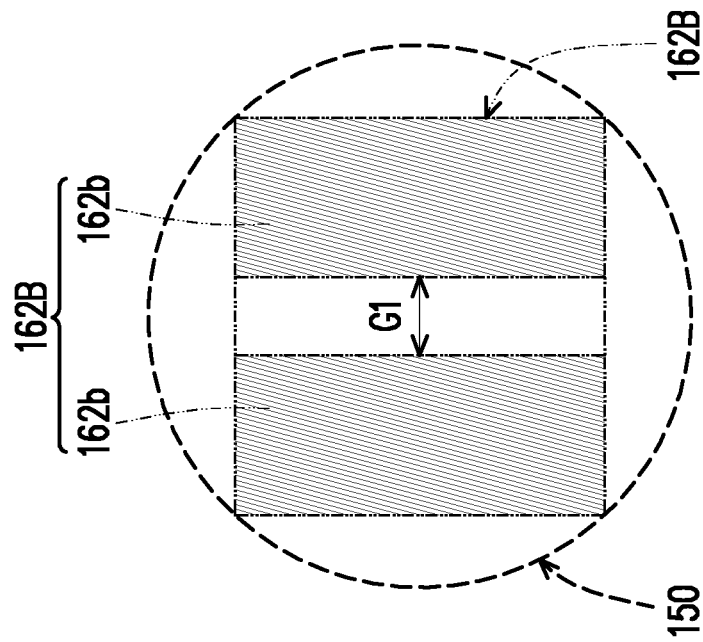
Figure 17A:
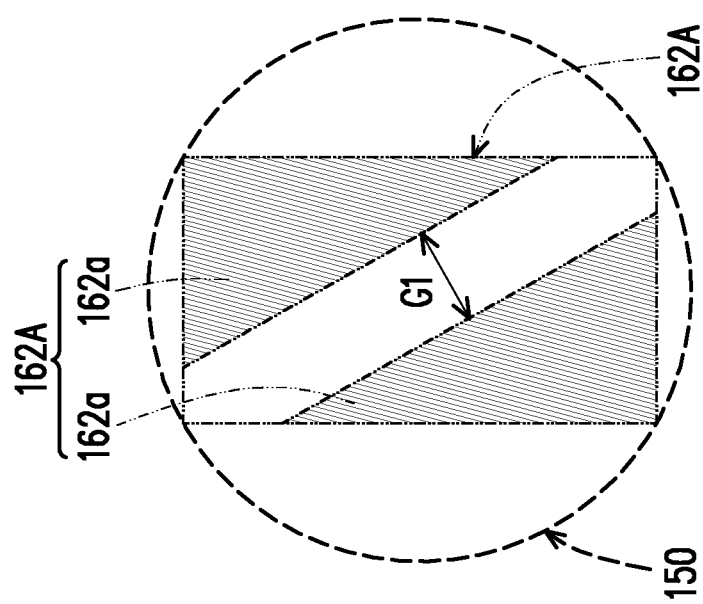
Figure 17D:
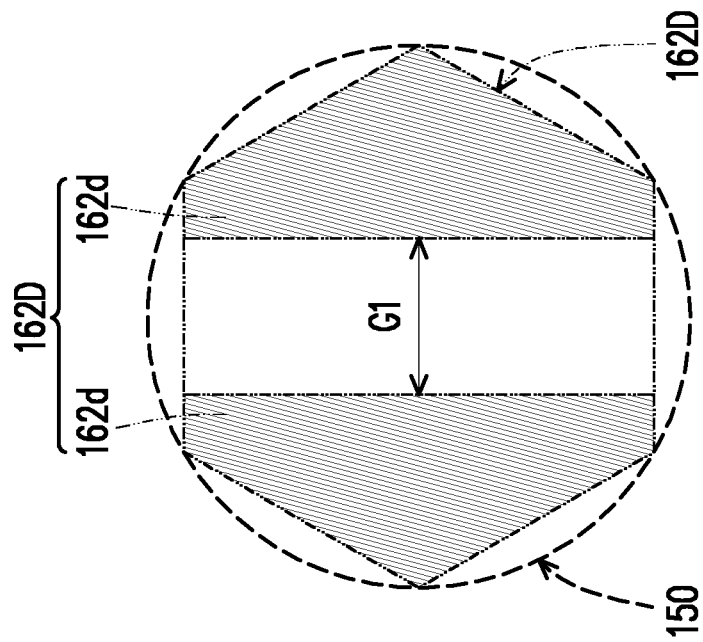
Figure 17C:
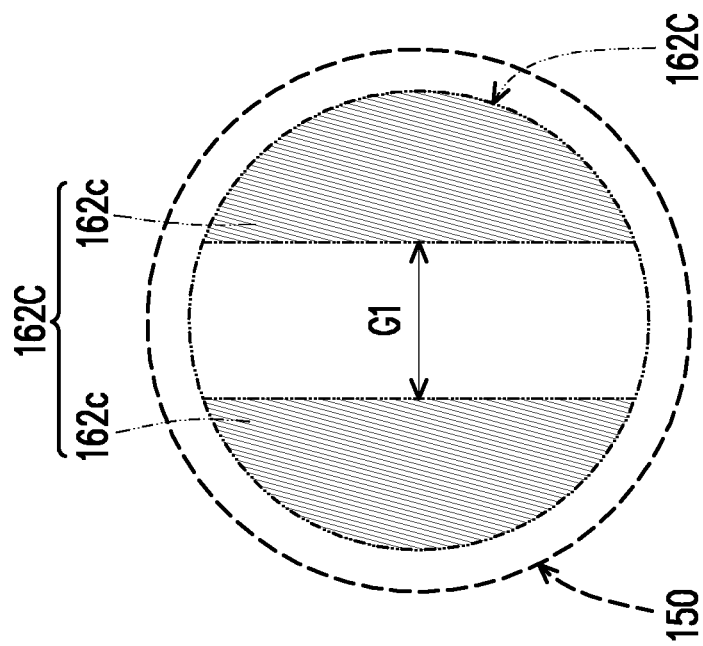
Figure 17F:
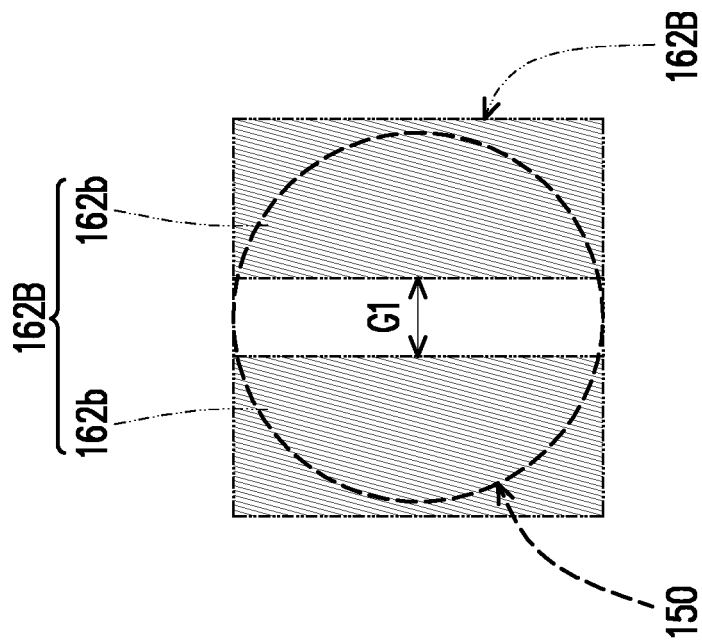
Figure 17E:
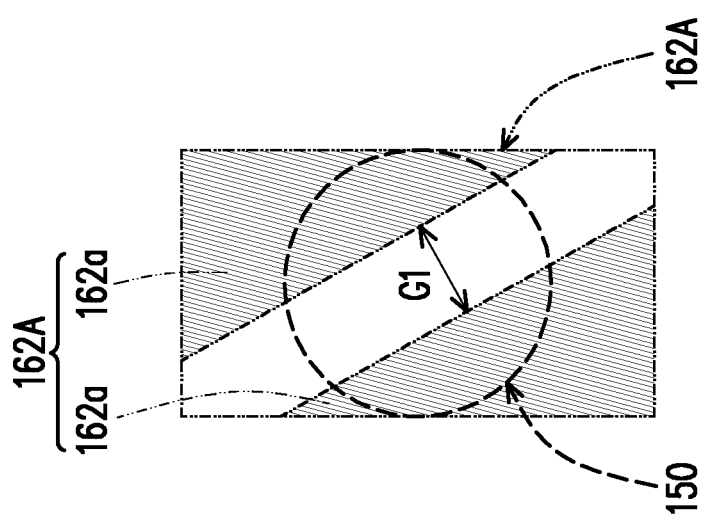
Figure 17H:
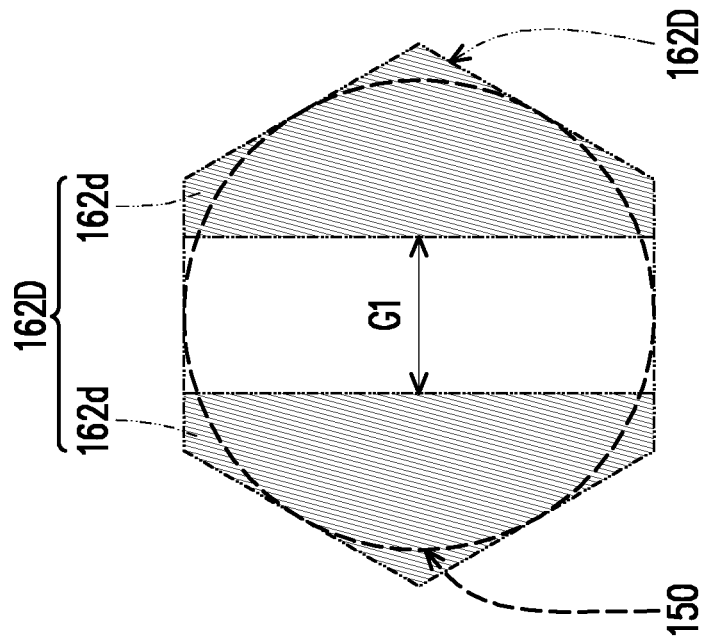
Figure 17G:
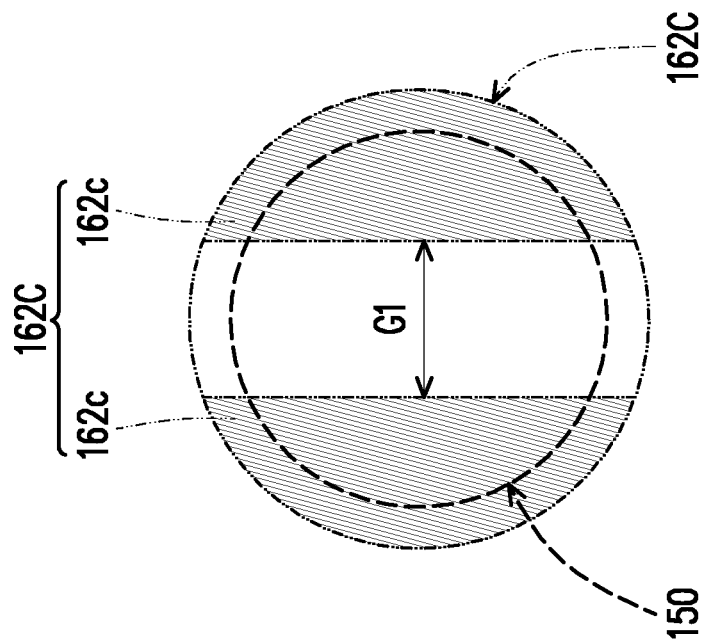

Referring to FIG. 14, in some embodiments, one or more than one flux portion 162 and one or more than one flux portion 164 are formed on the redistribution structure 106 and adjacent to the optional devices 140. The one or more than one flux portion 162 and the one or more than one flux portion 164 may be in physical and electrical contact with the exposed portions of the metallization pattern 110, to which external connections are made. The one or more than one flux portion 162 and the one or more than one flux portion 164, in general, may be referred to as a flux layer or material 160, in the disclosure. For example, in a plane view of one flux portion 162, the flux portion 162 includes a contour having a shape of tetragonal shape, a circular shape, an elliptical shape, an oval shape, a polygonal shape (e.g., hexagonal shape, octagonal shape, etc.), the like, or a combination thereof. The plane view is taken along the lateral direction of FIG. 1 through FIG. 13. As shown in FIG. 17A and FIG. 17E, in the plane view of one flux portion 162A, the contour of the flux portion 162A may be a tetragonal shape, where the flux portion 162A may include two sub-portions 162a each having a triangular shape and being separated from each other via a minimum distance, a gap G1. As shown in FIG. 17B and FIG. 17F, in the plane view of one flux portion 162B, the contour of the flux portion 162B may be a tetragonal shape, where the flux portion 162B may include two sub-portions 162b each having a rectangular shape and being separated from each other via a minimum distance, gap G1. As shown in FIG. 17C and FIG. 17G, in the plane view of one flux portion 162C, the contour of the flux portion 162C may be a circular shape, where the flux portion 162C may include two sub-portions 162c each having a semi-circular shape and being separated from each other via a minimum distance, gap G1. As shown in FIG. 17D and FIG. 17H, in the plane view of one flux portion 162D, the contour of the flux portion 162D may be a hexagonal shape, where the flux portion 162C may include two sub-portions 162d each having a pentangular shape and being separated from each other via a minimum distance, gap G1. For the plane view (of FIG. 17A through FIG. 17G), the corresponding paired sub-portions (e.g., 162a of 162A, 162b of 162B, 162c of 162C, and/or 162d of 162D) may be symmetric to one another about an extending direction of the gap G1. Alternatively, for the plane view (not shown), the corresponding paired sub-portions (e.g., 162a of 162A, 162b of 162B, 162c of 162C, and/or 162d of 162D) may be asymmetric to one another about an extending direction of the gap G1. The gap G1 may be between about 50 μm and about 400 μm, such as between about 50 μm and about 200 μm, though other values are contemplated and may be used. The flux portions 162A through 162H may be referred to as the flux portion 162, in general.

In some embodiments, in a plane view of one flux portion 164, the flux portion 164 includes a contour having a shape of tetragonal shape, a circular shape, an elliptical shape, an oval shape, a polygonal shape (e.g., hexagonal shape, octagonal shape, etc.), the like, or a combination thereof, without a gap G1 formed therein. The flux portions 162 and 164 may independently include a flux with high viscosity, which may be applied through, for example, dipping, brushing, syringe dispensing, printing, or spraying. The flux portions 162 and 164 may independently be solder pastes. Alternatively, the flux portions 162 and 164 may independently be solder blocks/pads. In some embodiments, a material of the portions 162 and 164 may independently include a lead-free solder material (such as Sn—Ag base or Sn—Ag—Cu base materials) with or without additional impurity (such as Ni, Bi, Sb, Au, or the like). Alternatively, the material of the portions 162 and 164 may independently include a lead-based solder material with or without additional impurity (such as Ni, Bi, Sb, Au, or the like).

As an example to form the flux portions 162 and 164, a stencil (not shown) is provided on the redistribution structure 106, where the stencil includes a plurality of apertures corresponding to patterns of the flux portions 162 and 164. The positioning locations of the optional device 140 are covered by the stencil. In the case, the apertures of the stencil expose the redistribution structure 106 to accessibly reveal the exposed portions of the metallization patterns 110 in a manner of corresponding to the shapes and the positioning locations of the flux portions 162 and 164 to be expectedly formed. A flux material is then applied on the exposed portions of the metallization patterns 110 exposed by the stencil by printing to form the flux portions 162 and 164. That is, the stencil may serve as a mask to outline regions in which the flux portions 162 and 164 may be applied thereon. The stencil may be made of stainless steel. The printing may also be recognized as a stencil printing technique. After the formations of the flux portions 162 and 164, the stencil is removed from the redistribution structure 106. In one embodiment, the flux portions 162 and 164 are formed in the same processing step. Alternatively, the flux portions 162 and 164 may be formed in different processing steps, for example, a first stencil having a plurality of first apertures corresponding to patterns of the flux portions 162 and a second stencil having a plurality of second apertures corresponding to patterns of the flux portions 164 are used. In other embodiments, the flux formed over the metallization patterns (where the optional devices 140 disposed at) and the flux portions 162, 164 may be formed at the same step. In some embodiments, UBM patterns (not shown) may be formed on the exposed portions of the metallization patterns 110 and under the flux portions 162 and/or the flux portions 164. In such embodiments, the UBM patterns may be formed using processes and materials similar to the UBM patterns 122. As shown in FIG. 14, the flux portions 162 and 164 are electrically coupled to the redistribution structure 106, for example. In some embodiments, the flux portions 162 and 164 are electrically coupled to the integrated circuit die 124 through the redistribution structure 106.

Although the flux portions 162 and 164 are shown to be formed after the placement of the optional devices 140, the optional devices 140 may be placed on and bonded to the redistribution structure 106 after the formation of the flux portions 162 and 164. The disclosure is not limited thereto.

Referring to FIG. 15A, FIG. 15B, and FIG. 15C, different configurations for a ball-type conductive spacers 150A, 150B, or 150C (or the conductive spacer 150, in general (see FIG. 16) are illustrated for use in maintaining spacing between the integrated fan-out package 100 to another device while attaching the integrated fan-out package 100 to the another device, both electrically and physically by a plurality of connector containing the conductive spacers 150. In FIG. 15A, the conductive spacer 150A is provided, which is a solid sphere 152. The core material of the conductive spacer 150A may include any suitable material such as a metal (e.g., copper, silver, aluminum, gold, nickel, lead, bismuth, indium, etc.) or a metal alloy, which has a higher melting point temperature over the reflow temperature of the other standard connectors (e.g., comprising or made of solder or the like, which is free of the conductive spacer 150A) and the reflow temperature of the flux portions 162 and 164. This will be described in greater detail below. The conductive spacers 150A may have a diameter between about 100 μm and about 500 μm, though other dimensions are contemplated. For example, the conductive spacer 150A includes a cupper ball, cupper bump, cupper stud, or the like.

In FIG. 15B, a conductive spacer 150B is provided and includes a solid sphere 152 coated with a first layer 154. The solid sphere 152 may be referred to as a solid center core or a solid core. The solid sphere 152 may be any of the materials discussed above with respect to the conductive spacer 150A and may have a diameter between about 100 μm and about 500 μm. The first layer 154 may be a barrier layer to prevent leeching from the material of the solid sphere 152 into the surrounding material. The first layer 154 may be between about 0 μm and about 150 μm thick, though other dimensions are contemplated. The first layer 154 may be made of any suitable materials such as nickel, sliver, tin, solder, titanium nitride, tantalum nitride, and so forth which is plated onto the solid sphere 152 and surrounds the solid sphere 152. The material of the solid sphere 152 is selected so that it has a higher melting point temperature over the reflow temperature of the other standard connectors (e.g., comprising or made of solder or the like, which is free of the conductive spacer 150B) and the reflow temperature of the flux portions 162 and 164, the solid sphere 152 cannot reflow during reflowing the other standard connectors and/or the flux portions 162 and 164. In one embodiment, the material of the first layer 154 may have a reflow temperature higher than the reflow temperature of the other standard connectors and the reflow temperature of the flux portions 162 and 164, so that the first layer 154 cannot reflow during reflowing the other standard connectors and/or the flux portions 162 and 164. However, the disclosure is not limited thereto; alternatively, the material of the first layer 154 may have a reflow temperature similar to the reflow temperature of the other standard connectors and the reflow temperature of the flux portions 162 and 164, so that the first layer 154 can reflow. As such, the material of the first layer 154 is different than the material of the solid sphere 152. For example, the conductive spacer 150B includes a cupper ball, cupper bump, cupper stud, or the like which is coated with a thin layer of Ni. For another example, the conductive spacer 150B includes a cupper ball, cupper bump, cupper stud, or the like which is coated with a thin layer of Sn.

In FIG. 15C, a conductive spacer 150C is provided and includes a solid sphere 152 coated with a first layer 154 and a second layer 156, where the first layer is interposed between the solid sphere 152 and the second layer 156. The solid sphere 152 may be any of the materials discussed above with respect to the conductive spacer 150A and may have a diameter between about 100 μm and about 500 μm. The first layer 154 may be any of the materials discussed above with respect to the conductive spacer 150B and may have a diameter between about 0 μm and about 150 μm. In some embodiments, the second layer 156 may be between about 0 μm and about 150 μm thick, though other dimensions are contemplated. The second layer 156 may include a eutectic material, such as a solder material, which is plated onto the first layer 154 and surrounds the solid sphere 152 and the first layer 154. The material of the solid sphere 152 is selected so that it has a higher melting point temperature over the reflow temperature of the other standard connectors (e.g., comprising solder or the like, which is free from the conductive spacer 150C) and the reflow temperature of the flux portions 162 and 164, the solid sphere 152 cannot reflow during reflowing the other standard connectors and/or the flux portions 162 and 164. In one embodiment, the material of the first layer 154 may have a reflow temperature higher than or similar to the reflow temperature of the other standard connectors and the reflow temperature of the flux portions 162 and 164. In the case of the material of the first layer 154 may have the higher reflow temperature, the first layer 154 cannot reflow during reflowing the other standard connectors and/or the flux portions 162 and 164. The material of the second layer 156 may have a reflow temperature similar to the reflow temperature of the other standard connectors and the reflow temperature of the flux portions 162 and 164, so that the second layer 156 can reflow during reflowing the other standard connectors and/or the flux portions 162 and 164. As such, the material of the second layer 156 is different than the material of the solid sphere 152, and is the same as or different than the material of the first layer 154. For example, the conductive spacer 150C includes a cupper ball, cupper bump, cupper stud, or the like which is coated with a thin layer of Ni, and the thin layer of Ni is further coated with a thin layer of solder. For example, the conductive spacer 150C includes a cupper ball, cupper bump, cupper stud, or the like which is coated with a thin layer of Sn, and the thin layer of Sn is further coated with a thin layer of solder.

In some embodiments, the conductive spacers 150A, 150B, or 150C include a core material which has a higher melting point temperature over the reflow temperature of the other standard connectors (e.g., comprising solder or the like) and the reflow temperature of the flux portions 162 and 164. Owing to that, the conductive spacers 150A, 150B, or 150C are capable of maintaining at least a height which is equivalent to the diameter of the solid sphere 152 during a solder reflowing process. In general, the melting point of the core material should be at least about 30° C. to 50° C. higher than the melting point of the material of other conductive connectors 170 (see FIG. 16). Similarly, the melting point of the core material should be at least about 30° C. to 50° C. higher than the melting point of the material of the flux portions 162 and 164 (see FIG. 14).

Figure 16:
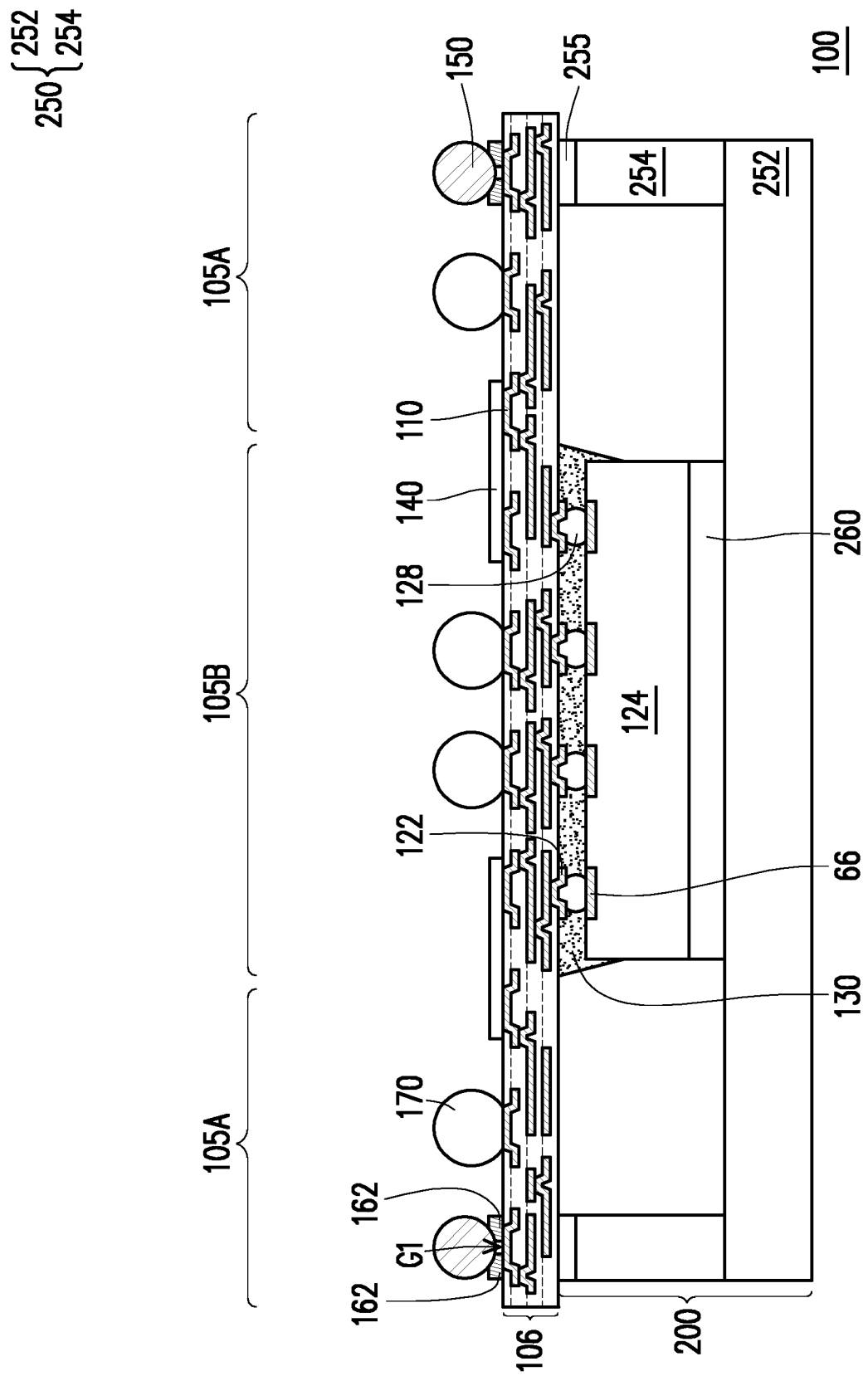

Referring to FIG. 16, in some embodiments, a plurality of conductive spacers 150 and a plurality of conductive connectors 170 are formed over the redistribution structure 106 for electrical connections to the integrated circuit die 124. The conductive connectors 170 and conductive spacers 150 may be deposited using a ball grid array (BGA) process. The flux portions 162 and 164 are reflowed during ball mounting to attach the conductive spacers 150 and the conductive connectors 170 with the metallization patterns 110. In the plane view of FIG. 17A, one conductive spacer 150 may disposed on the flux portion 162A and across the two sub-portions 162a, where the conductive spacer 150 may be overlapped with the gap G1. In the plane view of FIG. 17B, one conductive spacer 150 may disposed on the flux portion 162B and across the two sub-portions 162b, where the conductive spacer 150 may be overlapped with the gap G1. In the plane view of FIG. 17C, one conductive spacer 150 may disposed on the flux portion 162C and across the two sub-portions 162c, where the conductive spacer 150 may be overlapped with the gap G1. In the plane view of FIG. 17D, one conductive spacer 150 may disposed on the flux portion 162D and across the two sub-portions 162d, where the conductive spacer 150 may be overlapped with the gap G1. In the plane view of FIG. 17E, one conductive spacer 150 may disposed on the flux portion 162E and across the two sub-portions 162e, where the conductive spacer 150 may be overlapped with the gap G1. In the plane view of FIG. 17F, one conductive spacer 150 may disposed on the flux portion 162F and across the two sub-portions 162f, where the conductive spacer 150 may be overlapped with the gap G1. In the plane view of FIG. 17G, one conductive spacer 150 may disposed on the flux portion 162G and across the two sub-portions 162g, where the conductive spacer 150 may be overlapped with the gap G1. In the plane view of FIG. 17H, one conductive spacer 150 may disposed on the flux portion 162H and across the two sub-portions 162h, where the conductive spacer 150 may be overlapped with the gap G1. Owing to the gap G1 underneath the conductive spacer 150, a void or air bubble (e.g., solder voids) in the flux portion 162 can be escaped from the gap G1 without being embedding inside the flux portion 162 during the reflowing, such that a tilting of the conductive spacer 150 caused by the void or air bubble held inside the flux portion 162 can be prevented, thereby improving the reliability of bonding between the integrated fan-out package and the another device. The gap G1 may be referred as to an outlet path of the void or air bubble during the solder reflowing process.

In some embodiments, in the plane view of FIG. 17A through FIG. 17D, a vertical projection of the flux portion 162 (e.g., 162A, 162B, 162C, or 162D) is completely located within a vertical projection of the conductive spacer 150. In alternative embodiments, in the plane view of FIG. 17E through FIG. 17H, the vertical projection of the conductive spacer 150 is completely located within a vertical projection of the flux portion 162 (e.g., 162E, 162F, 162G, or 162H). In other embodiments (not shown), a perimeter of the vertical projection of the flux portion 162 is completely aligned with a perimeter of the vertical projection of the conductive spacer 150. The disclosure is not limited thereto.

The disposition of conductive spacers 150 and the conductive connectors 170 may be done by, but not limited to, placing the conductive spacers 150 to contact the flux portions 162 disposed on the exposed portions of the metallization patterns 110 and placing a plurality of solder balls (not shown) to contact the flux portions 164 disposed on the exposed portions of the metallization patterns 110, then performing a reflow process to re-shape the flux portions 162 into a configuration for attaching the conductive spacers 150 to the metallization patterns 110 and to re-shape the solder balls with the flux portions 164 into the desired bump/ball shapes to form the conductive connectors 170 being attached to the metallization patterns 110. During the reflowing, the flux portions 164 and respective solder balls are melted and together form the conductive connectors 170, and thus the flux portions 164 are not shown in FIG. 16 after the reflowing. In some embodiments, the conductive connectors 170 includes solder joints, solder balls, solder studs, or the like.

As shown in FIG. 16, the conductive spacers 150 are electrically connected to the redistribution structure 106 through the flux portions 162, and the conductive connectors 170 are electrically connected to the redistribution structure 106 in direct contact, for example. In some embodiments, some of the conductive spacers 150 are electrically coupled to the integrated circuit die 124 through the redistribution structure 106 and the flux portions 162. In some embodiments, some of the conductive connectors 170 are electrically coupled to the integrated circuit die 124 through the redistribution structure 106. Up to here, the integrated fan-out package 100 is manufactured. The integrated fan-out package 100 may be referred to as a (semiconductor) package. In the case, the conductive spacers 150 and the conductive connectors 170 are referred to as conductive terminals of the integrated fan-out package 100.

In alternative embodiments, the conductive connectors 170 are solely formed by reflowing the flux portions 164 into the desired bump/ball shapes. In one embodiment, prior to the reflowing, the conductive spacers 150 and solder balls for the conductive connectors 170 may be pressed in a form to the flux portions 162 and the flux portions 164, respectively; and the reflowing may be then performed. In other embodiments, the reflow may melt an outer solder layer (e.g., the first layer 154 of the conductive spacer 150B; or the first layer 152 and/or second layers 156 of the conductive spacer 150C) of the conductive spacers 150 to attach the conductive spacers 150 to the metallization patterns 110. In further alternative embodiments, the conductive connectors 170 may include a conductive material such as copper, aluminum, gold, nickel, silver, palladium, tin, the like, or a combination thereof.

In some embodiments, if not already performed, the reflow may also physically and electrically couple the optional devices 140 to the metallization patterns 110. Other suitable processes may also be used. In some embodiments, after forming the conductive connectors 170 and placing the conductive spacers 150, the structure may be flipped over and placed on a tape or secured by the conductive spacers 150 and the conductive connectors 170 and singulated into separate and individual dies with an InFO structure, e.g., the integrated fan-out package 100. In other embodiments, the integrated fan-out packages 100, which are interconnected, may be singulated directly on a tape without flipping the structure over.

Figure 18:
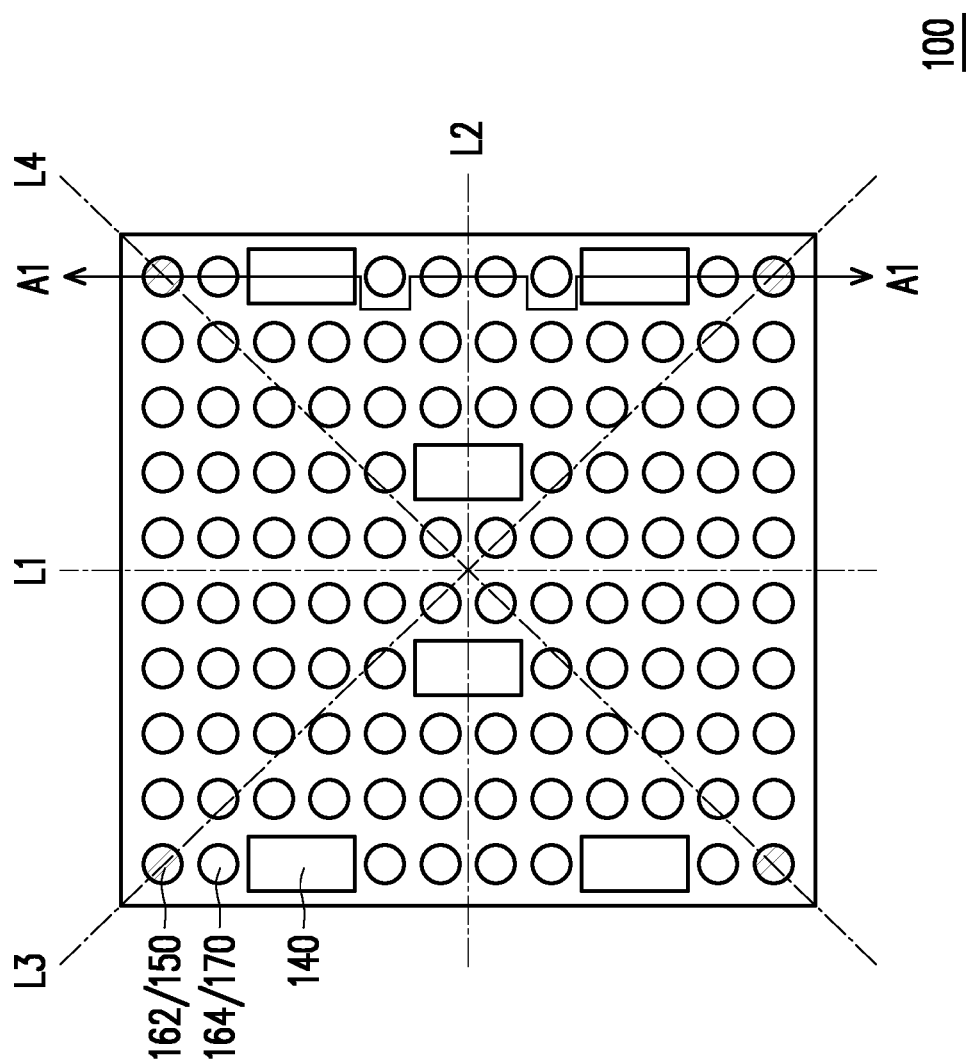

The one or more than one flux portion 162 may be applied onto the exposed portions of metallization patterns 110 near corners, edges and/or center of the integrated fan-out package 100, while the one or more than one flux portion 164 may be applied onto the exposed portions of metallization patterns 110 being remained. For example, as shown in the cross-sectional view of FIG. 16 and a top down view of FIG. 18 (where the cross-sectional view of FIG. 16 is taken along a line A1-A1 depicted in FIG. 18), the one or more than one flux portion 162 includes a plurality of flux portions 162 respectively disposed in corners of the integrated fan-out package 100 (where a portion of the exposed portions of the metallization patterns 110 are located at), and the corners are positioned on a diagonal line D3 or D4 of the integrated fan-out package 100. On the other hand, the one or more than one flux portion 164 includes a plurality of flux portions 164 respectively disposed in the remaining positions (where rest of the exposed portions of the metallization patterns 110 are located at). In some embodiments, the flux portions 162 are symmetrically arranged on the redistribution structure 106 about at least a central line (e.g., D1, D2, or both of D1 and D2) and/or a diagonal line (e.g., D3, D4, or both of D3 and D4). As shown in FIG. 18, the flux portions 162 may be located at all of the corners included in the integrated fan-out package 100. Alternatively, the flux portions 162 may be located at two of the corners included in the integrated fan-out package 100, where the two corners are positioned on either the diagonal line D3 or the diagonal line D4, as long as the flux portions 162 are symmetric about the central line (e.g., D1, D2, or both of D1 and D2) and/or the diagonal line (e.g., D3, D4, or both of D3 and D4).

Figure 19B:
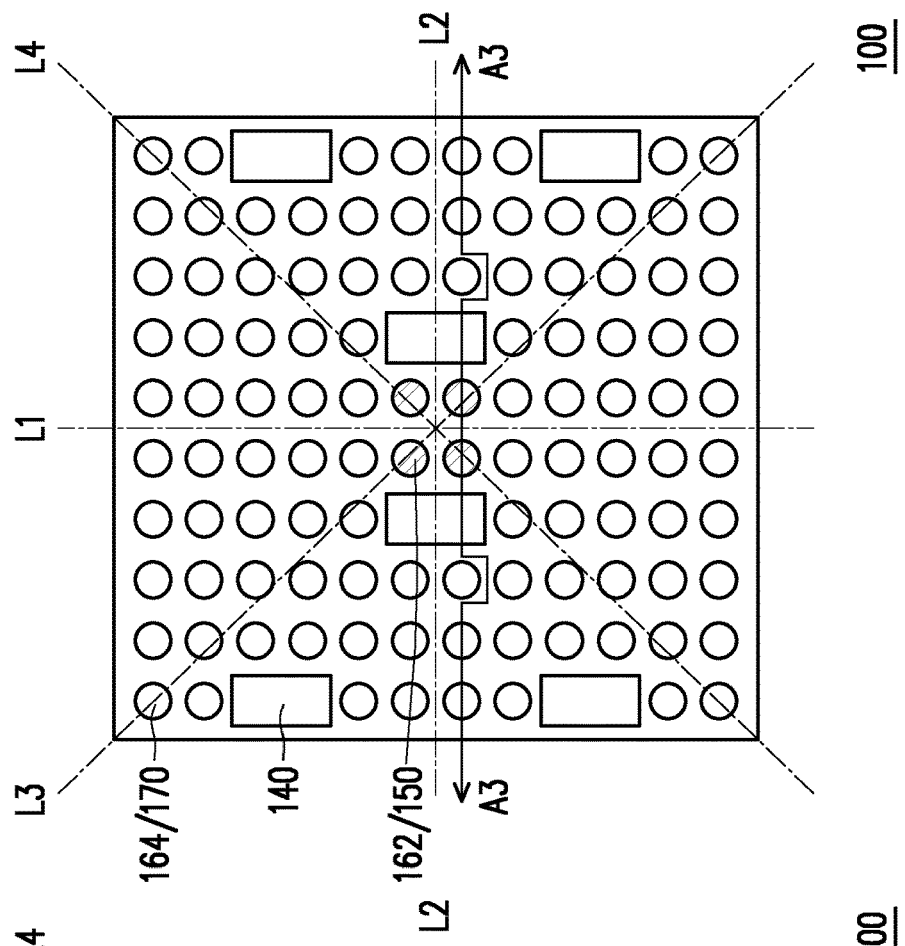
Figure 19A:
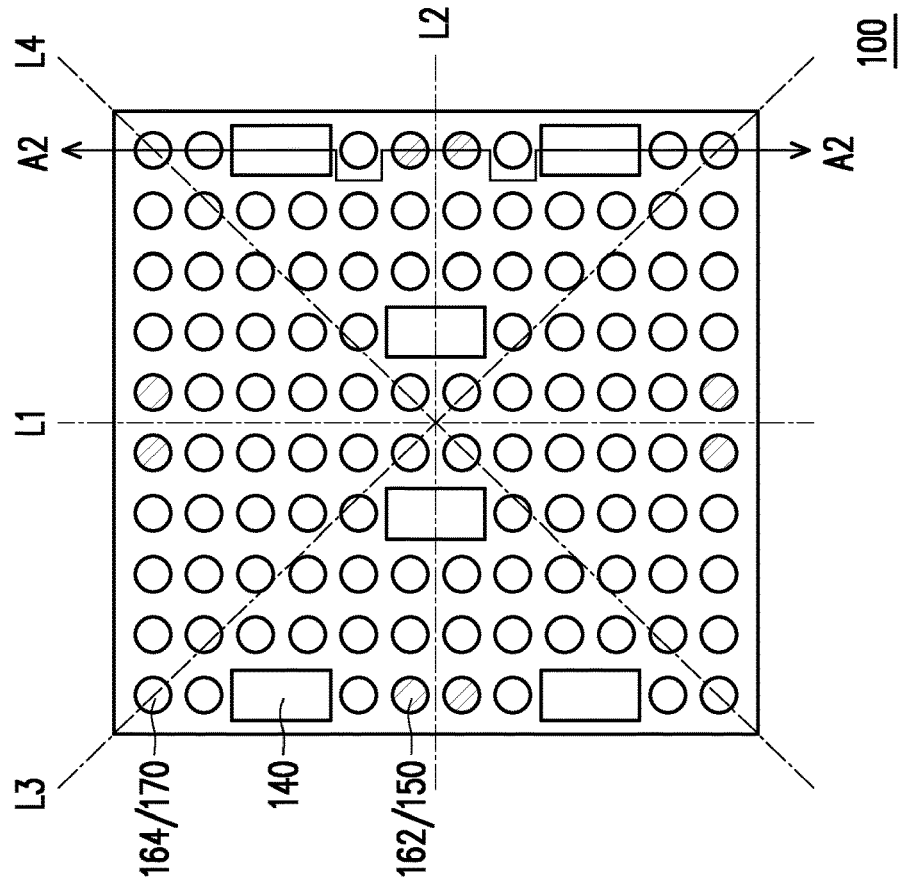

FIG. 19A is similar to FIG. 18, where like reference numbers indicate like elements formed using like processes, except that the flux portions 162 are illustrated as being placed at the center of an edge of the integrated fan-out package 100, in accordance with some embodiments. As shown in FIG. 19A, the flux portions 162 may be positioned on opposite edges of the integrated fan-out package 100 in the middle of the row. Although two flux portions 162 are shown in each edge of the integrated fan-out package 100 in FIG. 19A, the number of the flux portions 162 may be one or more than two based on the demand and design requirement. The flux portions 162 may be positioned at all four edges. Alternatively, the flux portions 162 may be located at a pair of opposite edges only. FIG. 19B is similar to FIG. 18, where like reference numbers indicate like elements formed using like processes, except that the flux portions 162 are illustrated as being placed at the center of the integrated fan-out package 100, in accordance with some embodiments. As shown in FIG. 19B, the flux portions 162 may be positioned in the center of the integrated fan-out package 100 and not along any of the edges of the integrated fan-out package 100. Although four flux portions 162 are shown in center of the integrated fan-out package 100 in FIG. 19B, the number of the flux portions 162 may be one, two, three or more than four based on the demand and design requirement. FIG. 20 illustrates a cross-section view of the integrated fan-out package 100 taken along a line A2-A2 depicted in FIG. 19A and/or a cross-section view of the integrated fan-out package 100 taken along a line A3-A3 in FIG. 19B. FIG. 20 is similar to FIG. 16, and like reference numbers indicate like elements formed using like processes/materials, and thus are not repeated herein.

Figure 21:
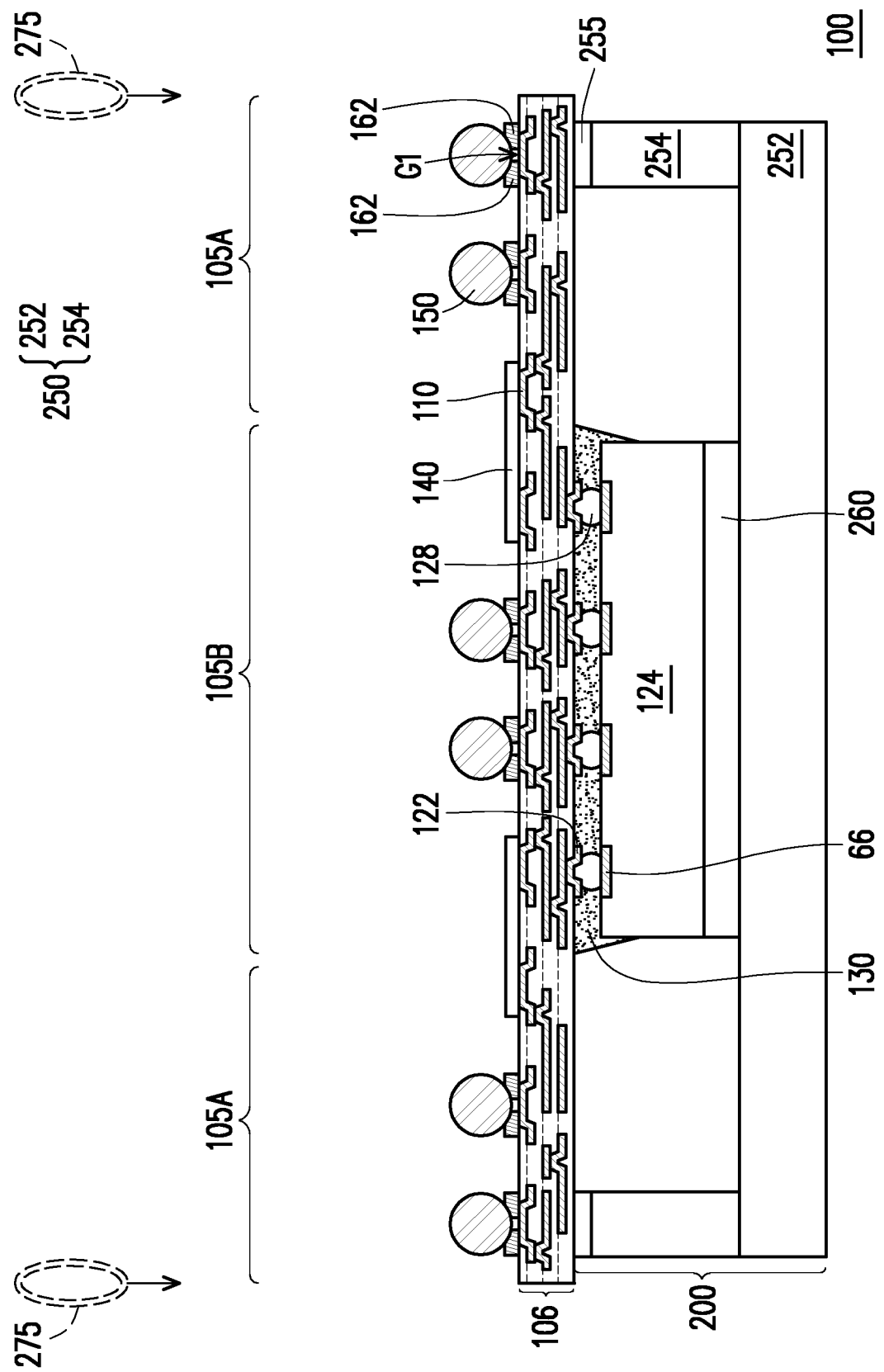

FIG. 19C is similar to FIG. 18, where like reference numbers indicate like elements formed using like processes, except that all of the flux portions 164 may be substituted by the flux portions 162, in accordance with some embodiments. As shown in FIG. 19C, the flux portions 162 may be illustrated as being placed at positions for all of the conductive terminals of the integrated fan-out package 100. For example, the flux portions 162 are positioned at all the connector positions in each and every row and column of the integrated fan-out package 100. The number of the flux portions 162 may be elected and designated based on the demand and design requirement. FIG. 19D is similar to FIG. 18, where like reference numbers indicate like elements formed using like processes, except that all of the flux portions 164 located at the edges are substituted by the flux portions 162, in accordance with some embodiments. As shown in FIG. 19C, the flux portions 162 may be illustrated as being placed at positions for all of the conductive terminals at the edges of the integrated fan-out package 100. For example, the flux portions 162 are positioned to surround the flux portions 164. The number of the flux portions 162 may be elected and designated based on the demand and design requirement. FIG. 21 illustrates a cross-section view of the integrated fan-out package 100 taken along a line A4-A4 depicted in FIG. 19C and/or a cross-section view of the integrated fan-out package 100 taken along a line A5-A5 in FIG. 19D. FIG. 21 is similar to FIG. 16, and like reference numbers indicate like elements formed using like processes/materials, and thus are not repeated herein.

It is appreciated that the flux portions 162 depicted in FIG. 19A through FIG. 19D are symmetric about the central line (e.g., D1, D2, or both of D1 and D2) and/or the diagonal line (e.g., D3, D4, or both of D3 and D4). The layout of the placement of the flux portions 162 from FIG. 18, FIG. 19A, FIG. 19B and FIG. 19D may also be combined, in part or all.

As described above with respect to FIG. 16, an arrangement of the conductive spacers 150 corresponds to an arrangement of the flux portions 162, and an arrangement of the conductive connectors 170 corresponds to an arrangement of the flux portions 164. That is, owing to the flux portions 162, the conductive spacers 150 are applied onto the exposed portions of metallization patterns 110 near corners, edges and/or center of the integrated fan-out package 100; and owing to the flux portions 164, the conductive connectors 170 are applied onto the exposed portions of metallization patterns 110 being remained, see FIG. 18 and FIG. 19A through FIG. 19D. The singulation process 275, such as described above with respect to FIG. 16, may be performed following the formation of the connectors having the conductive spacers 150 and the conductive connectors 170.

Following the placement of the conductive connectors 170 and the conductive spacers 150, the integrated fan-out package 100 may be singulated from any adjacent packages, as shown in FIG. 16. Accordingly, several packages corresponding to the integrated fan-out package 100 may be formed at the same time. A singulation process 275 is performed by sawing along scribe line regions, e.g., between the region corresponding to the integrated fan-out package 100 and regions (corresponding to second packages) adjacent to the integrated fan-out package 100. The sawing singulates the integrated fan-out package 100 from adjacent second packages. However, the disclosure is not limited thereto; in some embodiments, the singulation process 275 is performed after a package substrate 300 (FIG. 22) is coupled to the integrated fan-out package 100 (discussed below).

Figure 22:
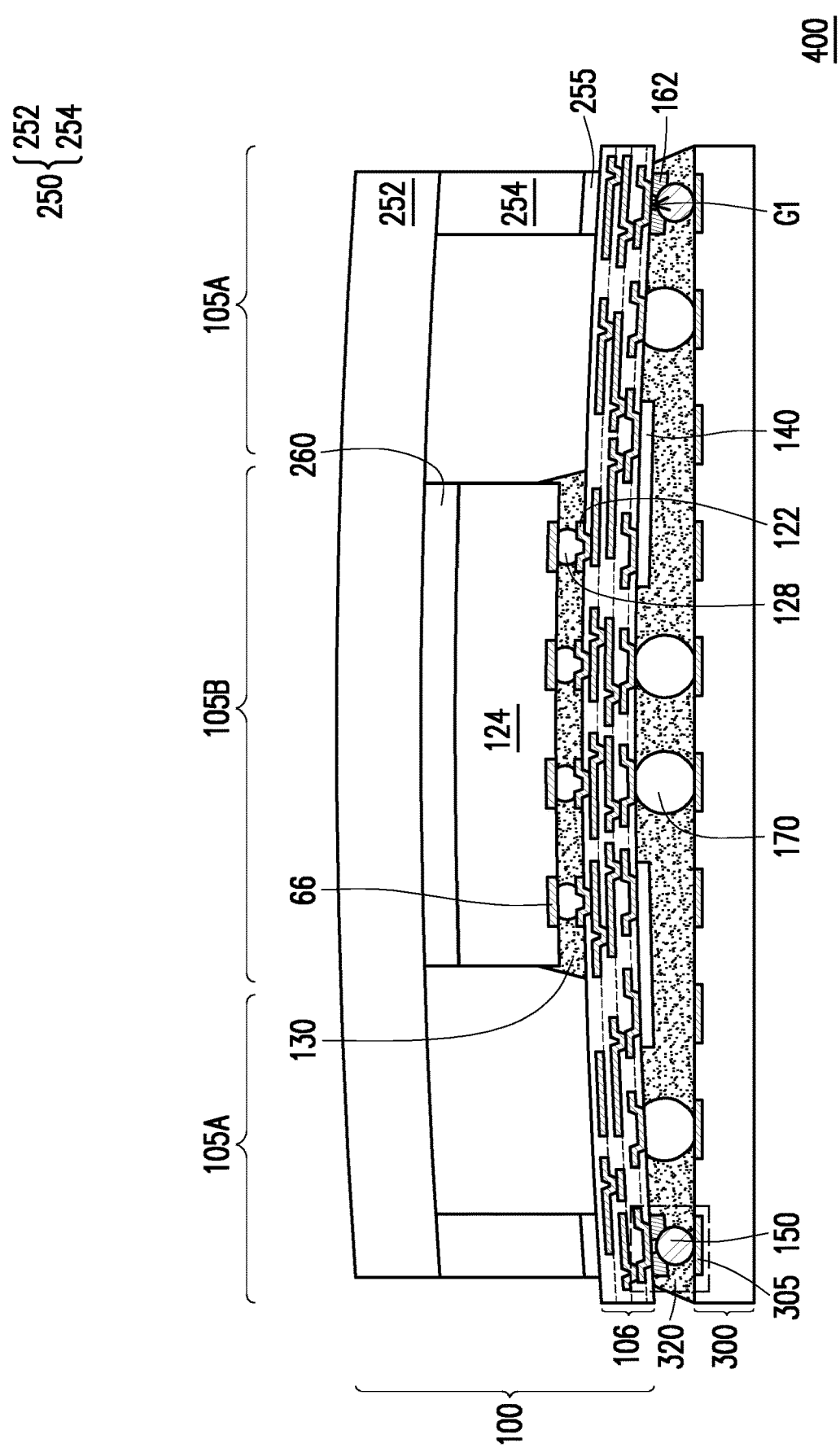
FIG. 22 through FIG. 31B illustrate various intermediate steps in the process of attaching an integrated fan-out package to a package substrate, in accordance with some embodiments.

Referring to FIG. 22, in some embodiments, the integrated fan-out package 100 of FIG. 16 may be mounted to a package substrate 300 using the conductive connectors 170 and the conductive spacers 150 to form a 3D package 400. As illustrated in FIG. 22, the integrated fan-out package 100 has warpage in a crying or frown shape. When the integrated fan-out package 100 is attached to the package substrate 300, the conductive spacers 150 located at the corners of the integrated fan-out package 100 provides a minimum distance between the integrated fan-out package 100 and the package substrate 300 so that the conductive connectors 170 do not expand too much toward each other to cause bridging errors.

The package substrate 300 may be an interposer, a printed circuit board (PCB), another package, and so forth. The package substrate 300 may include active and passive devices (not shown). As one of ordinary skill in the art will recognize, a wide variety of devices such as transistors, capacitors, resistors, combinations of these, and the like may be used to generate the structural and functional requirements of the design for the package substrate 300. The devices may be formed using any suitable methods. The package substrate 300 may be referred to as a (semiconductor) package.

The package substrate 300 may also include a plurality of metallization layers and vias (not shown) and a plurality of contact pads 305 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 300 is substantially free of active and passive devices.

For example, the conductive connectors 170 are reflowed to attach the integrated fan-out package 100 to the contact pads 305 of the package substrate 300. The conductive connectors 170 may electrically and/or physically couple the package substrate 300, including the metallization layers in the package substrate 300, to the redistribution structure 106 of the integrated fan-out package 100. When the conductive connectors 170 are reflowed, a reflow temperature is selected such that the core material of the conductive spacers 150 is not melted, in some embodiments. In the case, the conductive connectors 170 serves as the conductive terminals for electric signal transmission (e.g., to/from the integrated fan-out package 100 of the 3D package 400), power signal transmission (e.g., power source to the integrated fan-out package 100 of the 3D package 400, a ground source to the integrated fan-out package 100 of the 3D package 400, or a combination thereof), or the like.

On the other hand, for example, the conductive spacers 150 are also attached as a conductive connector between the integrated fan-out package 100 and the package substrate 300. The conductive spacer 150 may be any of the spacers 150A, 150B, or 150C (see FIG. 15A, FIG. 15B, and FIG. 15C). The conductive spacer 150 may be interposed between the integrated fan-out package 100 and the package substrate 300, which may physically and electrically couple the metallization pattern 110 of the integrated fan-out package 100 to the contact pad 305 of the package substrate 300. In the case, the conductive spacers 150 serves as supporting structures for mechanical supports between the integrated fan-out package 100 and the package substrate 300. In addition, the conductive spacers 150 can also serves as a role similar to or substantially identical to the conductive connectors 170, if needed.

In some embodiments, an underfill 320 may be formed between the integrated fan-out package 100 and the package substrate 300 and surrounding the conductive connectors 170 and the conductive spacers 150. The underfill 320 may be formed by a capillary flow process after the integrated fan-out package 100 is attached to the package substrate 300, or may be formed by a suitable deposition method before the integrated fan-out package 100 is attached to the package substrate 300. In such embodiments, the underfill 320 may be formed using processes and materials similar to the underfill 130, and thus is not repeated herein for brevity. Owing to the underfill 320, the adhesion between the integrated fan-out package 100 and the package substrate 300 is ensured.

In some embodiments, the gap G1 is completely filled with the underfill 320. In alternative embodiments, the gap G1 is partially filled with the underfill 320 and includes an air cavity therein. In further alternative embodiments, no underfill 320 is in the gap G1, where the gap G1 is an air cavity.

Figure 23:
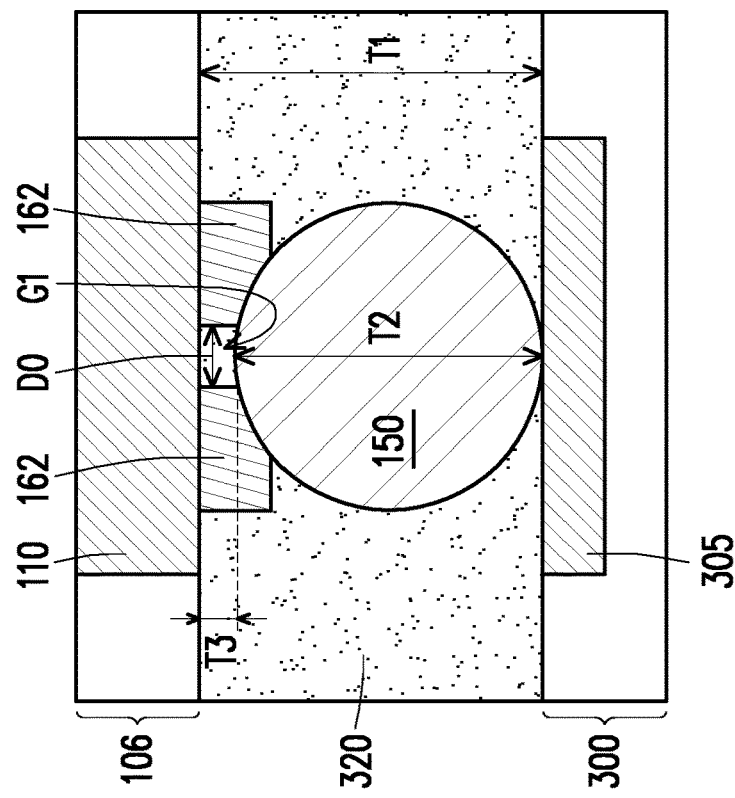
Figure 28:
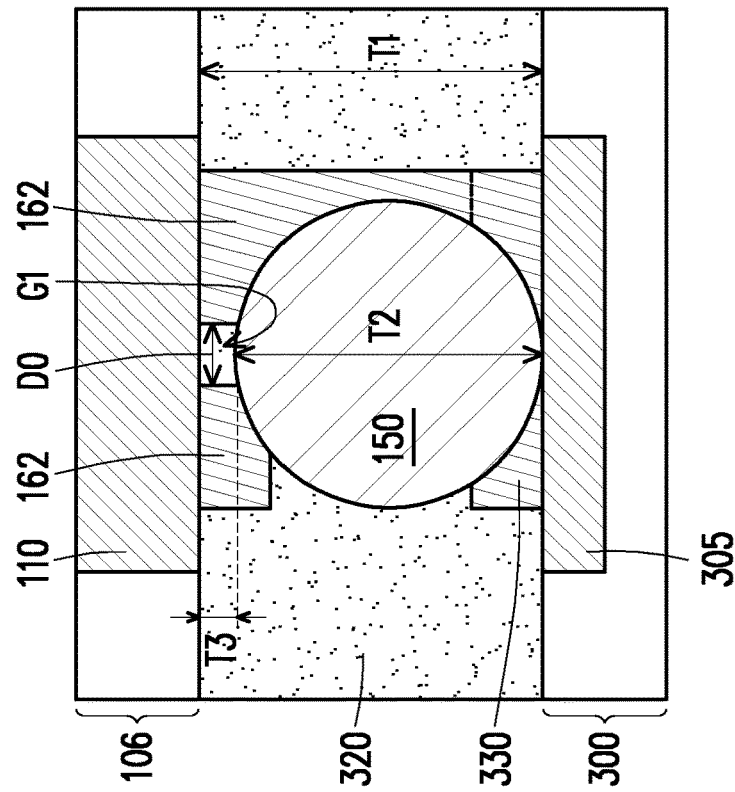
Figure 29:
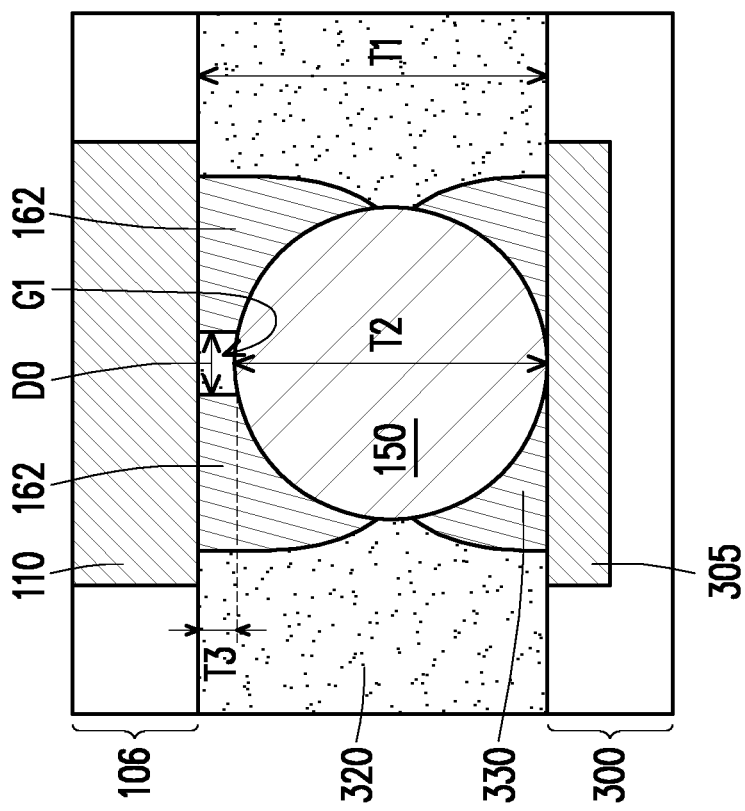

The dashed box in FIG. 22 is magnified and illustrated in greater detail in FIG. 23 and FIG. 29. In FIG. 23 through FIG. 29, a close up of one conductive spacer 150 is illustrated, in accordance with some embodiments (see the dashed box of FIG. 22).

As illustrated in FIG. 23, for example, the flux portion 162 is in direct (or physical) contact with the conductive spacer 150 and the metallization patterns 110, and thus physically and electrically couples the conductive spacer 150 and the metallization patterns 110. In the case, the conductive spacer 150 is in direct (or physical) contact with the contact pad 305 and the flux portion 162, and thus physically and electrically couples the contact pad 305 and the flux portion 162. A distance T1 between an illustrated bottom surface of the metallization patterns 110 of the integrated fan-out package 100 and an illustrated top surface of the contact pad 305 of the package substrate 300 may be between about 100 μm and about 600 μm, though other values are contemplated and may be used. For example, the conductive spacer 150 is separated from the illustrated bottom surface of the metallization patterns 110 by a distance T3 between about 0 μm and about 150 μm, though other values are contemplated and may be used. For example, the distance T3 is greater than 0 μm and less than or substantially equal to about 150 μm. In the case, a size T2 of the conductive spacer 150 is between about 100 μm and about 500 μm, though other values are contemplated and may be used. As illustrated in FIG. 23, the flux portion 162 may cover a portion of the conductive spacer 150, e.g., a portion of a sidewall surrounding (and near to) an illustrated top end of the conductive spacer 150 which being exposed by the gap G1. In some embodiments, the illustrated top end, an illustrated bottom end (opposing to the illustrated top end), and other portion of the sidewall of the conductive spacer 150 may be exposed from the flux portion 162, where the flux portion 162 is free from the package substrate 300. The flux portion 162 may include a planar outer sidewall which not being in (direct or physically) contact with the sidewall of the conductive spacer 150, in FIG. 23. In some embodiment, the other portion of the sidewall of the conductive spacer 150 exposed by the flux portion 162 is further covered by the underfill 320.

Figure 24:
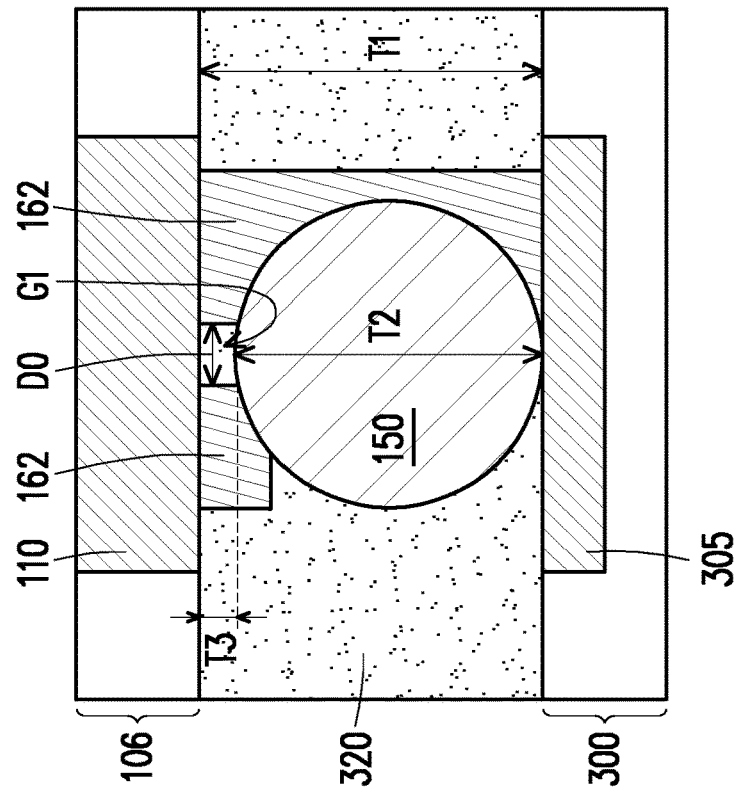

FIG. 24 is similar to FIG. 23, where like reference numbers indicate like elements formed using like processes, except that the flux portions 162 is illustrated as being in contact with the package substrate 300, in accordance with some embodiments. As shown in FIG. 24, the flux portion 162 may further partially extend to span across the sidewall of the conductive spacer 150 from the integrated fan-out package 100 towards the package substrate 300, so that the flux portion 162 is in physical contact with the contact pad 305 of the package substrate 300. Owing to the extended portion of the flux portion 162, the bonding between the conductive spacer 150 and the contact pad 305 is further enhanced. As illustrated in FIG. 24, the illustrated top end, the illustrated bottom end, and a portion of the sidewall of the conductive spacer 150 may be exposed from the flux portion 162. The flux portion 162 may include a planar outer sidewall which not being in (direct or physically) contact with the sidewall of the conductive spacer 150, in FIG. 24. In some embodiment, the portion of the sidewall of the conductive spacer 150 exposed by the flux portion 162 is further covered by the underfill 320.

Figure 25:
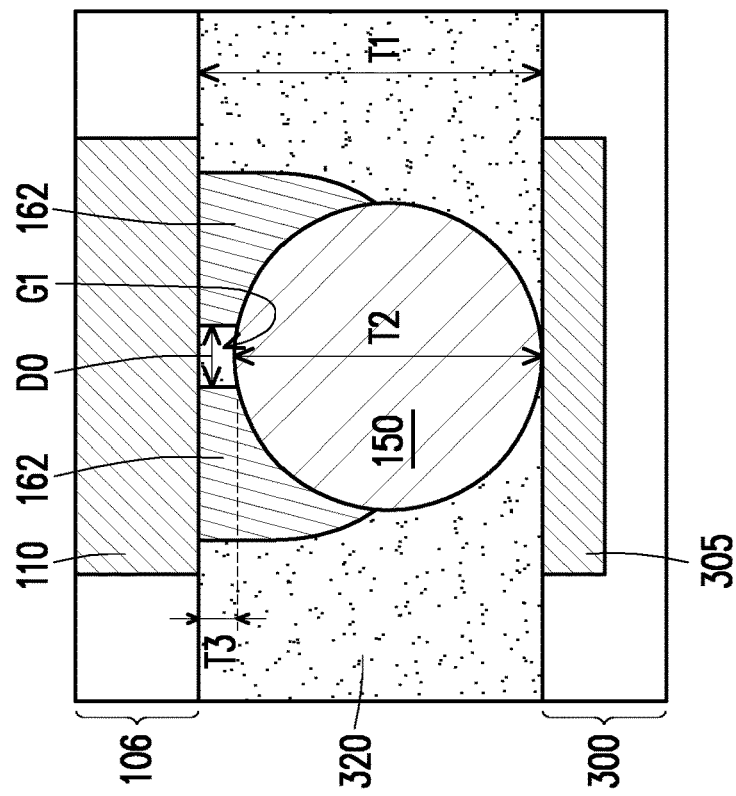

FIG. 25 is similar to FIG. 23, where like reference numbers indicate like elements formed using like processes, except that the flux portions 162 is illustrated as having a curved outer sidewall, in accordance with some embodiments. As shown in FIG. 25, the flux portion 162 may further extend on the sidewall of the conductive spacer 150 from the integrated fan-out package 100 towards the package substrate 300 with a decreased thickness, where the flux portions 162 has the curved outer sidewall being in direct (or physical) contact with the sidewall of the conductive spacer 150. Owing to the extended portion of the flux portion 162, the bonding between the conductive spacer 150 and the contact pad 305 is further enhanced. As illustrated in FIG. 25, the illustrated top end, the illustrated bottom end, and a portion of the sidewall of the conductive spacer 150 may be exposed from the flux portion 162. In some embodiment, the portion of the sidewall of the conductive spacer 150 exposed by the flux portion 162 is further covered by the underfill 320.

Figure 26:
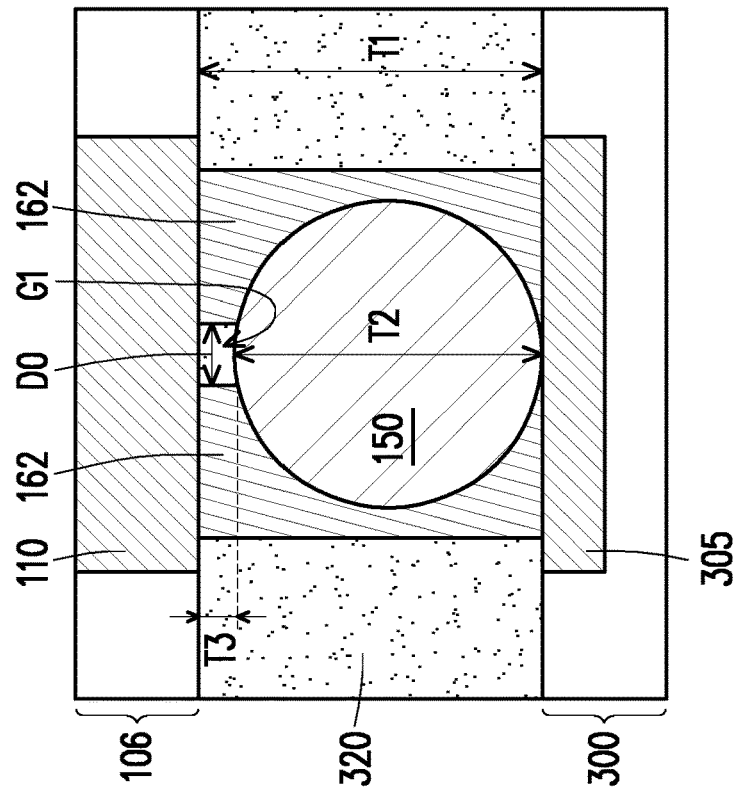

FIG. 26 is similar to FIG. 23, where like reference numbers indicate like elements formed using like processes, except that the flux portions 162 is illustrated as completely encapsulating the sidewall of the conductive spacer 150, in accordance with some embodiments. As shown in FIG. 26, the flux portion 162 may further extend to entirely span across the sidewall of the conductive spacer 150 from the integrated fan-out package 100 towards the package substrate 300, so that the flux portion 162 is in physical contact with the contact pad 305 of the package substrate 300. Owing to the extended portion of the flux portion 162, the bonding between the conductive spacer 150 and the contact pad 305 is further enhanced. As illustrated in FIG. 26, the conductive spacer 150 is embedded in the flux portion 162, except that the illustrated top end and the illustrated bottom end of the conductive spacer 150 are exposed from the flux portion 162, for example. In some embodiment, the sidewall of the conductive spacer 150 is completed separated from the underfill 320 by the flux portion 162.

In some embodiments, a solder material (e.g., a flux portion 330 of FIG. 27, FIG. 28 and FIG. 29) such as a solder paste or solder pad may be deposited or plated over the contact pad 305 of the package substrate 300, in some alternative embodiments, for further enhancing the bonding between the conductive spacer 150 and the contact pad 305. The solder material can be reflowed during ball mounting to attach the conductive spacers 150 and the conductive connectors 170. In the case, with a vertical alignment, some of the flux portions 330 are melt with the flux portions 164 and the solder balls (if any) to together form the conductive connectors 170 during the reflowing.

Figure 27:
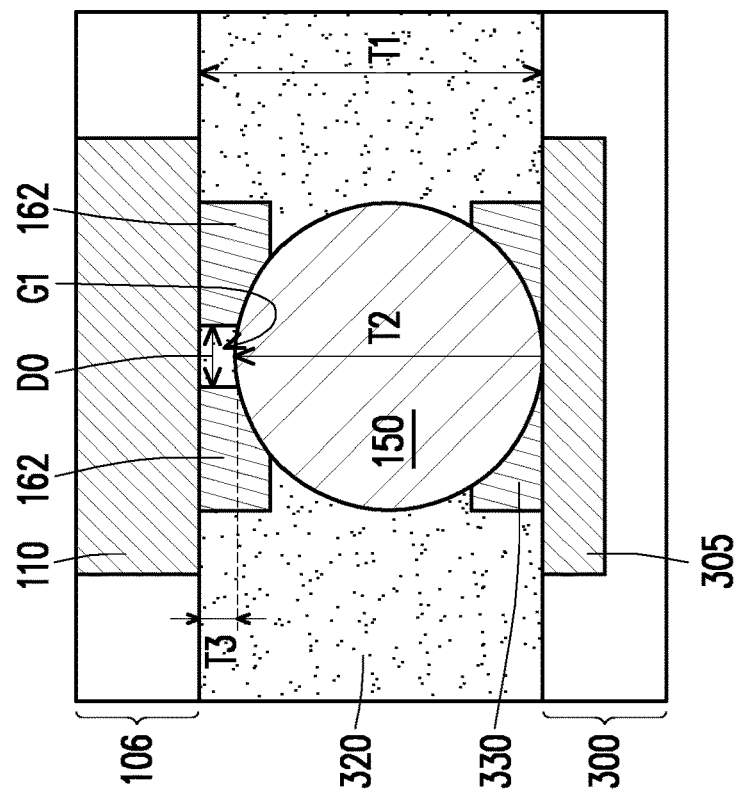

FIG. 27 is similar to FIG. 23, where like reference numbers indicate like elements formed using like processes, except that a flux portion 330 is additionally disposed between the conductive spacer 150 and the contact pad 305 of the package substrate 300, in accordance with some alternative embodiments. As shown in FIG. 27, the flux portion 162 may be in physical contact with the conductive spacer 150 and the metallization patterns 110 and cover a portion of the sidewall of the conductive spacer 150 surrounding (and near to) the illustrated top end thereof, and the flux portion 330 may be in physical contact with the conductive spacer 150 and cover a portion of the sidewall of the conductive spacer 150 surrounding (and near to) the illustrated bottom end thereof. In the case, the conductive spacer 150 is electrically coupled to the metallization patterns 110 of the integrated fan-out package 100 through the flux portion 162, and is electrically coupled to the contact pad 302 of the package substrate 300 through direct contact. Owing to the configuration, the integrated fan-out package 100 is electrically and physically coupled to the package substrate 300.

As illustrated in FIG. 27, the flux portion 162 may cover a portion of the conductive spacer 150, e.g., a portion of the sidewall surrounding (and near to) the illustrated top end of the conductive spacer 150 which being exposed by the gap G1. On the other hand, the flux portion 330 may cover another portion of the conductive spacer 150, e.g., another portion of the sidewall surrounding (and near to) the illustrated bottom end of the conductive spacer 150 which being in direct contact with the contact pad 305. In some embodiments, the illustrated top end, the illustrated bottom end, and other portion of the sidewall of the conductive spacer 150 may be exposed from the flux portions 162 and 330, where the flux portion 162 is free from the package substrate 300 and the flux portion 330 is free form the integrated fan-out package 100. In other words, the flux portion 162 is distant apart from the flux portion 330. The flux portions 162 and 330 may include a planar outer sidewall which not being in (direct or physically) contact with the sidewall of the conductive spacer 150, in FIG. 27. In some embodiment, the other portion of the sidewall of the conductive spacer 150 exposed by the flux portions 162 and 330 is further covered by the underfill 320. Owing to the flux portion 330, the bonding between the conductive spacer 150 and the contact pad 305 is further enhanced.

FIG. 28 is similar to FIG. 27, where like reference numbers indicate like elements formed using like processes, except that the flux portions 162 is illustrated as being in contact with the flux portion 330, in accordance with some embodiments. As shown in FIG. 28, the flux portion 162 may further partially extend to span across the sidewall of the conductive spacer 150 from the integrated fan-out package 100 towards the package substrate 300, so that the flux portion 162 is in physical contact with the flux portion 330 disposed on the contact pad 305 of the package substrate 300. Owing to the extended portion of the flux portion 162, the bonding between the conductive spacer 150 and the contact pad 305 is further enhanced. As illustrated in FIG. 28, the illustrated top end, the illustrated bottom end, and a portion of the sidewall of the conductive spacer 150 may be exposed from the flux portions 162 and 330. The flux portions 162 and 330 may include a planar outer sidewall which not being in (direct or physically) contact with the sidewall of the conductive spacer 150, in FIG. 28. In some embodiment, the portion of the sidewall of the conductive spacer 150 exposed by the flux portions 162 and 330 is further covered by the underfill 320.

FIG. 29 is similar to FIG. 27, where like reference numbers indicate like elements formed using like processes, except that the flux portions 162 and 330 are illustrated as having a curved outer sidewall, in accordance with some embodiments. As shown in FIG. 29, the flux portion 330 may further extend on the sidewall of the conductive spacer 150 from the package substrate 300 towards the integrated fan-out package 100 with a decreased thickness, where the flux portions 330 has the curved outer sidewall being in direct (or physical) contact with the sidewall of the conductive spacer 150. In the case, the flux portion 162 may further extend on the sidewall of the conductive spacer 150 from the integrated fan-out package 100 towards the package substrate 300 with a decreased thickness, where the flux portions 162 has the curved outer sidewall being in direct (or physical) contact with the sidewall of the conductive spacer 150. Owing to the extended portion of the flux portions 162 and 330, the bonding between the conductive spacer 150 and the contact pad 305 is further enhanced. As illustrated in FIG. 29, the illustrated top end, the illustrated bottom end, and a portion of the sidewall of the conductive spacer 150 may be exposed from the flux portions 162 and 330. In some embodiment, the portion of the sidewall of the conductive spacer 150 exposed by the flux portions 162 and 300 is further covered by the underfill 320. In the case, the flux portion 162 is distant apart from the flux portion 330. Alternatively, the flux portion 162 may be connected to the flux portion 330.

Although is not shown, a portion of the flux portion 330 (e.g., FIG. 27 through FIG. 29) may be presented between the illustrated bottom end of the conductive spacer 150 and the contact pad 305 for electrically and physically coupling therebetween. For example, a thickness of the portion of the flux portion 330 being presented between (e.g. sandwiched between) the illustrated bottom end of the conductive spacer 150 and the illustrated top surface of the contact pad 305 is between about 100 μm and about 600 μm. In addition, a flux portion 330 may be presented between the illustrated bottom end of the conductive spacer 150 and the contact pad 305 (of FIG. 26) for electrically and physically coupling therebetween, as well. The conductive spacer 150 may be equally distant from the metallization pattern 110 and the contact pad 305 or may be vertically closer to the metallization pattern 110 or vertically closer to the contact pad 305.

In some embodiments, the solder material for the flux portion 330 may be provided on the contact pad 305, for example, by an electroplated solder material, a printed solder paste, a solder pad, and so forth. For example, the flux portion 330 is formed using processes and materials similar to the flux portion 164. Alternatively, the solder material for the flux portion 330 may come from the conductive spacer 150. For example, where the conductive spacer 150 has multiple layers, such as described above with respect to the conductive spacer 150B and 150C, an outer layer of the conductive spacer 150 may include a solder material. In the case, when the solder material of the outer layer of the conductive spacer 150 is reflowed at the same time the conductive connectors 170 are reflowed, the flux portion 330 may be formed.

In some embodiments, owing to the higher melting temperature of the conductive spacers 150 as compared with the conductive connectors 170, the flux portions 162, and the flux portion 300 (if any), the conductive spacers 150 sandwiched between the integrated fan-out package 100 and the package substrate 300 is considered as non-deformable during the reflowing for bonding the integrated fan-out package 100 and the package substrate 300. And thus, the minimum distance between the integrated fan-out package 100 and the package substrate 300 can be achieved to prevent any bridging between adjacent conductive connectors 170.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 30:
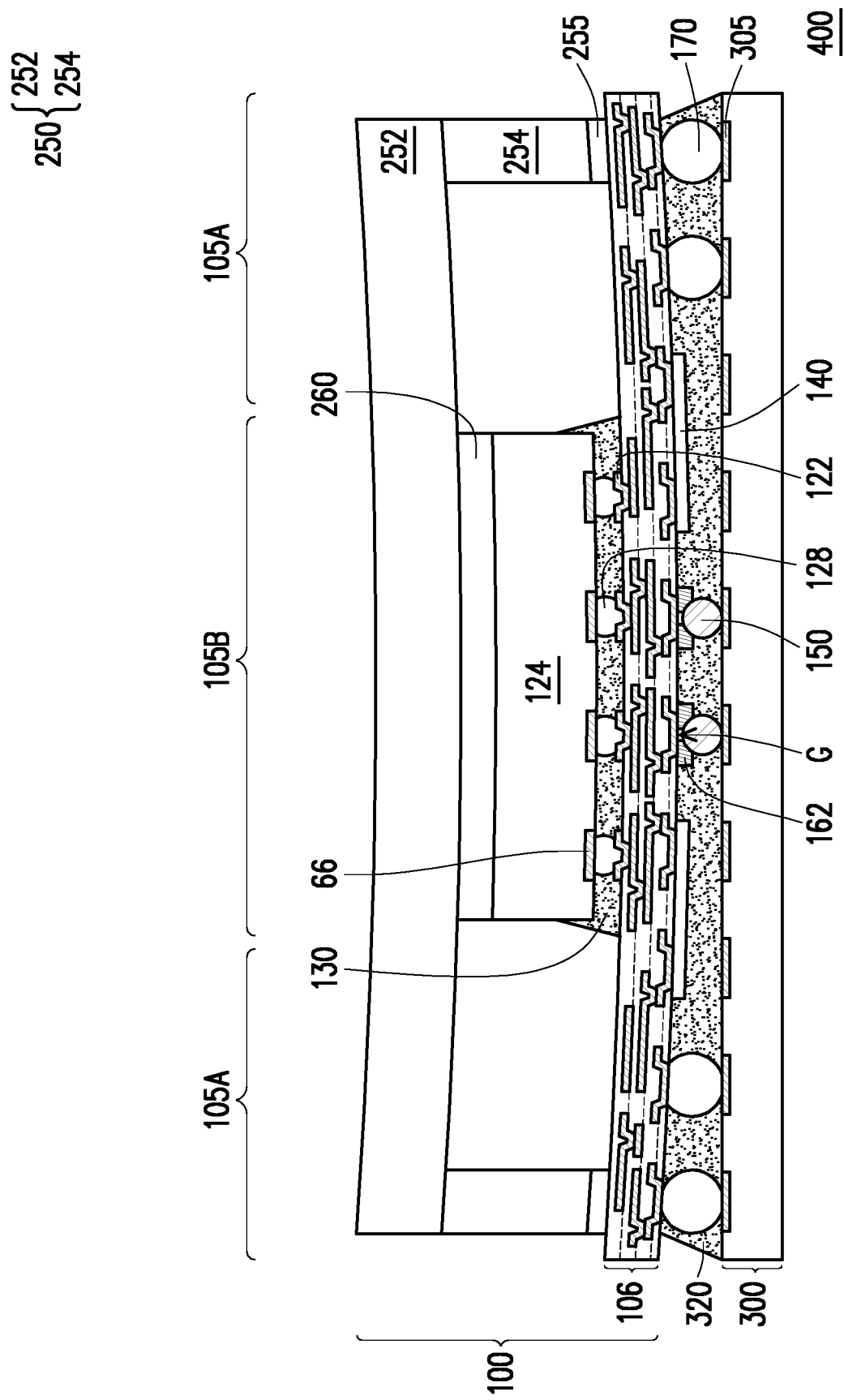

Referring to FIG. 30, in some embodiments, the integrated fan-out package 100 of FIG. 20 may be mounted to a package substrate 300 using conductive connectors 170 and the conductive spacers 150 to form a 3D package 400. As illustrated in FIG. 30, the integrated fan-out package 100 has warpage in a smile shape. When the integrated fan-out package 100 is attached to the package substrate 300, the conductive spacers 150 located at the middle of the edge of the integrated fan-out package 100 (see FIG. 19A) or at the middle of the integrated fan-out package 100 (see FIG. 19B) provides a minimum distance between the integrated fan-out package 100 and the package substrate 300 so that the conductive connectors 170 do not expand too much toward each other to cause bridging errors.

Figure 31A:
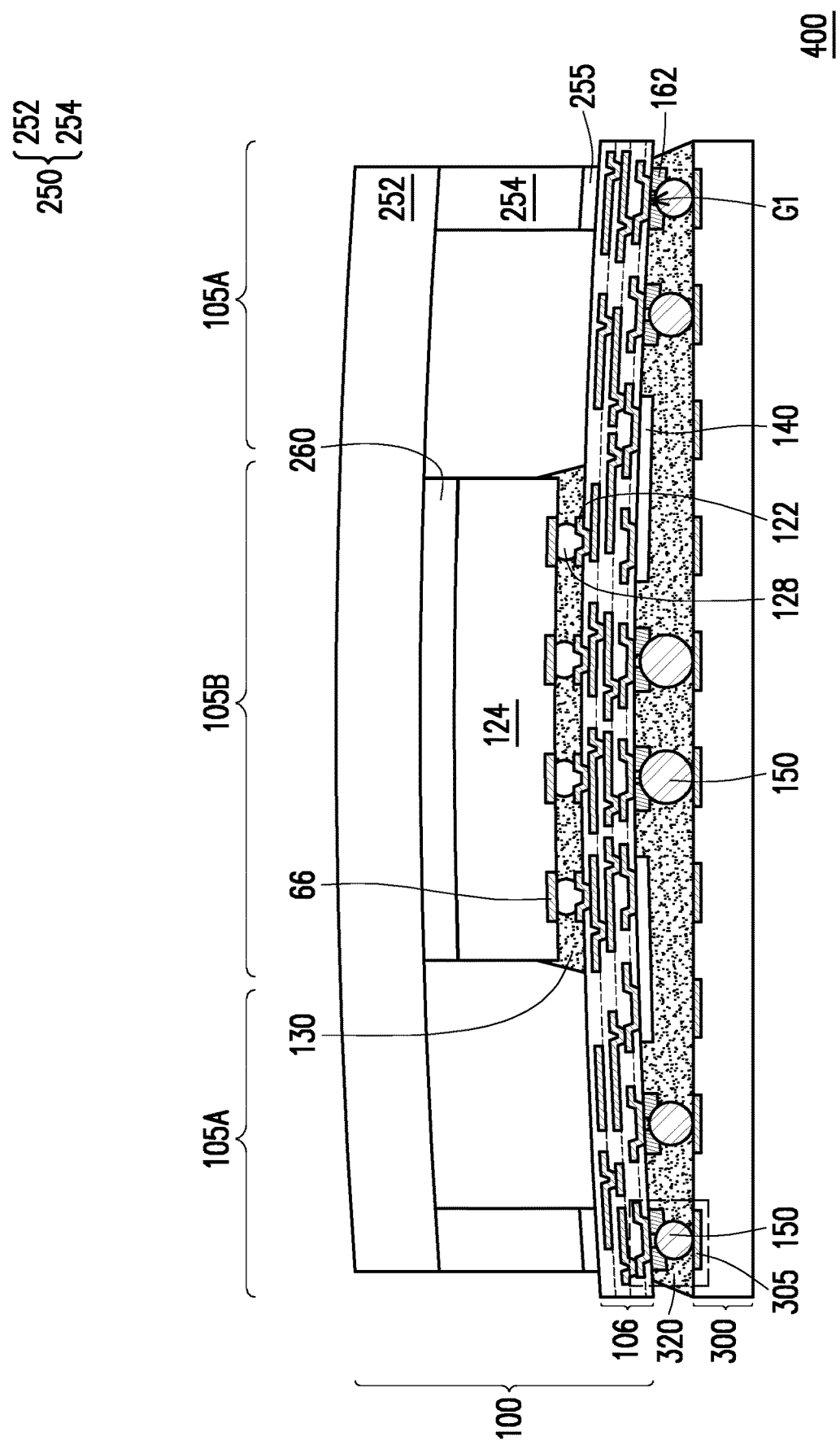
Figure 31B:
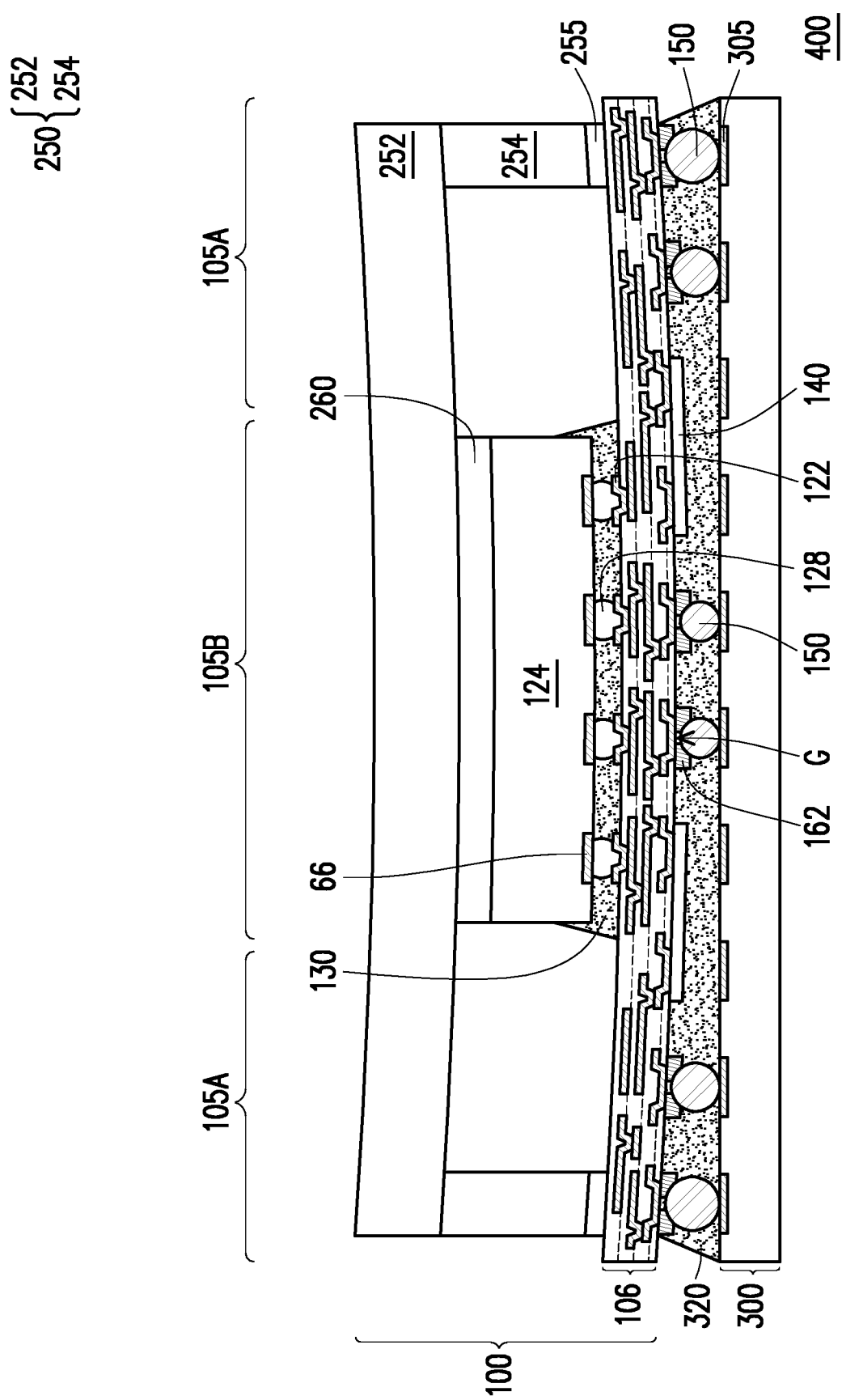

Referring to either FIG. 31A or FIG. 31B, in some embodiments, the integrated fan-out package 100 of FIG. 21 may be mounted to a package substrate 300 using the conductive spacers 150 (and the conductive connectors 170, in some embodiments) to form a 3D package 400. As illustrated in FIG. 31A, the integrated fan-out package 100 may have a warpage in a crying or frown shape. On the other hand, as illustrated in FIG. 31B, the integrated fan-out package 100 may have a warpage in a smiling shape. When the integrated fan-out package 100 is attached to the package substrate 300, the conductive spacers 150 located at each of the connector positions of the integrated fan-out package 100 (see FIG. 19C) or along each edge of the integrated fan-out package 100 (see FIG. 19D) provides a minimum distance between the integrated fan-out package 100 and the package substrate 300, so that conductive connectors 170 are prevented from expanding too much toward each other which would cause bridging errors. As illustrated in FIG. 31A and FIG. 31B, a dimension (e.g., a vertical size as measured along the stacking direction) of the conductive spacers 150 positioned in different locations may be different from each other. In the case, the conductive spacers 150 being symmetrically arranged have the same dimension.

Figure 32C:
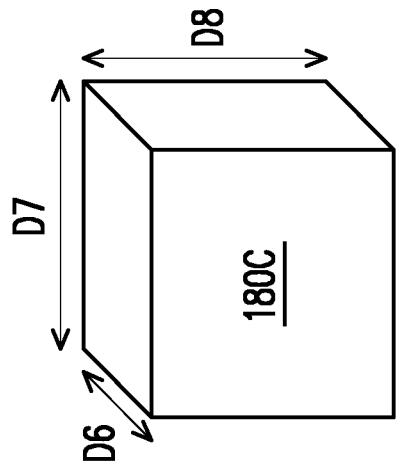
FIG. 32A through FIG. 36 are schematic cross-sectional views respectively illustrating an integrated fan-out package, in accordance with some alternative embodiments.
Figure 32B:
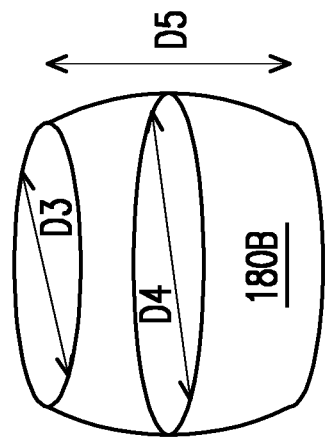
Figure 32A:
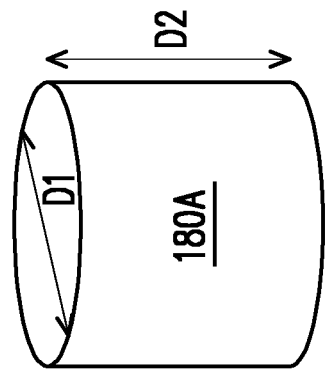

As shown in above embodiments, the conductive spacers, such as the conductive spacers 150, include a spherical shape. However, the disclosure is not limited thereto. FIG. 32A, FIG. 32B, and FIG. 32C illustrate conductive spacers 180A, 180B, and 180C (in general, referred to as conductive spacers 180, see FIG. 33) may be in form of column, blocks, studs, bumps, pillars, or the like, in accordance with other embodiments. Conductive spacers 180 maybe formed in different shapes.

For example, in FIG. 32A, a conductive spacer 180A is a column; in FIG. 32B, a conductive spacer 180B is a squashed column or expanded column; and in FIG. 32C, a conductive spacer 180C is a cube or rectangular prism. Other prisms and shapes are contemplated. Conductive spacers 180 have a flat top end (e.g., a flat upper surface) and a flat bottom end (e.g., a flat lower surface) so that they can be placed using a pick and place process. The dimensions of the conductive spacers 180A, 180B, or 180C may vary. Each of the dimensions illustrated in FIG. 32A, FIG. 32B, and FIG. 32C may be any suitable dimensions. The dimension D1 is the diameter of the conductive spacer 180A, and the dimension D2 is the height of the conductive spacer 180A. The dimension D3 is the diameter of the conductive spacer 180B at an upper surface of conductive spacer 180B. The dimension D4 is the diameter of the conductive spacer 180B at a center or fattest part of the conductive spacer 180B. The dimension D5 is the height of the conductive spacer 180B. The dimensions D6 and D7 are the depth and width, respectively, of the conductive spacer 180C, and the dimension D8 is the height of the conductive spacer 180C. In some embodiments, each of the dimensions DE D2, D3, D4, D5, D6, D7, and D8 may be in a range of about 100 µm and about 500 µm, such as about 200 µm. Each of the dimensions DE D2, D3 or D4, D5, D6, D7, and D8 may each be different from each other or may be the same, or may be a combination of different dimensions and the same dimensions. As illustrated in FIG. 32B, however, the dimension D4 is greater than D3. In another embodiment, the dimension D4 may be less than the dimension D3 and the resulting shape is a narrowed column or hour glass shape. In one embodiment, the conductive spacer 180B can be combined with the conductive spacer 180C to provide a conductive spacer 180 that bulges at the middle.

The material of the conductive spacers 180 may include any suitable material such as a metal (e.g., copper, silver, aluminum, gold, nickel, lead, bismuth, indium, etc.) or a metal alloy. Similar to the conductive spacers 150, the material of the conductive spacers 180 should be selected so that it has a higher melting point temperature over the reflow temperature of the other standard conductive connectors (e.g. the conductive connectors 170) and the reflow temperature of the flux portions 162 and 164. In some embodiments, the conductive spacers 180 (e.g., 180A, 180B, and/or 180C) may independently be coated with one or more than one coating layer, similar to that described above with respect to the conductive spacer 150B and/or spacer 150C of FIG. 15B and FIG. 15C, respectively.

Figure 33:
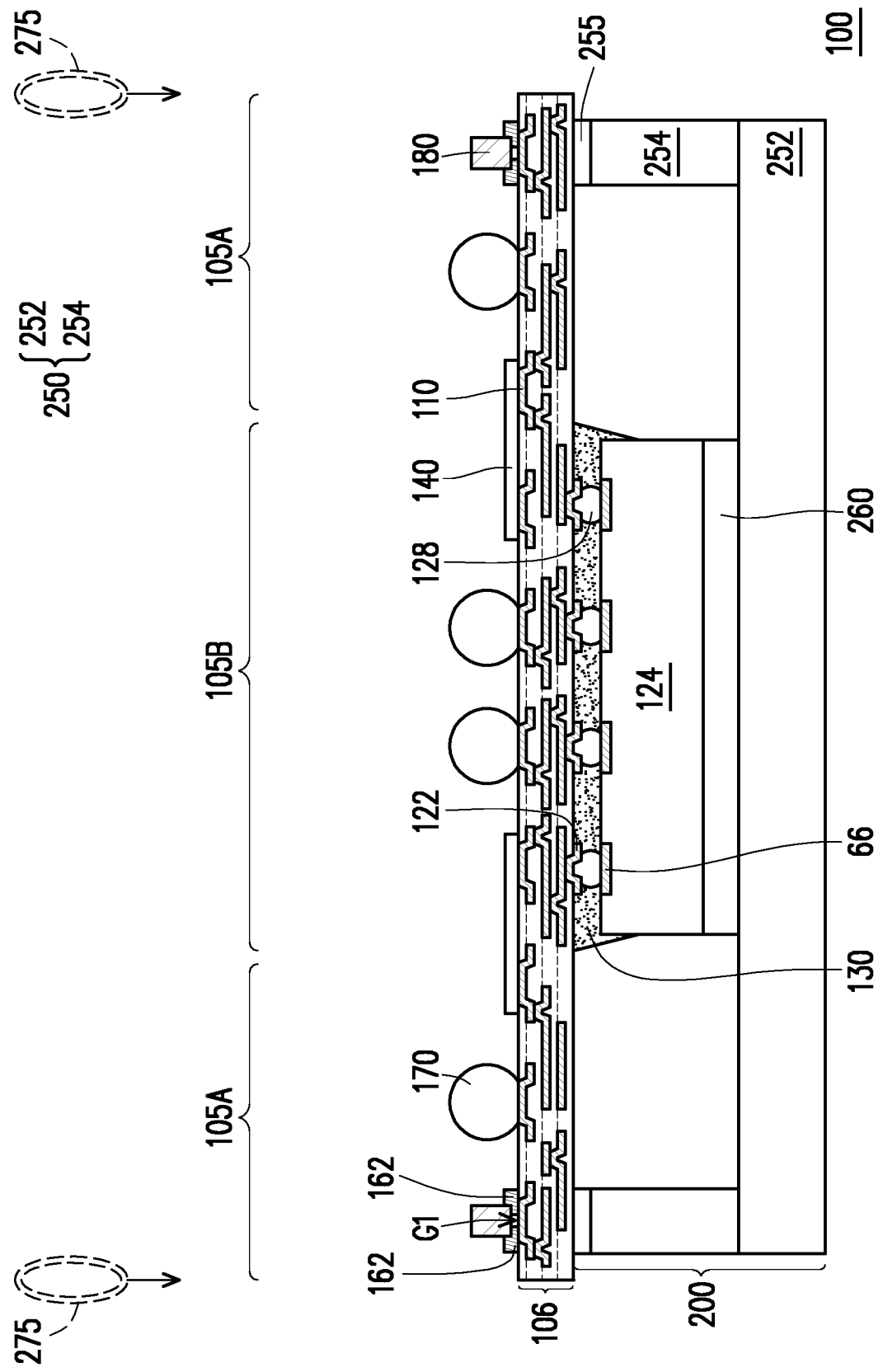

For example, the integrated fan-out package 100 of FIG. 33 is similar to the integrated fan-out package 100 of FIG. 16, except that the conductive spacers 150 are substituted by the conductive spacers 180. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. As shown in FIG. 33, the conductive spacers 180 may be placed at the corners of the integrated fan-out package 100 where the flux portions 162 are formed at. The conductive connectors 170 are placed in the remaining connecting positions (where the flux portions 164 are formed at). The singulation process 275, such as described above with respect to FIG. 16, may be performed following the formation of the conductive spacers 180 and conductive connectors 170. A top down view of the integrated fan-out package 100 of FIG. 33 (not shown) is similar to the top down view of the integrated fan-out package 100 of FIG. 16 (which is depicted in FIG. 18), where the conductive spacers 180 positioned at corners of the integrated fan-out package 100 and the conductive connectors 170 positioned in the other connector positions.

Figure 34B:
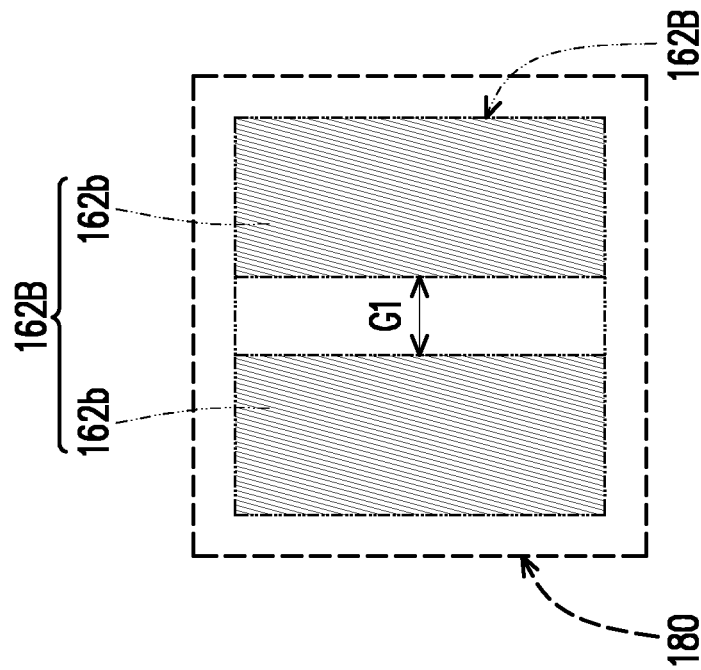
Figure 34A:
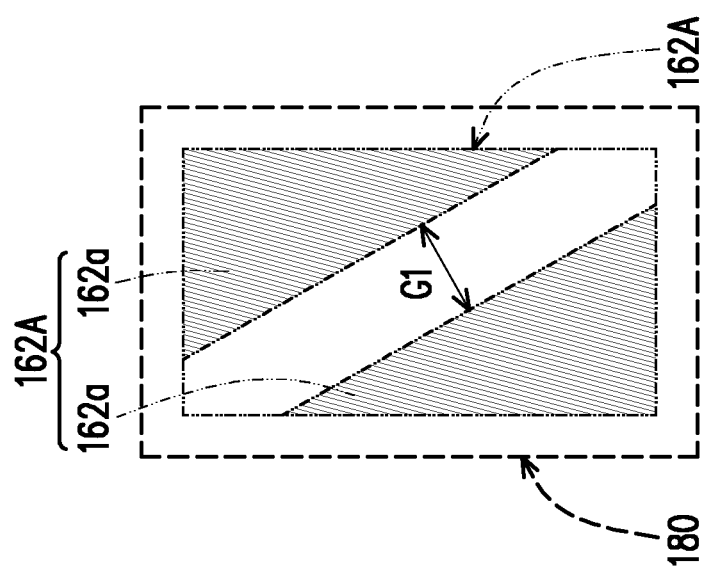
Figure 34D:
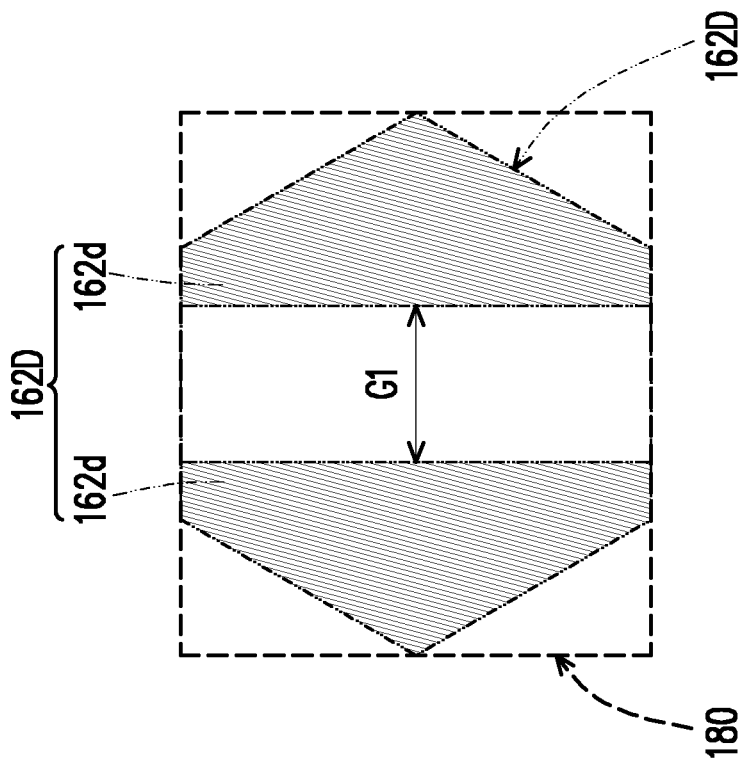
Figure 34C:
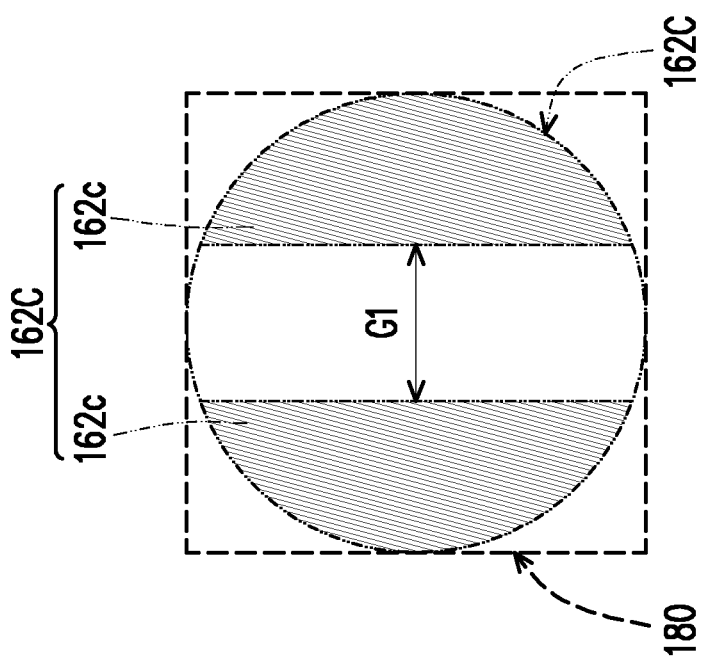
Figure 34F:
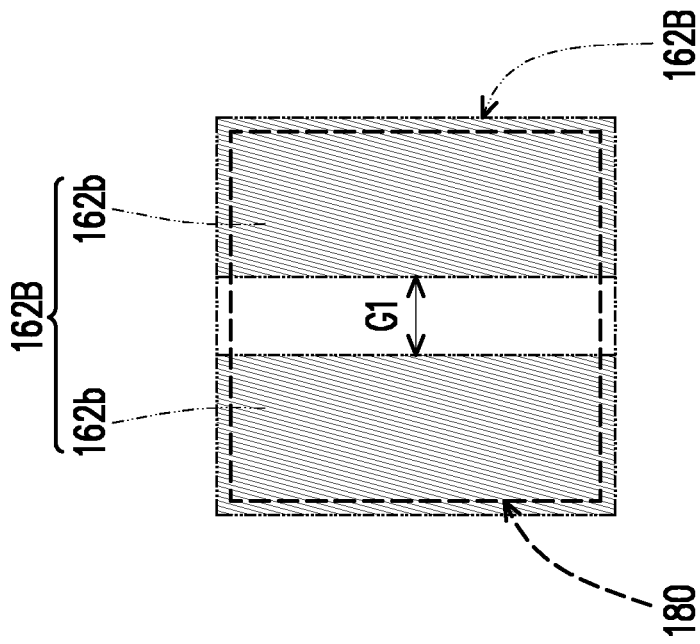
Figure 34E:
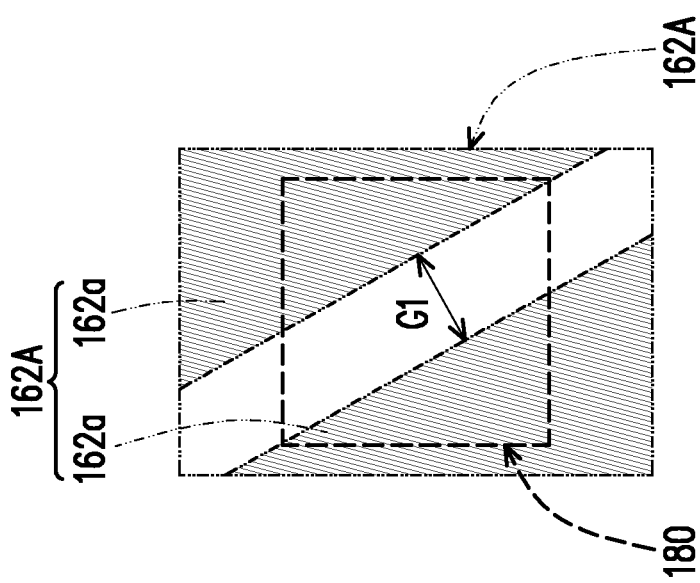
Figure 34H:
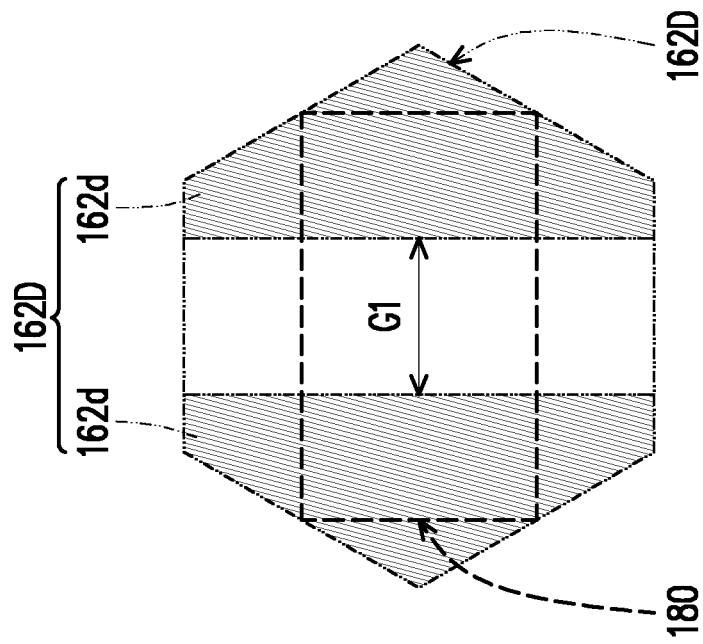
Figure 34G:
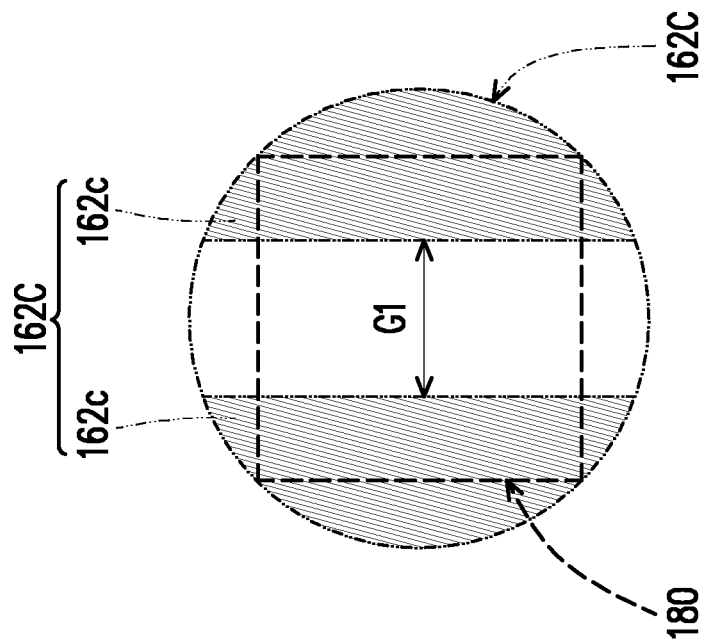

In the plane view of FIG. 34A, one conductive spacer 180 may disposed on the flux portion 162A and across the two sub-portions 162a, where the conductive spacer 180 may be overlapped with the gap G1. In the plane view of FIG. 34B, one conductive spacer 180 may disposed on the flux portion 162B and across the two sub-portions 162b, where the conductive spacer 180 may be overlapped with the gap G1. In the plane view of FIG. 34C, one conductive spacer 180 may disposed on the flux portion 162C and across the two sub-portions 162c, where the conductive spacer 180 may be overlapped with the gap G1. In the plane view of FIG. 34D, one conductive spacer 180 may disposed on the flux portion 162D and across the two sub-portions 162d, where the conductive spacer 180 may be overlapped with the gap G1. In the plane view of FIG. 34E, one conductive spacer 180 may disposed on the flux portion 162E and across the two sub-portions 162e, where the conductive spacer 180 may be overlapped with the gap G1. In the plane view of FIG. 34F, one conductive spacer 180 may disposed on the flux portion 162F and across the two sub-portions 162f, where the conductive spacer 180 may be overlapped with the gap G1. In the plane view of FIG. 34G, one conductive spacer 180 may disposed on the flux portion 162G and across the two sub-portions 162g, where the conductive spacer 180 may be overlapped with the gap G1. In the plane view of FIG. 34H, one conductive spacer 180 may disposed on the flux portion 162H and across the two sub-portions 162h, where the conductive spacer 180 may be overlapped with the gap G1. Owing to the gap G1 underneath the conductive spacer 180, a void or air bubble (e.g., solder voids) in the flux portion 162 can be escaped from the gap G1 without being embedding inside the flux portion 162 during the reflowing, such that a tilting of the conductive spacer 180 caused by the void or air bubble held inside the flux portion 162 can be prevented, thereby improving the reliability of bonding between the integrated fan-out package and the another device. The gap G1 may be referred as to an outlet path of the void or air bubble during the solder reflowing process.

In some embodiments, in the plane view of FIG. 34A through FIG. 34D, a vertical projection of the flux portion 162 (e.g., 162A, 162B, 162C, or 162D) is completely located within a vertical projection of the conductive spacer 180. In alternative embodiments, in the plane view of FIG. 34E through FIG. 34H, the vertical projection of the conductive spacer 180 is completely located within a vertical projection of the flux portion 162 (e.g., 162E, 162F, 162G, or 162H). In other embodiments (not shown), a perimeter of the vertical projection of the flux portion 162 is completely aligned with a perimeter of the vertical projection of the conductive spacer 180. The disclosure is not limited thereto.

Figure 35:
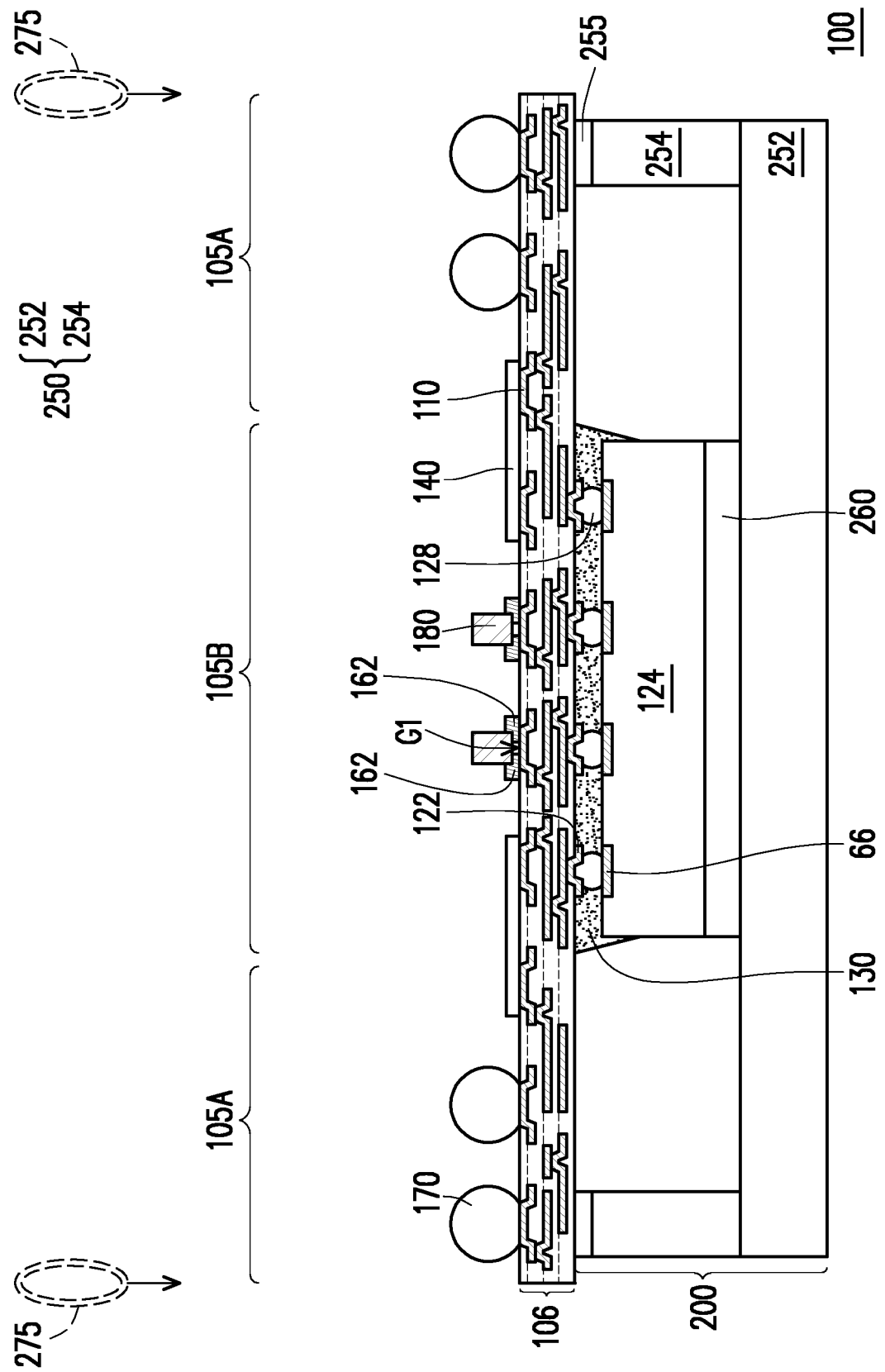

FIG. 35 is similar to FIG. 20, where like reference numbers indicate like elements formed using like processes, except that the conductive spacers 150 are substituted by the conductive spacers 180. For example, a top down view of the integrated fan-out package 100 of FIG. 35 (not shown) is similar to the top down view of the integrated fan-out package 100 of FIG. 20 (which may be depicted in FIG. 19A), where the conductive spacers 180 are placed at the center of an edge of the integrated fan-out package 100, and the conductive connectors 170 positioned in the other connector positions. The conductive spacers 180 may be disposed at all four edges or a pair of opposing edges of the integrated fan-out package 100. For another example, a top down view of the integrated fan-out package 100 of FIG. 35 (not shown) is similar to the top down view of the integrated fan-out package 100 of FIG. 20 (which may be depicted in FIG. 19B), where the conductive spacers 180 are positioned in the center of the integrated fan-out package 100 and not along any of the edges of the integrated fan-out package 100, and the conductive connectors 170 positioned in the other connector positions.

Figure 36:
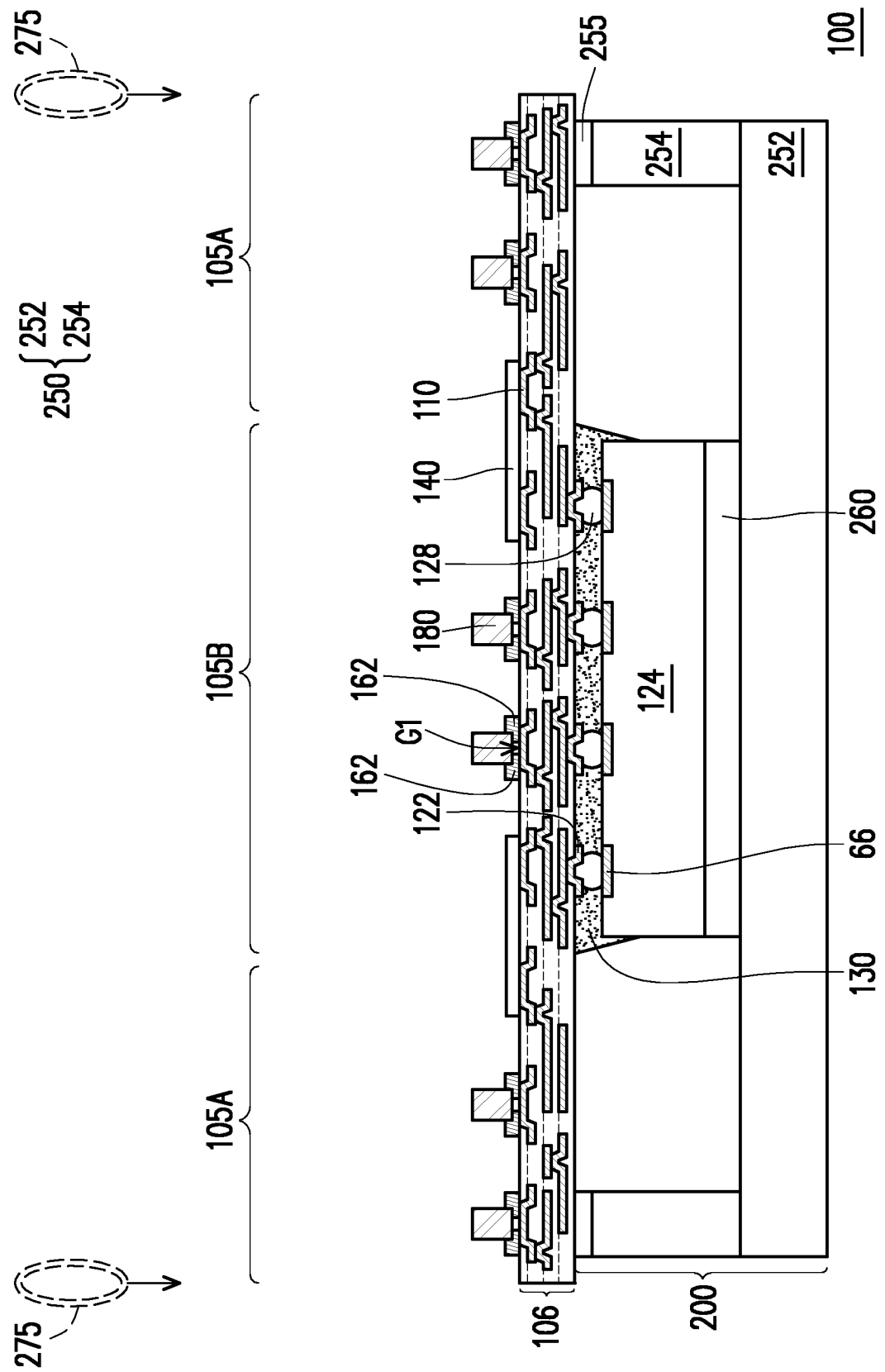

FIG. 36 is similar to FIG. 21, where like reference numbers indicate like elements formed using like processes, except that the conductive spacers 150 are substituted by the conductive spacers 180. For example, a top down view of the integrated fan-out package 100 of FIG. 36 (not shown) is similar to the top down view of the integrated fan-out package 100 of FIG. 21 (which may be depicted in FIG. 19C), where the conductive spacers 180 are placed at all the connector positions in each and every row and column. In the case, there is no conductive connector 170. For another example, a top down view of the integrated fan-out package 100 of FIG. 36 (not shown) is similar to the top down view of the integrated fan-out package 100 of FIG. 21 (which may be depicted in FIG. 19D), where the conductive spacers 180 are placed at all the connector positions around the edge of the integrated fan-out package 100, and the conductive connectors 170 positioned in the other connector positions. In the case, the conductive connectors 170 are surrounded by the conductive spacers 180.

In some embodiments, an arrangement of the conductive spacers 180 corresponds to an arrangement of the flux portions 162, and an arrangement of the conductive connectors 170 corresponds to an arrangement of the flux portions 164. That is, owing to the flux portions 162, the conductive spacers 180 are applied onto the exposed portions of metallization patterns 110 near corners, edges and/or center of the integrated fan-out package 100; and owing to the flux portions 164, the conductive connectors 170 are applied onto the exposed portions of metallization patterns 110 being remained. It is appreciated that as long as the conductive spacers 180 are symmetric about the central line (e.g., D1, D2, or both of D1 and D2) and/or the diagonal line (e.g., D3, D4, or both of D3 and D4), the layout of the placement of the conductive spacers 180 as discussed above (relative to FIG. 18, FIG. 19A, FIG. 19B and FIG. 19D) may also be combined, in part or all. The singulation process 275, such as described above with respect to FIG. 16, may be performed following the formation of the conductive spacers 180 and conductive connectors 170 to form separate and individual dies with an InFO structure, e.g., the integrated fan-out package 100. However, the disclosure is not limited thereto; alternatively, the singulation process 275 may be performed after a package substrate 300 (FIG. 37) is coupled to the integrated fan-out package 100 (discussed below).

Figure 37:
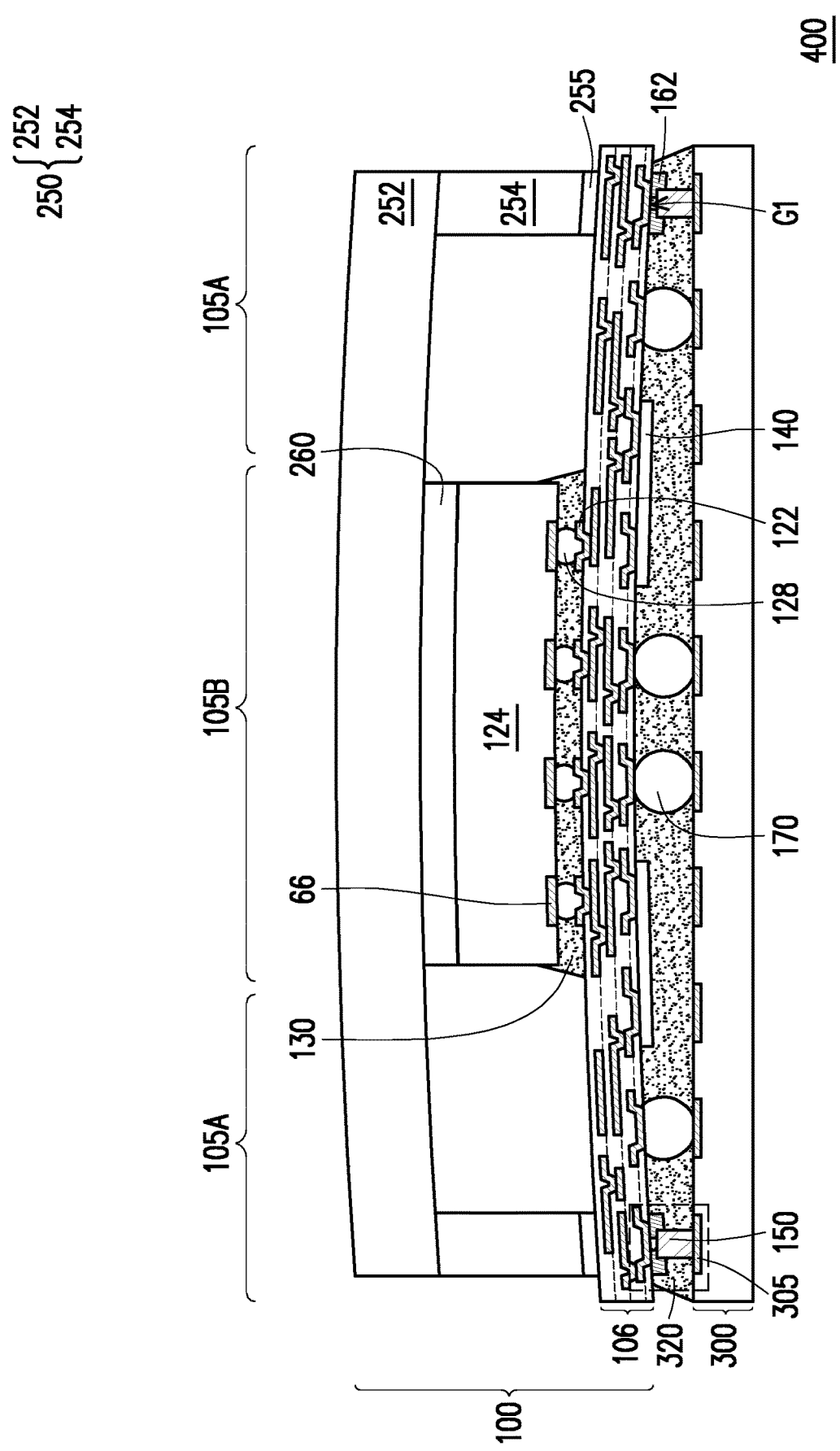
FIG. 37 through FIG. 46B are schematic cross-sectional views respectively illustrating an integrated fan-out package attached to a package substrate, in accordance with some alternative embodiments.

Referring to FIG. 37, in some embodiments, the integrated fan-out package 100 of FIG. 33 may be mounted to a package substrate 300 using the conductive connectors 170 and the conductive spacers 180 to form a 3D package 400. As illustrated in FIG. 37, the integrated fan-out package 100 has warpage in a crying or frown shape. When the integrated fan-out package 100 is attached to the package substrate 300, the conductive spacers 180 located at the corners of the integrated fan-out package 100 provides a minimum distance between the integrated fan-out package 100 and the package substrate 300 so that the conductive connectors 170 do not expand too much toward each other to cause bridging errors. The details of the package substrate 300 has been previously described in FIG. 22, and thus are not repeated herein.

For example, the conductive connectors 170 are reflowed to attach the integrated fan-out package 100 to the contact pads 305 of the package substrate 300. The conductive connectors 170 may electrically and/or physically couple the package substrate 300, including the metallization layers in the package substrate 300, to the redistribution structure 106 of the integrated fan-out package 100. When the conductive connectors 170 are reflowed, a reflow temperature is selected such that the core material of the conductive spacers 180 is not melted, in some embodiments. In the case, the conductive connectors 170 serves as the conductive terminals for electric signal transmission (e.g., to/from the integrated fan-out package 100 of the 3D package 400), power signal transmission (e.g., power source to the integrated fan-out package 100 of the 3D package 400, a ground source to the integrated fan-out package 100 of the 3D package 400, or a combination thereof), or the like.

On the other hand, for example, the conductive spacers 180 are also attached as a conductive connector between the integrated fan-out package 100 and the package substrate 300. The conductive spacer 180 may be any of the spacers 180A, 180B, 180C or the modifications thereof (see FIG. 34A, FIG. 34B, and FIG. 34C). The conductive spacer 180 may be interposed between the integrated fan-out package 100 and the package substrate 300, which may physically and electrically couple the metallization pattern 110 of the integrated fan-out package 100 to the contact pad 305 of the package substrate 300. In the case, the conductive spacers 180 serves as supporting structures for mechanical supports between the integrated fan-out package 100 and the package substrate 300. In addition, the conductive spacers 180 can also serves as a role similar to or substantially identical to the conductive connectors 170, if needed.

In some embodiments, an underfill 320 may be formed between the integrated fan-out package 100 and the package substrate 300 and surrounding the conductive connectors 170 and the conductive spacers 180. The details of the underfill 320 has been previously described in FIG. 22, and thus are not repeated herein. Owing to the underfill 320, the adhesion between the integrated fan-out package 100 and the package substrate 300 is ensured.

Figure 38:
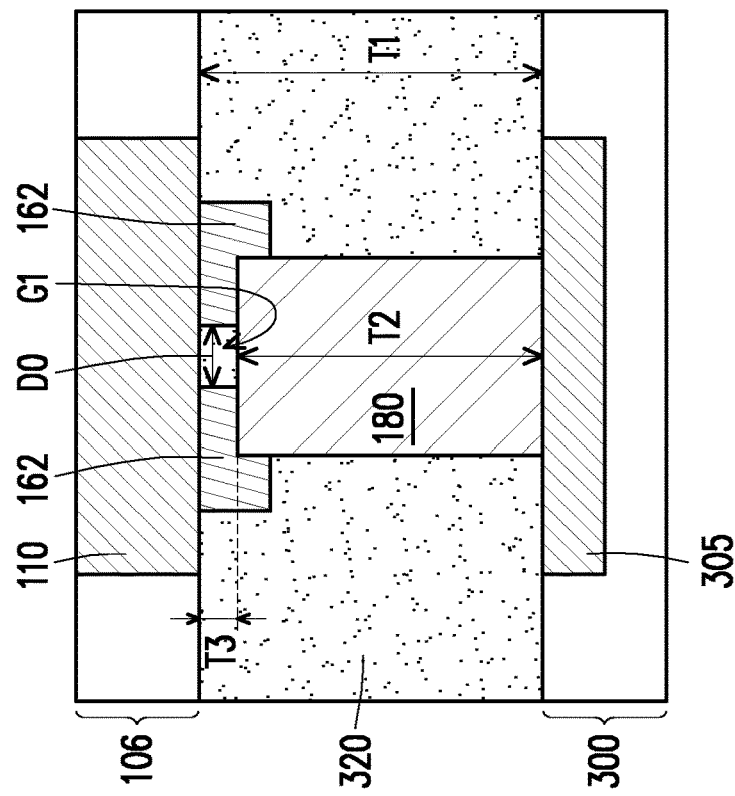
Figure 43:
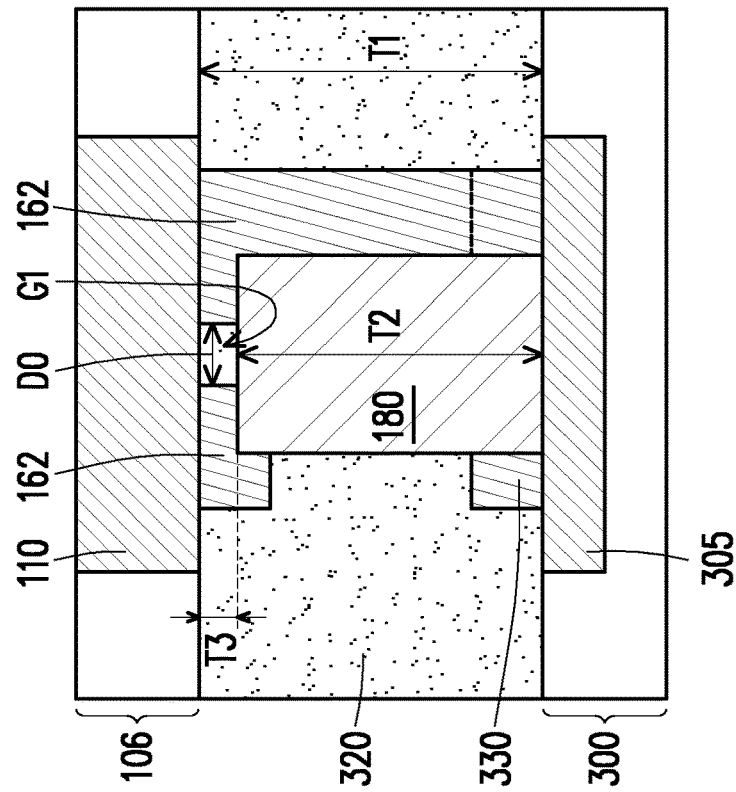
Figure 44:
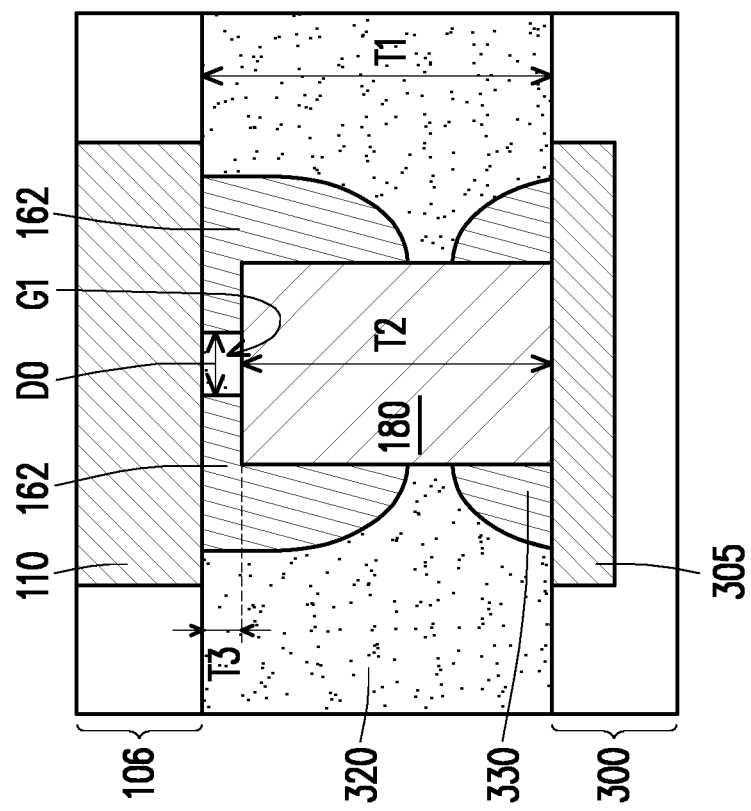

The dashed box in FIG. 37 is magnified and illustrated in greater detail in FIG. 38 and FIG. 44. In FIG. 38 through FIG. 44, a close up of one conductive spacer 180 is illustrated, in accordance with some embodiments (see the dashed box of FIG. 37).

As illustrated in FIG. 38, for example, the flux portion 162 is in direct (or physical) contact with the conductive spacer 180 and the metallization patterns 110, and thus physically and electrically couples the conductive spacer 180 and the metallization patterns 110. In the case, the conductive spacer 180 is in direct (or physical) contact with the contact pad 305 and the flux portion 162, and thus physically and electrically couples the contact pad 305 and the flux portion 162. A distance T1 between an illustrated bottom surface of the metallization patterns 110 of the integrated fan-out package 100 and an illustrated top surface of the contact pad 305 of the package substrate 300 may be between about 100 μm and about 600 μm, though other values are contemplated and may be used. For example, the conductive spacer 180 is separated from the illustrated bottom surface of the metallization patterns 110 by a distance T3 between about 0 μm and about 150 μm, though other values are contemplated and may be used. For example, the distance T3 is greater than 0 µm and less than or substantially equal to about 150 µm. In the case, a size T2 of the conductive spacer 180 is between about 100 µm and about 500 µm, though other values are contemplated and may be used. As illustrated in FIG. 38, the flux portion 162 may cover a portion of the conductive spacer 180, e.g., a portion of the flat top end and a portion of a sidewall surrounding (and near to) the flat top end. In some embodiments, other portion of the flat top end (which being exposed by the gap G1), the flat bottom end (opposing to the flat top end), and other portion of the sidewall of the conductive spacer 180 may be exposed from the flux portion 162, where the flux portion 162 is free from the package substrate 300. The flux portion 162 may include a planar outer sidewall which not being in (direct or physically) contact with the sidewall of the conductive spacer 180, in FIG. 38. In some embodiment, the other portion of the sidewall of the conductive spacer 180 exposed by the flux portion 162 is further covered by the underfill 320.

Figure 39:
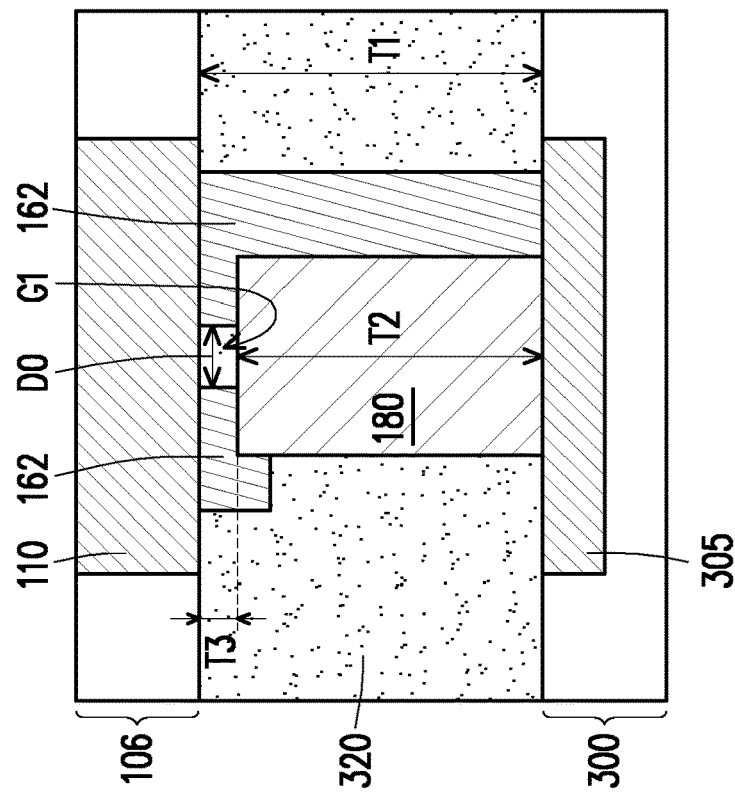

FIG. 39 is similar to FIG. 38, where like reference numbers indicate like elements formed using like processes, except that the flux portions 162 is illustrated as being in contact with the package substrate 300, in accordance with some embodiments. As shown in FIG. 39, the flux portion 162 may further partially extend to span across the sidewall of the conductive spacer 180 from the integrated fan-out package 100 towards the package substrate 300, so that the flux portion 162 is in physical contact with the contact pad 305 of the package substrate 300. Owing to the extended portion of the flux portion 162, the bonding between the conductive spacer 180 and the contact pad 305 is further enhanced. As illustrated in FIG. 39, a portion of the flat top end (which being exposed by the gap G1), the flat bottom end, and a portion of the sidewall of the conductive spacer 180 may be exposed from the flux portion 162. The flux portion 162 may include a planar outer sidewall which not being in (direct or physically) contact with the sidewall of the conductive spacer 180, in FIG. 39. In some embodiment, the portion of the sidewall of the conductive spacer 180 exposed by the flux portion 162 is further covered by the underfill 320.

Figure 40:
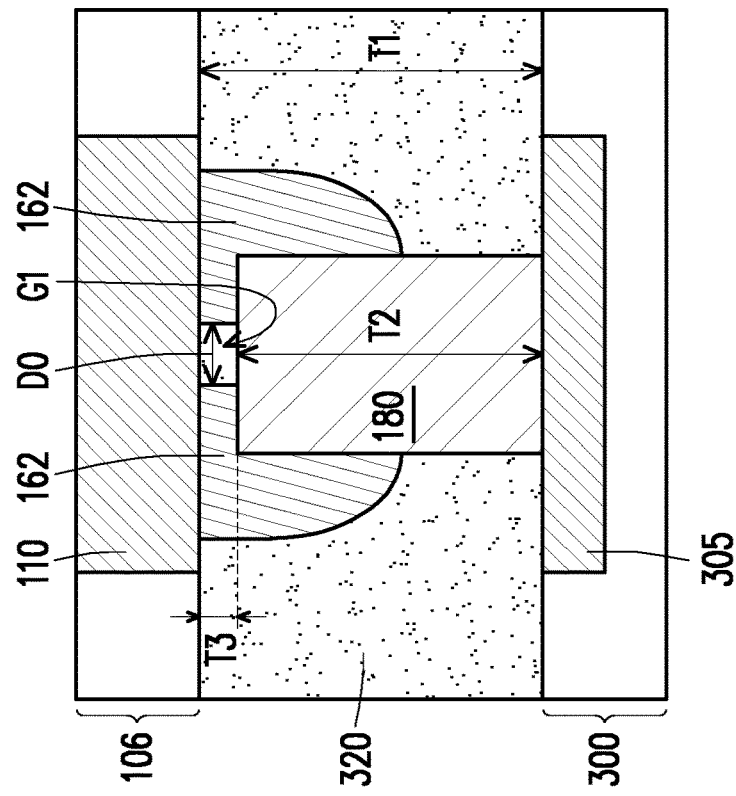

FIG. 40 is similar to FIG. 38, where like reference numbers indicate like elements formed using like processes, except that the flux portions 162 is illustrated as having a curved outer sidewall, in accordance with some embodiments. As shown in FIG. 38, the flux portion 162 may further extend on the sidewall of the conductive spacer 180 from the integrated fan-out package 100 towards the package substrate 300 with a decreased thickness, where the flux portions 162 has the curved outer sidewall being in direct (or physical) contact with the sidewall of the conductive spacer 180. Owing to the extended portion of the flux portion 162, the bonding between the conductive spacer 180 and the contact pad 305 is further enhanced. As illustrated in FIG. 40, a portion of the flat top end (which being exposed by the gap G1), the flat bottom end, and a portion of the sidewall of the conductive spacer 180 may be exposed from the flux portion 162. In some embodiment, the portion of the sidewall of the conductive spacer 180 exposed by the flux portion 162 is further covered by the underfill 320.

Figure 41:
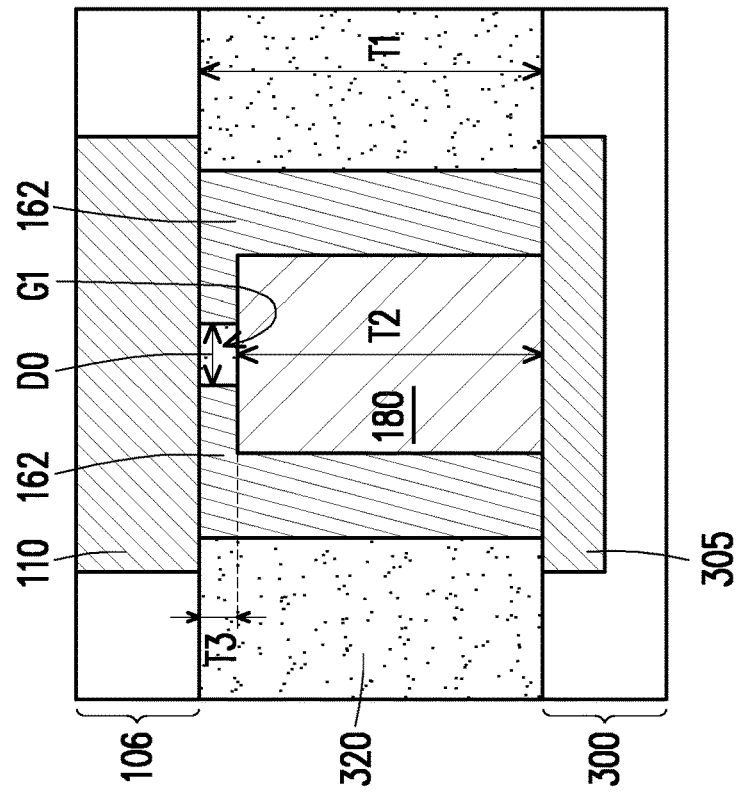

FIG. 41 is similar to FIG. 38, where like reference numbers indicate like elements formed using like processes, except that the flux portions 162 is illustrated as completely encapsulating the sidewall of the conductive spacer 180, in accordance with some embodiments. As shown in FIG. 41, the flux portion 162 may further extend to entirely span across the sidewall of the conductive spacer 180 from the integrated fan-out package 100 towards the package substrate 300, so that the flux portion 162 is in physical contact with the contact pad 305 of the package substrate 300. Owing to the extended portion of the flux portion 162, the bonding between the conductive spacer 180 and the contact pad 305 is further enhanced. As illustrated in FIG. 41, the conductive spacer 180 is embedded in the flux portion 162, except that a portion of the flat top end (which being exposed by the gap G1) and the flat bottom end of the conductive spacer 180 are exposed from the flux portion 162, for example. In some embodiment, the sidewall of the conductive spacer 180 is completed separated from the underfill 320 by the flux portion 162.

In some embodiments, a solder material (e.g., a flux portion 330 of FIG. 42, FIG. 43 and FIG. 44) such as a solder paste or solder pad may be deposited or plated over the contact pad 305 of the package substrate 300, in some alternative embodiments, for further enhancing the bonding between the conductive spacer 180 and the contact pad 305. The solder material can be reflowed during ball mounting to attach the conductive spacers 180 and the conductive connectors 170. In the case, with a vertical alignment, some of the flux portions 330 are melt with the flux portions 164 and the solder balls (if any) to together form the conductive connectors 170 during the reflowing.

Figure 42:
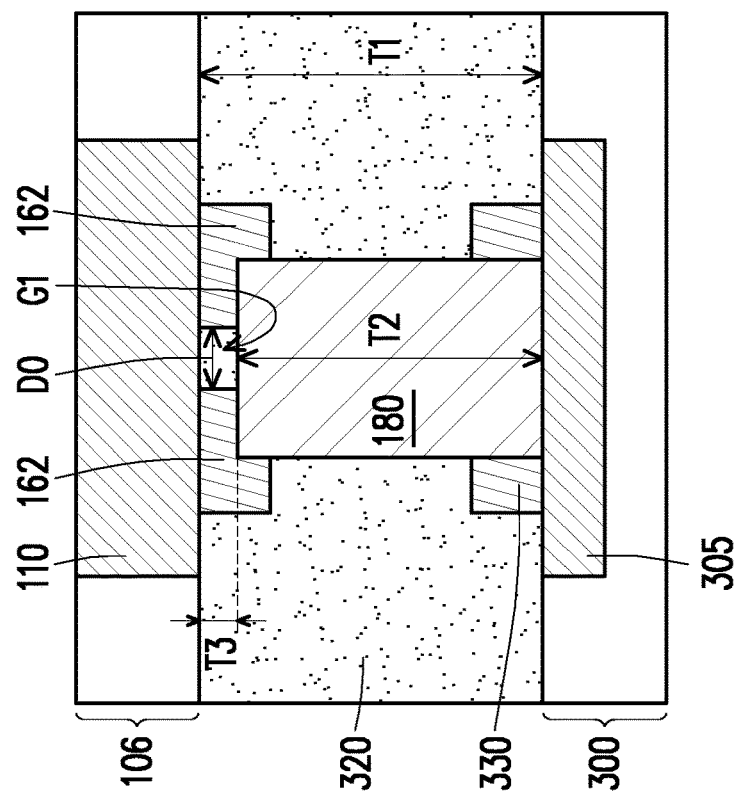

FIG. 42 is similar to FIG. 38, where like reference numbers indicate like elements formed using like processes, except that a flux portion 330 is additionally disposed between the conductive spacer 180 and the contact pad 305 of the package substrate 300, in accordance with some alternative embodiments. As shown in FIG. 42, the flux portion 162 may be in physical contact with the conductive spacer 180 and the metallization patterns 110 and partially cover the flat top end and the sidewall of the conductive spacer 180 surrounding (and near to) the flat top end thereof, and the flux portion 330 may be in physical contact with the conductive spacer 180 and cover a portion of the sidewall of the conductive spacer 180 surrounding (and near to) the flat bottom end thereof. In the case, the conductive spacer 180 is electrically coupled to the metallization patterns 110 of the integrated fan-out package 100 through the flux portion 162, and is electrically coupled to the contact pad 302 of the package substrate 300 through direct contact. Owing to the configuration, the integrated fan-out package 100 is electrically and physically coupled to the package substrate 300.

As illustrated in FIG. 42, the flux portion 162 may cover a portion of the conductive spacer 180, e.g., a portion of the flat top end and a portion of the sidewall surrounding (and near to) the flat top end. On the other hand, the flux portion 330 may cover another portion of the conductive spacer 180, e.g., another portion of the sidewall surrounding (and near to) the flat bottom end of the conductive spacer 180 which being in direct contact with the contact pad 305. In some embodiments, other portion of the flat top end (which being exposed by the gap G1), the flat bottom end, and other portion of the sidewall of the conductive spacer 180 may be exposed from the flux portions 162 and 330, where the flux portion 162 is free from the package substrate 300 and the flux portion 330 is free form the integrated fan-out package 100. In other words, the flux portion 162 is distant apart from the flux portion 330. The flux portions 162 and 330 may include a planar outer sidewall which not being in (direct or physically) contact with the sidewall of the conductive spacer 180, in FIG. 42. In some embodiment, the other portion of the sidewall of the conductive spacer 180 exposed by the flux portions 162 and 330 is further covered by the underfill 320. Owing to the flux portion 330, the bonding between the conductive spacer 180 and the contact pad 305 is further enhanced.

FIG. 43 is similar to FIG. 42, where like reference numbers indicate like elements formed using like processes, except that the flux portions 162 is illustrated as being in contact with the flux portion 330, in accordance with some embodiments. As shown in FIG. 43, the flux portion 162 may further partially extend to span across the sidewall of the conductive spacer 180 from the integrated fan-out package 100 towards the package substrate 300, so that the flux portion 162 is in physical contact with the flux portion 330 disposed on the contact pad 305 of the package substrate 300. Owing to the extended portion of the flux portion 162, the bonding between the conductive spacer 180 and the contact pad 305 is further enhanced. As illustrated in FIG. 43, a portion of the flat top end (which being exposed by the gap G1), the flat bottom end, and a portion of the sidewall of the conductive spacer 180 may be exposed from the flux portions 162 and 330. The flux portions 162 and 330 may include a planar outer sidewall which not being in (direct or physically) contact with the sidewall of the conductive spacer 180, in FIG. 43. In some embodiment, the portion of the sidewall of the conductive spacer 180 exposed by the flux portions 162 and 330 is further covered by the underfill 320.

FIG. 44 is similar to FIG. 42, where like reference numbers indicate like elements formed using like processes, except that the flux portions 162 and 330 are illustrated as having a curved outer sidewall, in accordance with some embodiments. As shown in FIG. 44, the flux portion 330 may further extend on the sidewall of the conductive spacer 180 from the package substrate 300 towards the integrated fan-out package 100 with a decreased thickness, where the flux portions 330 has the curved outer sidewall being in direct (or physical) contact with the sidewall of the conductive spacer 180. In the case, the flux portion 162 may further extend on the sidewall of the conductive spacer 180 from the integrated fan-out package 100 towards the package substrate 300 with a decreased thickness, where the flux portions 162 has the curved outer sidewall being in direct (or physical) contact with the sidewall of the conductive spacer 180. Owing to the extended portion of the flux portions 162 and 330, the bonding between the conductive spacer 180 and the contact pad 305 is further enhanced. As illustrated in FIG. 44, a portion of the flat top end (which being exposed by the gap G1), the flat bottom end, and a portion of the sidewall of the conductive spacer 180 may be exposed from the flux portions 162 and 330. In some embodiment, the portion of the sidewall of the conductive spacer 180 exposed by the flux portions 162 and 300 is further covered by the underfill 320. In the case, the flux portion 162 is distant apart from the flux portion 330. Alternatively, the flux portion 162 may be connected to the flux portion 330.

Although is not shown, a portion of the flux portion 330 (e.g., FIG. 42 through FIG. 44) may be presented between the conductive spacer 180 (e.g., the flat bottom end thereof) and the contact pad 305 for electrically and physically coupling therebetween. For example, a thickness of the portion of the flux portion 330 being presented between (e.g. sandwiched between) the flat bottom end of the conductive spacer 180 and the illustrated top surface of the contact pad 305 is between about 100 µm and about 600 µm. In addition, a flux portion 330 may be presented between the flat bottom end of the conductive spacer 180 and the contact pad 305 (of FIG. 41) for electrically and physically coupling therebetween, as well. The conductive spacer 180 may be equally distant from the metallization pattern 110 and the contact pad 305 or may be vertically closer to the metallization pattern 110 or vertically closer to the contact pad 305.

In some embodiments, the solder material for the flux portion 330 may be provided on the contact pad 305, for example, by an electroplated solder material, a printed solder paste, a solder pad, and so forth. For example, the flux portion 330 is formed using processes and materials similar to the flux portion 164. Alternatively, the solder material for the flux portion 330 may come from the conductive spacer 180. For example, where the conductive spacer 180 has multiple layers, such as described above with respect to the conductive spacer 150B and 150C, an outer coating layer of the conductive spacer 180 may include a solder material. In the case, when the solder material of the outer coating layer of the conductive spacer 180 is reflowed at the same time the conductive connectors 170 are reflowed, the flux portion 330 may be formed.

In some embodiments, owing to the higher melting temperature of the conductive spacers 180 as compared with the conductive connectors 170, the flux portions 162, and the flux portion 300 (if any), the conductive spacers 180 sandwiched between the integrated fan-out package 100 and the package substrate 300 is considered as non-deformable during the reflowing for bonding the integrated fan-out package 100 and the package substrate 300. And thus, the minimum distance between the integrated fan-out package 100 and the package substrate 300 can be achieved to prevent any bridging between adjacent conductive connectors 170.

Figure 45:
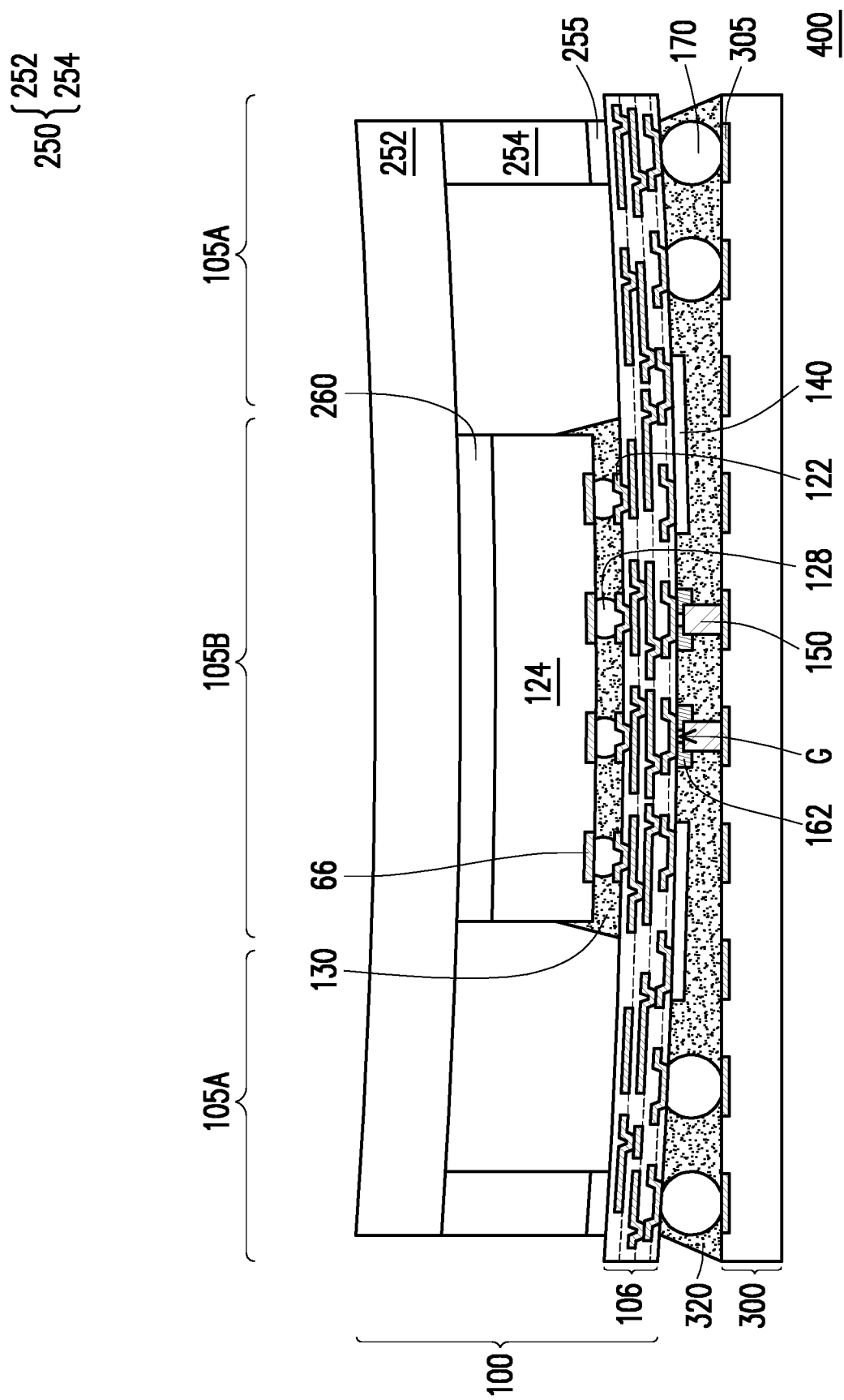

Referring to FIG. 45, in some embodiments, the integrated fan-out package 100 of FIG. 35 may be mounted to a package substrate 300 using conductive connectors 170 and the conductive spacers 180 to form a 3D package 400. As illustrated in FIG. 45, the integrated fan-out package 100 has warpage in a smile shape. When the integrated fan-out package 100 is attached to the package substrate 300, the conductive spacers 180 located at the middle of the edge of the integrated fan-out package 100 (relative to the top down view of FIG. 19A) or at the middle of the integrated fan-out package 100 (relative to the top down view of FIG. 19B) provides a minimum distance between the integrated fan-out package 100 and the package substrate 300 so that the conductive connectors 170 do not expand too much toward each other to cause bridging errors.

Figure 46A:
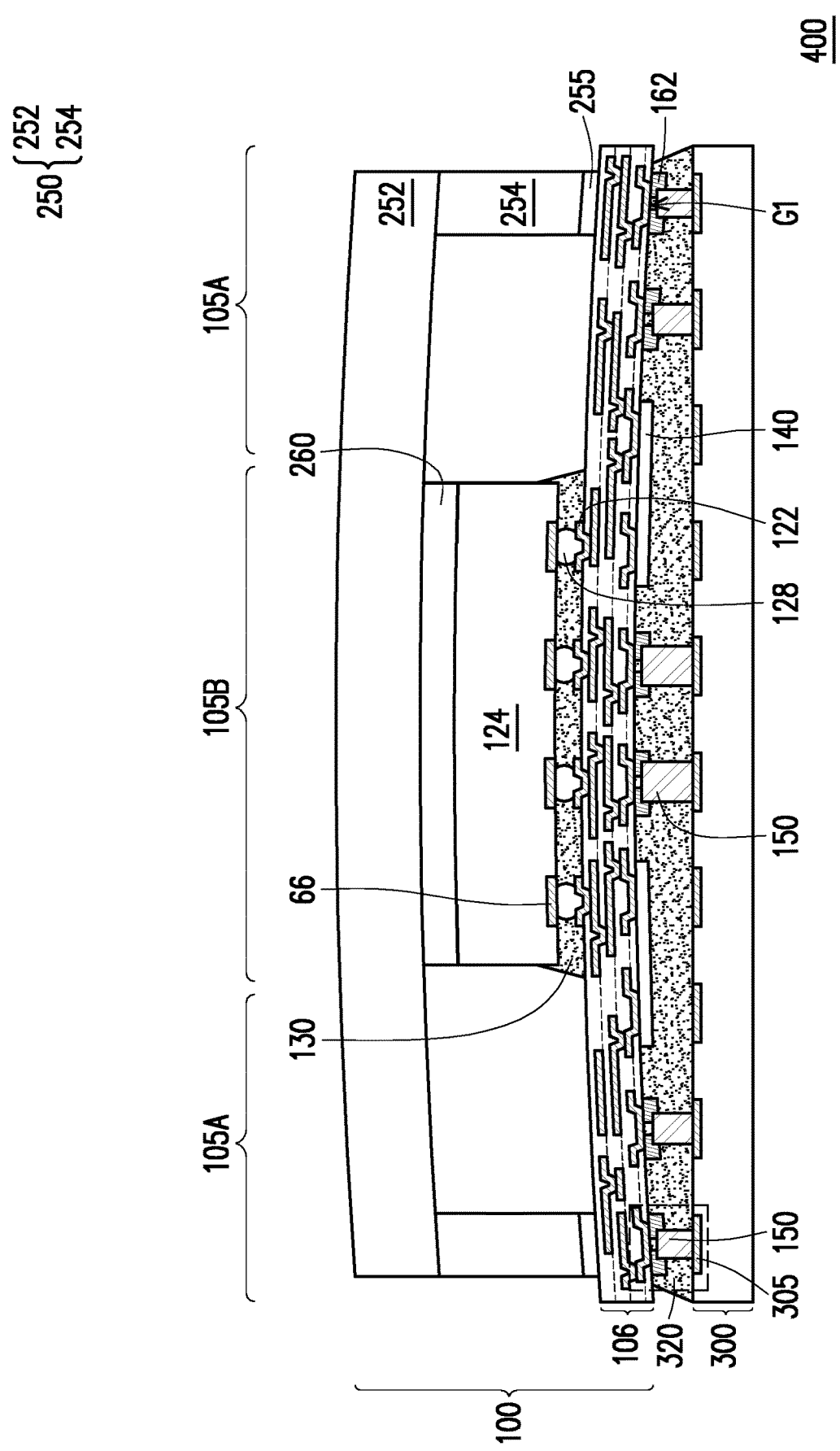
Figure 46B:
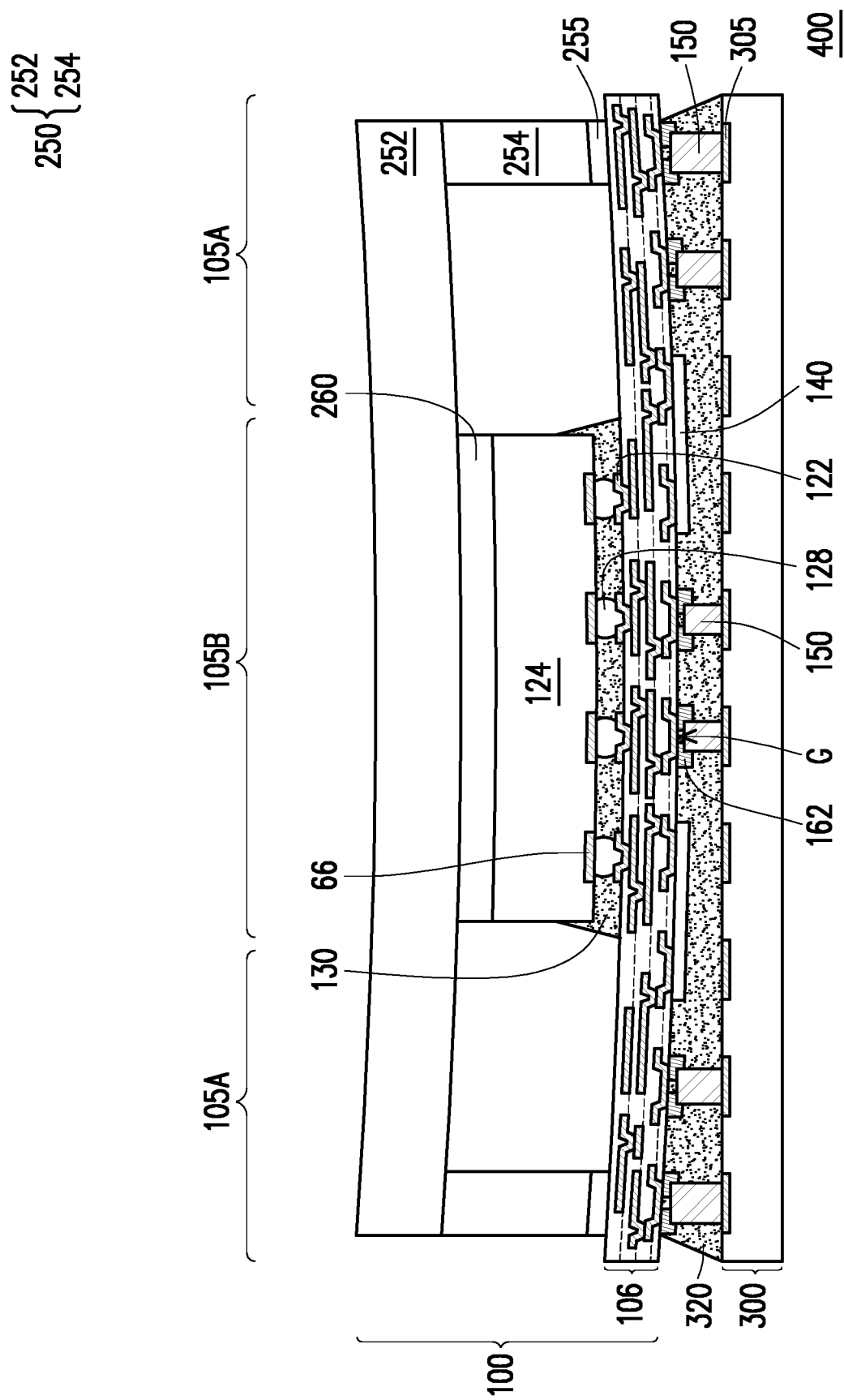

Referring to either FIG. 46A or FIG. 46B, in some embodiments, the integrated fan-out package 100 of FIG. 36 may be mounted to a package substrate 300 using the conductive spacers 180 (and the conductive connectors 170, in some embodiments) to form a 3D package 400. As illustrated in FIG. 46A, the integrated fan-out package 100 may have a warpage in a crying or frown shape. On the other hand, as illustrated in FIG. 46B, the integrated fan-out package 100 may have a warpage in a smiling shape. When the integrated fan-out package 100 is attached to the package substrate 300, the conductive spacers 180 located at each of the connector positions of the integrated fan-out package 100 (relative to the top down view of FIG. 19C) or along each edge of the integrated fan-out package 100 (relative to the top down view of FIG. 19D) provides a minimum distance between the integrated fan-out package 100 and the package substrate 300, so that conductive connectors 170 are prevented from expanding too much toward each other which would cause bridging errors. As illustrated in FIG. 46A and FIG. 46B, a dimension (e.g., a vertical size as measured along the stacking direction) of the conductive spacers 180 positioned in different locations may be different from each other. In the case, the conductive spacers 180 being symmetrically arranged have the same dimension.

In some alternative embodiments, a 3D package 400 of the disclosure includes the conductive spacers 150 (e.g., 150A, 150B, 150C, or combinations thereof), the conductive spacers 180 (e.g., 180A, 180B, 180C, their modifications, or combination thereof), or a combination of the conductive spacers 150 (e.g., 150A, 150B, 150C, or combinations thereof) and the conductive spacers 180 (e.g., 180A, 180B, 180C, their modifications, or combination thereof). The disclosure is not limited thereto.

In accordance with some embodiments, a package structure includes a first package, a second package, a conductive spacer, and a flux portion. The first package includes a semiconductor die. The second package is stacked to the first package. The conductive spacer is disposed between and electrically couples the first package and the second package. The flux portion is disposed between and electrically couples the first package and the conductive spacer, where the flux portion includes a first portion and a second portion separating from the first portion by a gap, and the first portion and the second portion are symmetric about an extending direction of the gap. The gap is overlapped with the conductive spacer.

In accordance with some embodiments, a package structure includes a package substrate and a semiconductor package. The semiconductor package is disposed on the package substrate, and includes a redistribution structure, a semiconductor die, at least one first flux portion, and at least one first conductive spacer. The semiconductor die is disposed on and electrically coupled to the redistribution structure. The at least one first flux portion is disposed on and electrically coupled to the redistribution structure, where the at least one first flux portion includes a first portion and a second portion separating from the first portion by a first gap, and the first portion and the second portion are symmetric about an extending direction of the first gap. The at least one first conductive spacer is disposed on and electrically coupled to the at least one first flux portion, where the at least one first conductive spacer extends from the first portion to the second portion and spans across the first gap, and the semiconductor package is bonded to and electrically coupled to the package substrate via the at least one first conductive spacer.

In accordance with some embodiments, a method of manufacturing a package structure includes the following steps: providing a first package comprising a semiconductor die; forming a flux portion over the first package, the flux portion being electrically coupled to the first package and comprising a first portion and a second portion separating from the first portion by a gap, wherein the first portion and the second portion are symmetric about an extending direction of the gap; disposing a conductive spacer over the first package, the conductive spacer being disposed on the flux portion and electrically coupled to the first package through the flux portion, wherein the gap is overlapped with the conductive spacer; and mounting the first package to the second package, the first package and the second package being electrically coupled to and bonded to one another via a contact with the flux portion and the conductive spacer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first package, comprising a semiconductor die;
   a second package, stacked to the first package;
   a conductive spacer, disposed between and electrically coupling the first package and the second package; and
   a flux portion, disposed between and electrically coupling the first package and the conductive spacer, wherein the flux portion comprises a first portion and a second portion separating from the first portion by a gap, and the first portion and the second portion are symmetric about an extending direction of the gap, wherein the gap is overlapped with the conductive spacer.

2. The package structure of claim 1, wherein in a stacking direction of the first package and the second package, a vertical projection of the conductive spacer falls within a vertical projection of the flux portion.

3. The package structure of claim 1, wherein in a stacking direction of the first package and the second package, a vertical projection of the conductive spacer is substantially aligned with a vertical projection of the flux portion.

4. The package structure of claim 1, wherein the gap is between about 50 μm and about 400 μm, as measured in a direction perpendicular to a stacking direction of the first package and the second package.

5. The package structure of claim 1, further comprising:
   an additional flux portion, disposed between and electrically coupling the second package and the conductive spacer, wherein a bottom surface facing toward the second package is in contact with the additional flux portion.

6. The package structure of claim 1, further comprising:
   an additional flux portion, disposed between and electrically coupling the second package and the conductive spacer, wherein a bottom surface facing toward the second package is exposed from the additional flux portion.

7. The package structure of claim 1, further comprising:
   a plurality of conductive connectors, disposed between and electrically coupling the first package and a second package, wherein the plurality of conductive connectors are next to the conductive spacer, and
   wherein a melting temperature of the conductive spacer is higher than a reflowing temperature of the plurality of conductive connectors.

8. The package structure of claim 1, wherein the conductive spacer is disposed at a center of the first package.

9. The package structure of claim 1, wherein the conductive spacer comprising a plurality of conductive spacers, and the plurality of conductive spacers are disposed at corners of the first package, wherein the plurality of conductive spacers are symmetric about a central line or a diagonal line of the first package.

10. The package structure of claim 1, wherein the conductive spacer comprising a plurality of conductive spacers, and the plurality of conductive spacers are disposed at edges of the first package, wherein the plurality of conductive spacers are symmetric about a central line or a diagonal line of the first package.

11. A package structure, comprising:
    a package substrate; and a semiconductor package, disposed on the package substrate, comprising:
  a redistribution structure;
  a semiconductor die, disposed on and electrically coupled to the redistribution structure;
  at least one first flux portion, disposed on and electrically coupled to the redistribution structure, wherein the at least one first flux portion comprises a first portion and a second portion separating from the first portion by a first gap, and the first portion and the second portion are symmetric about an extending direction of the first gap; and
  at least one first conductive spacer, disposed on and electrically coupled to the at least one first flux portion, wherein the at least one first conductive spacer extends from the first portion to the second portion and span across the first gap, and the semiconductor package is bonded to and electrically coupled to the package substrate via the at least one first conductive spacer.

12. The package structure of claim 11, wherein the semiconductor package further comprises:
  a plurality of conductive connectors, disposed on and electrically coupled to the redistribution structure and next to the at least one first conductive spacer, wherein the redistribution structure is between the semiconductor die and the plurality of conductive connectors, and the semiconductor package is bonded to and electrically coupled to the package substrate via the plurality of conductive connectors,
  wherein a melting temperature of the at least one first conductive spacer is higher than a reflowing temperature of the plurality of conductive connectors.

13. The package structure of claim 11, wherein the semiconductor package further comprises:
  at least one second flux portion, disposed on and electrically coupled to the redistribution structure, wherein the at least one second flux portion comprises a third portion and a fourth portion separating from the third portion by a second gap, and the third portion and the fourth portion are symmetric about an extending direction of the second gap; and
  at least one second conductive spacer, disposed on and electrically coupled to the at least one second flux portion, wherein the at least one second conductive spacer extends from the third portion to the fourth portion and spans across the second gap, and the semiconductor package is bonded to and electrically coupled to the package substrate via the at least one second conductive spacer,
  wherein a shape of the at least one second conductive spacer is different from a shape of at least one second conductive spacer.

14. The package structure of claim 13, wherein the semiconductor package further comprises:
  a plurality of conductive connectors, disposed on and electrically coupled to the redistribution structure and next to the at least one first conductive spacer, wherein the redistribution structure is between the semiconductor die and the plurality of conductive connectors, and the semiconductor package is bonded to and electrically coupled to the package substrate via the plurality of conductive connectors,
  wherein a melting temperature of the at least one first conductive spacer and a melting temperature of the at least one first conductive spacer are higher than a reflowing temperature of the plurality of conductive connectors.

15. The package structure of claim 11, further comprising:
  an underfill, disposing in a gap between the semiconductor package and the package substrate, wherein the at least one flux portion and the at least one first conductive spacer are wrapped by the underfill.

16. A method of manufacturing a package structure, comprising:
  providing a first package comprising a semiconductor die;
  forming a flux portion over the first package, the flux portion being electrically coupled to the first package and comprising a first portion and a second portion separating from the first portion by a gap, wherein the first portion and the second portion are symmetric about an extending direction of the gap;
  disposing a conductive spacer over the first package, the conductive spacer being disposed on the flux portion and electrically coupled to the first package through the flux portion, wherein the gap is overlapped with the conductive spacer; and
  mounting the first package to a second package, the first package and the second package being electrically coupled to and bonded to one another via a contact with the flux portion and the conductive spacer.

17. The method of claim 16, wherein forming the flux portion over the first package comprises:
  placing a stencil with an aperture corresponding to a pattern of the flux portion; and
  applying a flux material over the stencil, the flux material being extended into the aperture and then being disposed on the first package through the aperture.

18. The method of claim 16, wherein disposing the conductive spacer over the first package comprises:
  placing the conductive spacer on the flux portion;
  pressing the conductive spacer to the flux portion, where a portion of the conductive spacer is embedded into the flux portion and other portion of the conductive spacer is exposed from the flux portion; and
  performing a reflowing process to re-shape the flux portion for attaching the conductive spacer on the first package, wherein a flux void in the flux portion is escaped via the gap overlapped with the conductive spacer during the reflowing process.

19. The method of claim 16, wherein disposing the conductive spacer over the first package comprises disposing a plurality of conductive spacers over the first package in a symmetric manner.

20. The method of claim 16, further comprising:
  disposing a plurality of conductive connectors on the first package, the plurality of conductive connectors being electrically coupled to the first package and arranged next to the conductive spacer, wherein a melting temperature of the conductive spacer is higher than a reflowing temperature of the plurality of conductive connectors, and
  mounting the first package to the second package further comprising electrically connecting the first package and the second package via a direct contact with the plurality of conductive connectors.

* * * * *